(12) United States Patent
Sapak et al.

(10) Patent No.: US 9,851,120 B2
(45) Date of Patent: Dec. 26, 2017

(54) SURGE PROTECTION FOR AN ELECTRONIC DEVICE

(71) Applicant: Honeywell International Inc., Morristown, NJ (US)

(72) Inventors: Jiri Sapak, Brno (CZ); David Mulhouse, Minnetonka, MN (US); Vaclav Novak, Brno (CZ); Mohammad Aljabari, Brooklyn Park, MN (US); Daniel Eppinger, Mounds View, MN (US); Tracy Lentz, Minneapolis, MN (US)

(73) Assignee: Honeywell International Inc., Morris Plains, NJ (US)

( * ) Notice: Subject to any disclaimer, the term of this patent is extended or adjusted under 35 U.S.C. 154(b) by 563 days.

(21) Appl. No.: 14/214,435

(22) Filed: Mar. 14, 2014

(65) Prior Publication Data

US 2014/0268470 A1    Sep. 18, 2014

Related U.S. Application Data

(60) Provisional application No. 61/800,637, filed on Mar. 15, 2013.

(51) Int. Cl.
*H01H 1/00* (2006.01)
*F24F 11/00* (2006.01)
(Continued)

(52) U.S. Cl.
CPC ............ *F24F 11/0086* (2013.01); *G01K 7/42* (2013.01); *G02F 1/133308* (2013.01);
(Continued)

(58) Field of Classification Search
USPC .................................. 361/111, 117–120, 127
See application file for complete search history.

(56) References Cited

U.S. PATENT DOCUMENTS

| 100,039 | A | 2/1870 | Irwin |
|---|---|---|---|
| 2,858,357 | A | 10/1958 | McCulloch |
| (Continued) | | | |

OTHER PUBLICATIONS

"AG2401 & AG2401C: Secondary Surge Arrester, Lightning Arrester", Intermatic Inc., 2 pages, 2004. 300AG10107.
(Continued)

*Primary Examiner* — Danny Nguyen
(74) *Attorney, Agent, or Firm* — Seager, Tufte & Wickhem, LLP

(57) ABSTRACT

A surge protection circuit for an electronic device such as an HVAC controller. In one example, the surge protection circuit may include a first voltage clamp, a second voltage clamp, a resistor, and an output port. The first voltage clamp may provide a first clamping voltage between a power input terminal and a common terminal. The second voltage clamp may provide a second clamping voltage that is less than the first clamping voltage. The resistor may be connected in series with the second voltage clamp, and the series connected resistor and second voltage clamp may be connected in parallel with the first voltage clamp. As such, a surge current at the power input terminal may be split between the first voltage clamp and the second voltage clamp. The amount of surge current that is provided to the second voltage clamp may be set by the value of the resistor.

6 Claims, 44 Drawing Sheets

(51) Int. Cl.
| | | |
|---|---|---|
| *G05D 23/32* | (2006.01) | |
| *G01K 7/42* | (2006.01) | |
| *H05K 1/11* | (2006.01) | |
| *H01R 4/34* | (2006.01) | |
| *H05K 3/32* | (2006.01) | |
| *H05K 7/14* | (2006.01) | |
| *H02H 9/04* | (2006.01) | |
| *H02H 9/00* | (2006.01) | |
| *H05K 5/00* | (2006.01) | |
| *H05K 13/00* | (2006.01) | |
| *G02F 1/1333* | (2006.01) | |
| *H05K 9/00* | (2006.01) | |
| *H02G 3/14* | (2006.01) | |
| *G05D 23/19* | (2006.01) | |

(52) U.S. Cl.
CPC ............... *G05D 23/32* (2013.01); *H01R 4/34* (2013.01); *H02G 3/14* (2013.01); *H02H 9/005* (2013.01); *H02H 9/04* (2013.01); *H05K 1/111* (2013.01); *H05K 3/32* (2013.01); *H05K 5/0017* (2013.01); *H05K 7/1422* (2013.01); *H05K 7/1427* (2013.01); *H05K 9/0037* (2013.01); *H05K 9/0054* (2013.01); *H05K 13/00* (2013.01); *H05K 13/0015* (2013.01); *F24F 2011/0091* (2013.01); *G02F 2001/133314* (2013.01); *G05D 23/1904* (2013.01); *Y10T 29/49002* (2015.01); *Y10T 29/4913* (2015.01); *Y10T 29/49124* (2015.01); *Y10T 29/49826* (2015.01)

(56) References Cited

U.S. PATENT DOCUMENTS

| | | | | |
|---|---|---|---|---|
| 4,023,071 A * | 5/1977 | Fussell | ............... | H02H 9/06 361/111 |
| 4,563,720 A * | 1/1986 | Clark | ............... | H02H 9/04 361/111 |
| 4,571,535 A * | 2/1986 | Gyugyi | ............... | H02J 3/1864 323/211 |
| 4,571,656 A * | 2/1986 | Ruckman | ............... | H02H 9/06 361/111 |
| 4,586,104 A * | 4/1986 | Standler | ............... | H02H 9/06 361/119 |
| 4,616,286 A * | 10/1986 | Breece | ............... | H03H 1/0007 361/111 |
| 4,630,163 A * | 12/1986 | Cooper | ............... | H02H 9/005 361/111 |
| 4,807,083 A * | 2/1989 | Austin | ............... | H02H 9/04 361/104 |
| 5,153,806 A * | 10/1992 | Corey | ............... | H02H 9/042 340/652 |
| 5,315,471 A | 5/1994 | Hurley | | |
| 5,323,289 A * | 6/1994 | Longsdorf | ............... | H02H 9/06 361/111 |
| 5,379,606 A | 1/1995 | Katsuki et al. | | |
| 5,854,730 A | 12/1998 | Mitchell et al. | | |
| 6,384,583 B1 * | 5/2002 | Lestician | ............... | G05F 1/569 323/205 |
| 7,089,088 B2 | 8/2006 | Terry et al. | | |
| 7,106,572 B1 * | 9/2006 | Girard | ............... | H02H 9/042 361/118 |
| 7,408,755 B1 | 8/2008 | Ye et al. | | |
| 7,417,841 B2 * | 8/2008 | Hotchkiss | ............... | H02H 9/044 104/104 |
| 7,592,719 B2 | 9/2009 | Hoopes | | |
| 7,864,496 B2 | 1/2011 | Wichlacz et al. | | |
| 7,940,506 B2 | 5/2011 | Lewis | | |
| 8,339,181 B2 | 12/2012 | Wedin et al. | | |
| 8,519,566 B2 | 8/2013 | Recker et al. | | |
| 8,520,355 B2 | 8/2013 | Wright et al. | | |
| 2005/0083628 A1 * | 4/2005 | Holzenthal, Jr. | ............... | H02H 3/048 361/118 |
| 2006/0012382 A1 * | 1/2006 | Yakymyshyn | ............... | G01R 15/06 324/705 |
| 2007/0086141 A1 * | 4/2007 | Elms | ............... | H02H 9/042 361/118 |
| 2009/0195956 A1 * | 8/2009 | Harwath | ............... | H01R 24/48 361/119 |
| 2009/0243758 A1 * | 10/2009 | Januszewski | ............... | H02H 9/005 333/184 |
| 2012/0023994 A1 | 2/2012 | Powell | | |
| 2012/0250205 A1 * | 10/2012 | Pfitzer | ............... | H02H 9/041 361/91.1 |
| 2014/0118867 A1 | 5/2014 | Becerra et al. | | |

OTHER PUBLICATIONS

"PT 2-Pets-230AC/FM", Phoenix Contact Inc., 6 pages, Mar. 15, 2010. Order No. 2858357. http://eshop.phoenixcontact.de/phoenix/treeViewClick.do?UID=2858357.

* cited by examiner

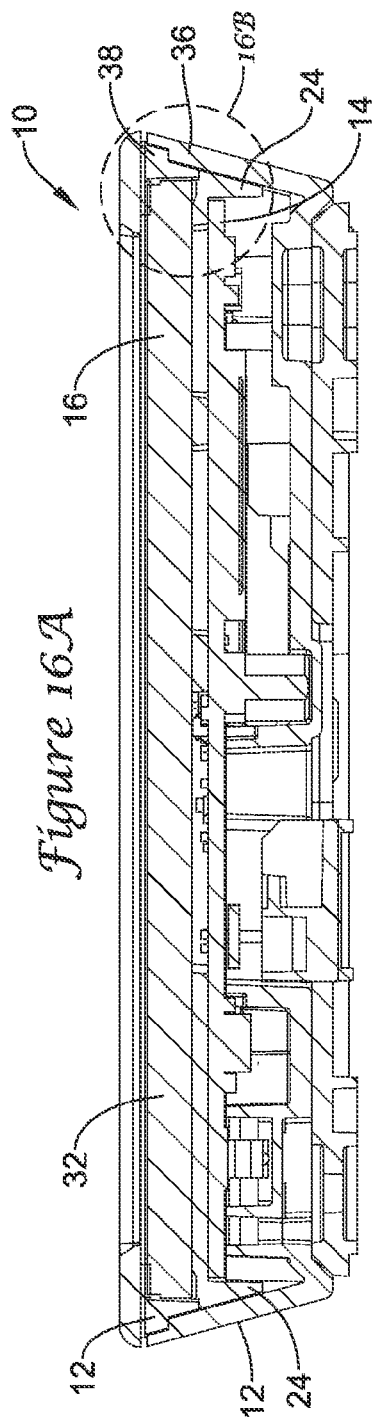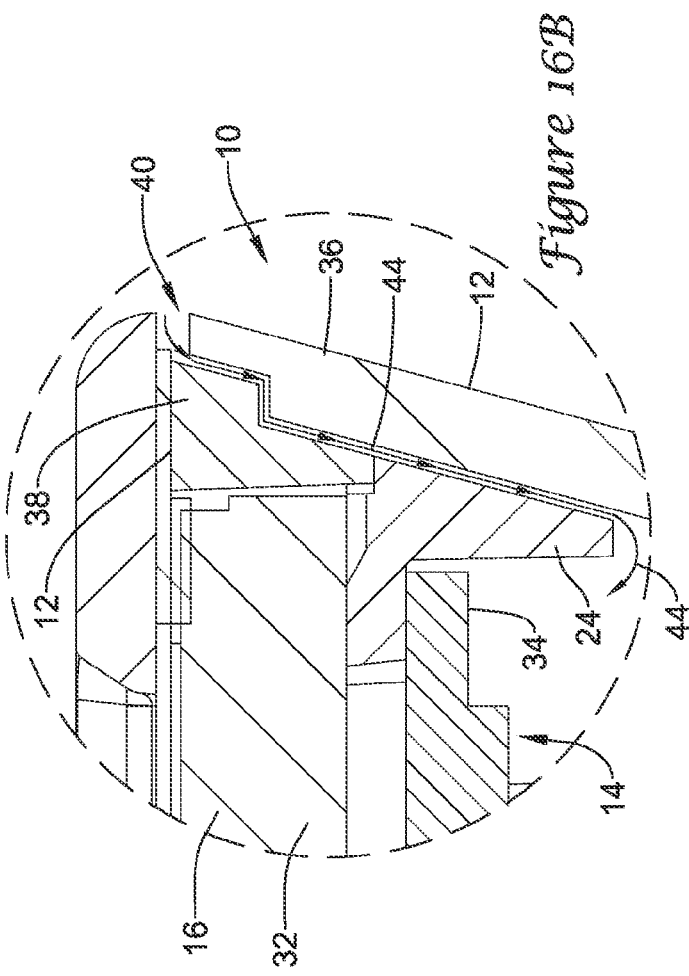

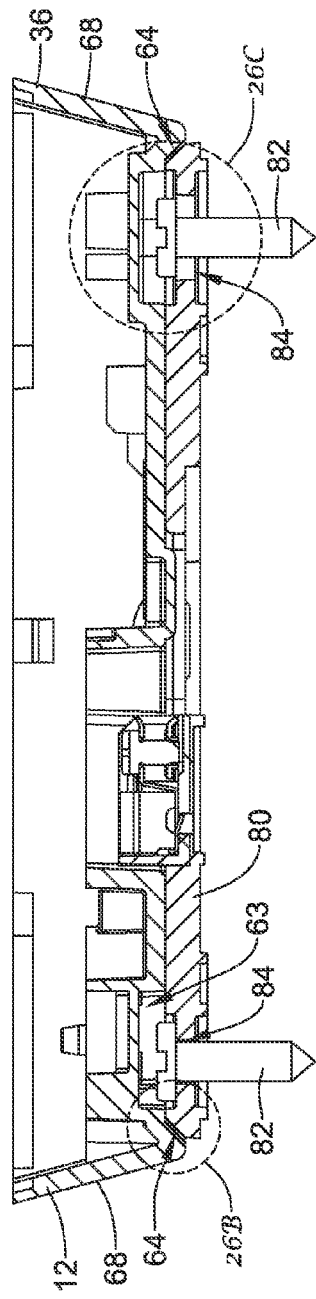
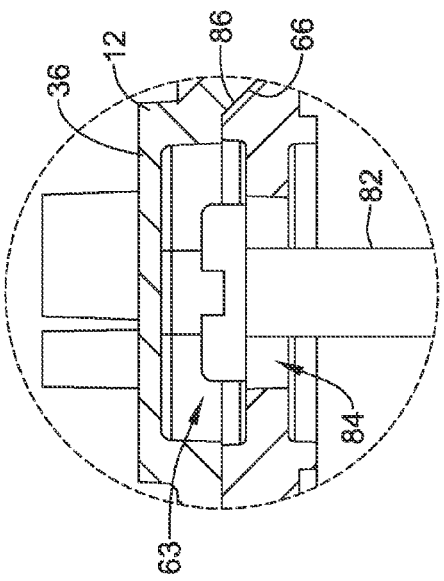
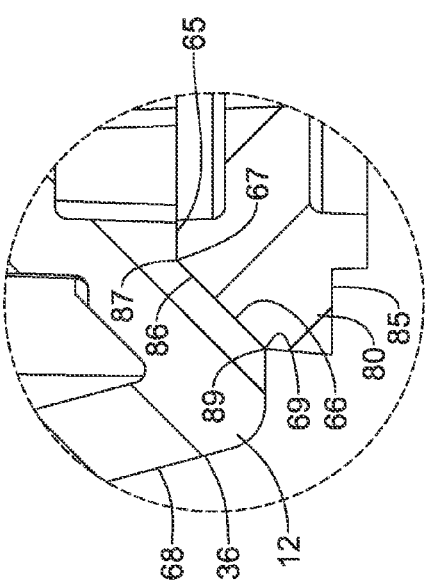

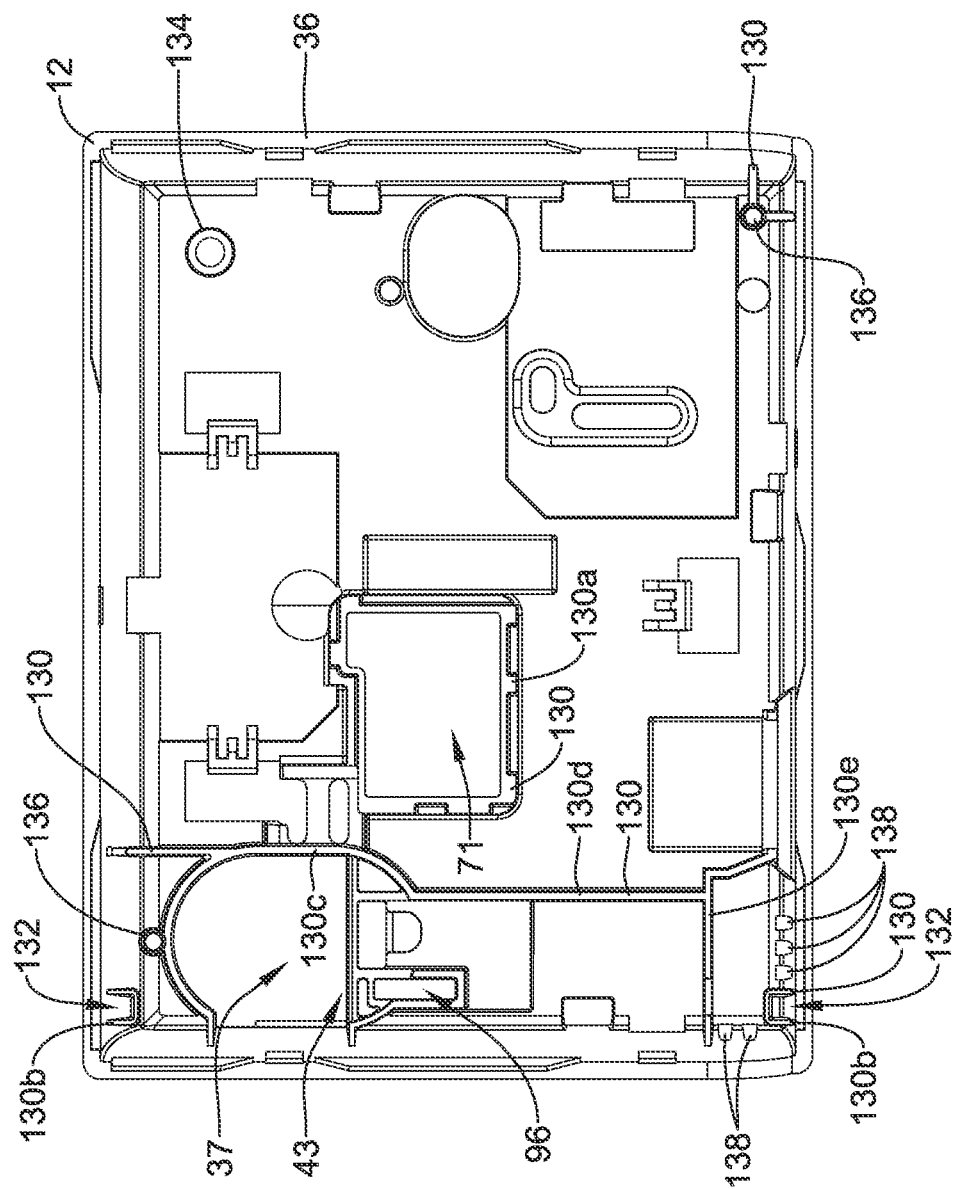

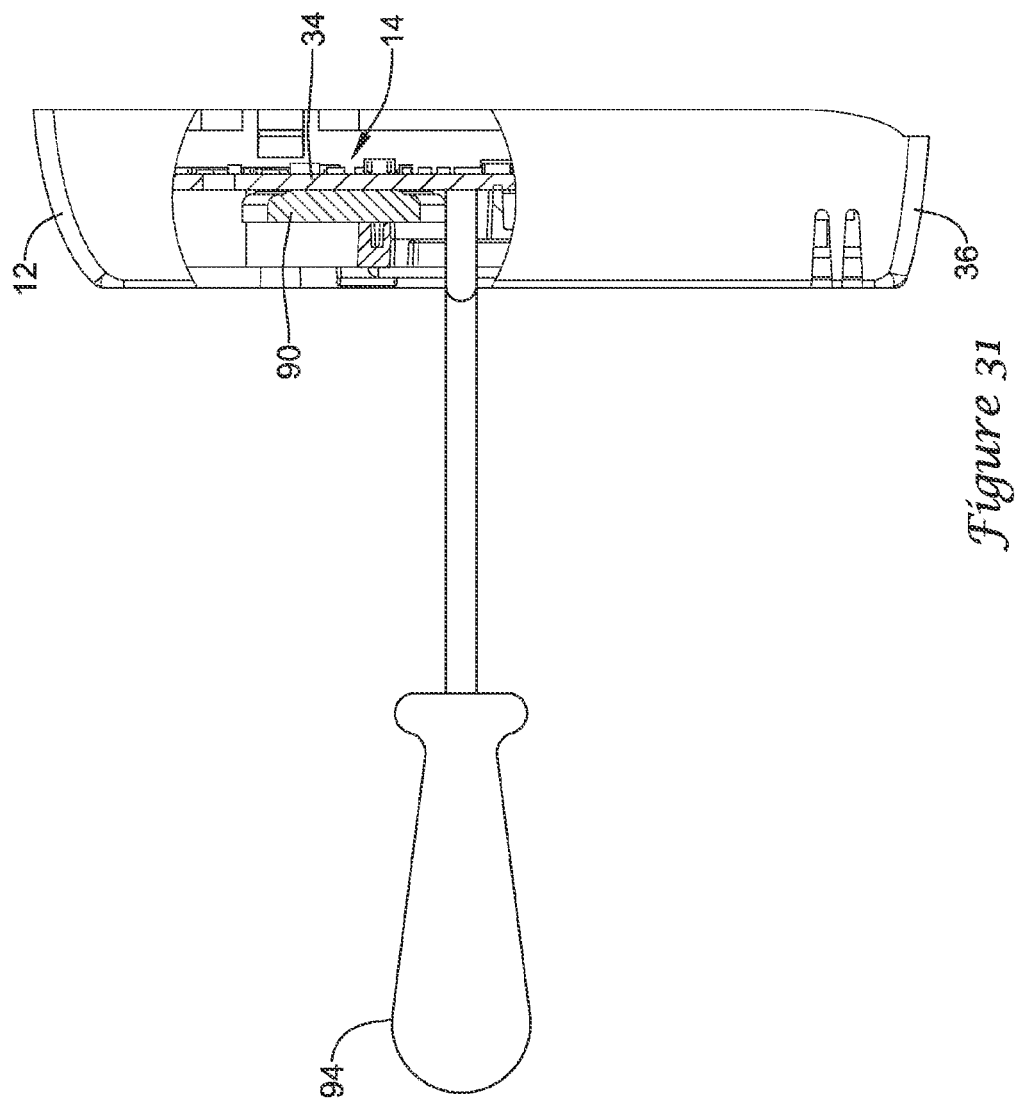

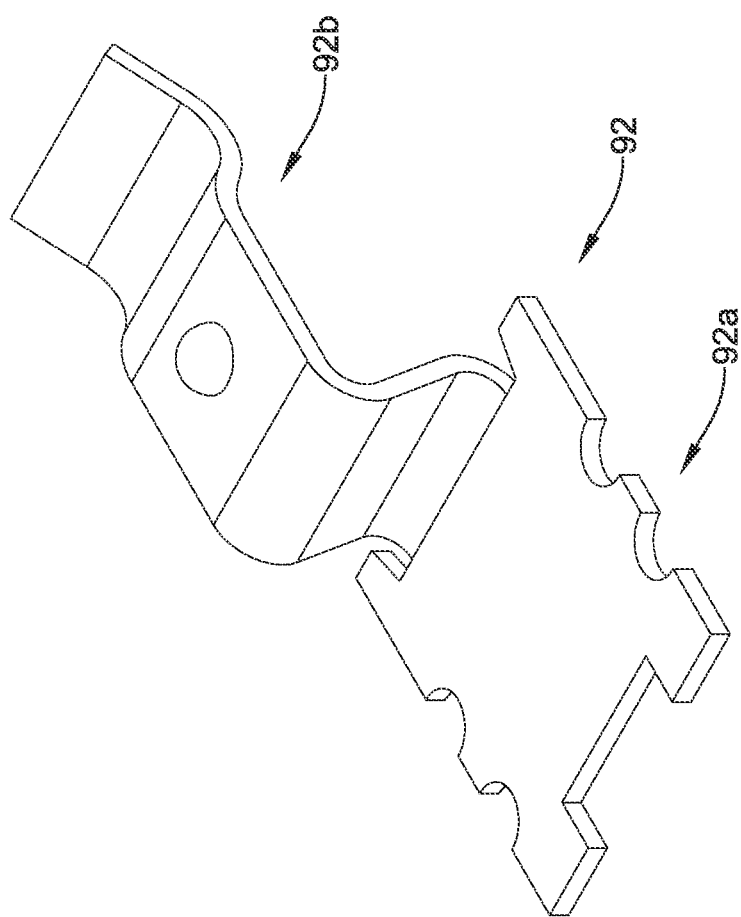

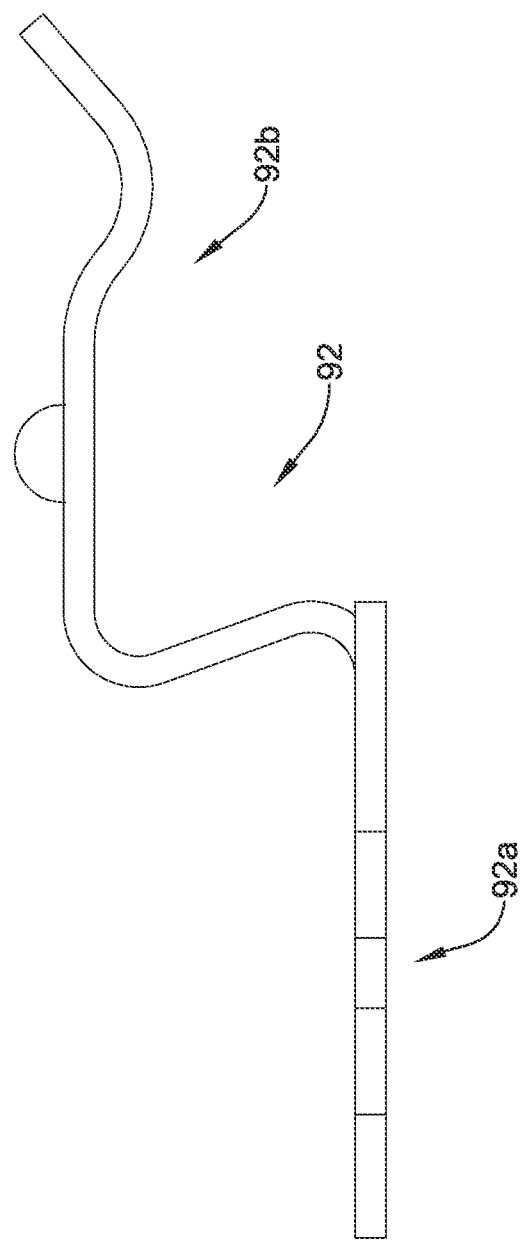

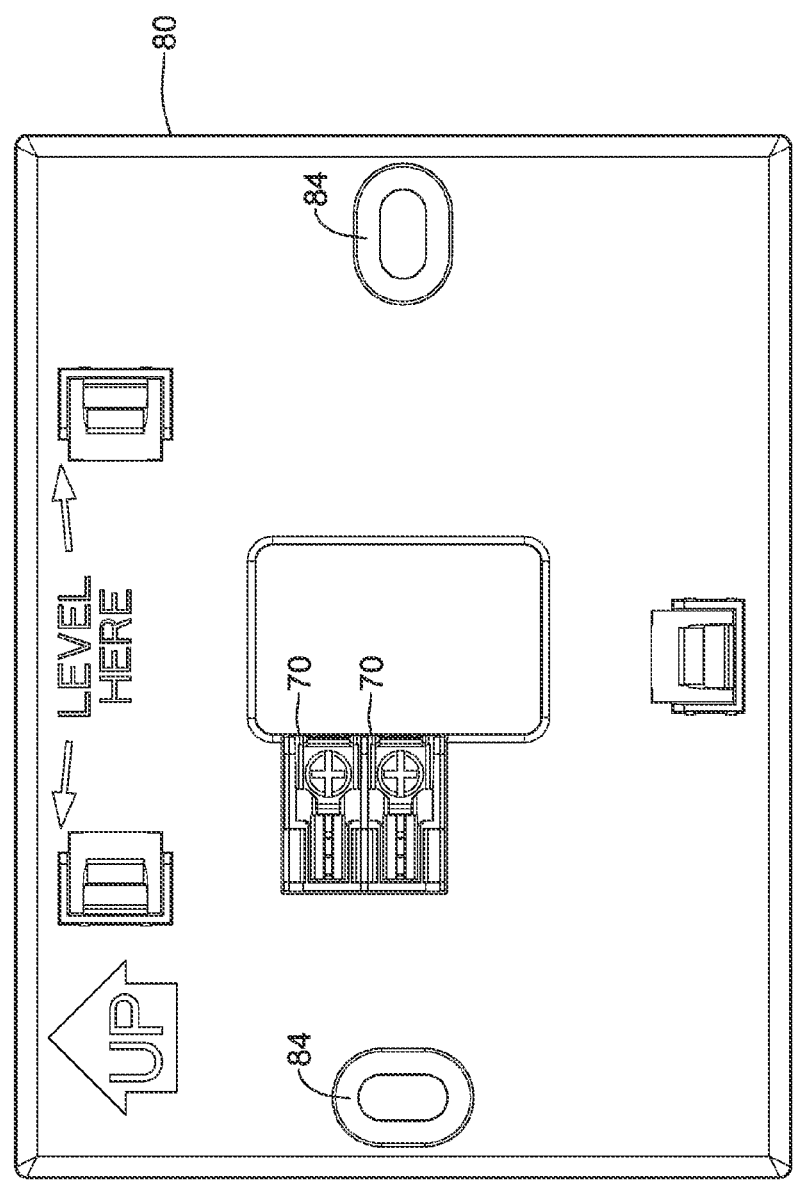

SURGE PROTECTION FOR AN ELECTRONIC DEVICE

This application claims priority to U.S. Provisional Application Ser. No. 61/800,637, filed Mar. 15, 2013 and entitled "Electronic Device and Methods", which is incorporated herein by reference.

TECHNICAL FIELD

This disclosure generally relates to electronic devices, and more particularly to improved use, assembly, construction, and reliability of such electronic devices.

BACKGROUND

Electronic devices, such as Heating, Ventilation, and Air Conditioning (HVAC) control panels, security system control panels, lighting control panels, irrigation control panels as well as other electronic devices are commonly used today. What would be desirable is an electronic device that has improved ease of use, ease of assembly, better construction and/or increased reliability over what is available today.

SUMMARY

This disclosure relates to electronic devices such as HVAC controller devices, and more particularly, to improved use, assembly, construction, and reliability of such electronic devices. The disclosure also relates to devices for protecting electrical components.

A surge protection circuit may be provided for an electronic device such as an HVAC controller. In one example, the surge protection circuit may include a first voltage clamp, a second voltage clamp, a resistor, and an output port. The first voltage clamp may provide a first clamping voltage between a power input terminal and a common terminal. The second voltage clamp may provide a second clamping voltage, where the second clamping voltage is less than the first clamping voltage. The resistor may be connected in series with the second voltage clamp via an output node that serves as the output port. The series connected resistor and second voltage clamp may be connected in parallel with the first voltage clamp. In such a configuration, a surge current at the power input terminal may be split between the first voltage clamp and the second voltage clamp. The amount of surge current that is provided to the second voltage clamp may be set by the value of the resistor. In some instances, the first voltage clamp may include a varistor, and the second voltage clamp may include a diode. In some instances, a capacitor may be configured to absorb voltage spikes at the output port.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various embodiments in connection with the accompanying drawings, in which:

FIG. 16A is a schematic cross-sectional view of the illustrative electronic assembly of FIG. 1, taken along line 16A-16A of FIG. 1;

FIG. 16B is a further schematic cross-sectional view of the illustrative electronic assembly of FIG. 1, take along line 16A-16A of FIG. 1, enlarging the portion contained in the dotted circle 16B of FIG. 16A;

FIG. 26A is a schematic cross-sectional view of an illustratively assembled back cover and wall plate;

FIG. 26B is a schematic magnified view of illustrative mating walls between an assembled back cover and wall plate, taken from FIG. 26A;

FIG. 26C is a schematic magnified view of illustrative pockets in the assembled back cover and wall plate, taken from FIG. 26A;

FIG. 27 is a schematic front view of an illustrative back cover of an electronic assembly.

FIG. 31 is a schematic side view of the illustrative electronic assembly with a tool inserted therein, having a portion of the illustrative electronic assembly housing removed;

FIG. 32 is a schematic perspective view of an illustrative battery holder;

FIG. 33 is a schematic side view of the illustrative battery holder of FIG. 32;

FIG. 34A is a schematic front view of an illustrative wall plate of an illustrative electronic assembly;

Figure 1:
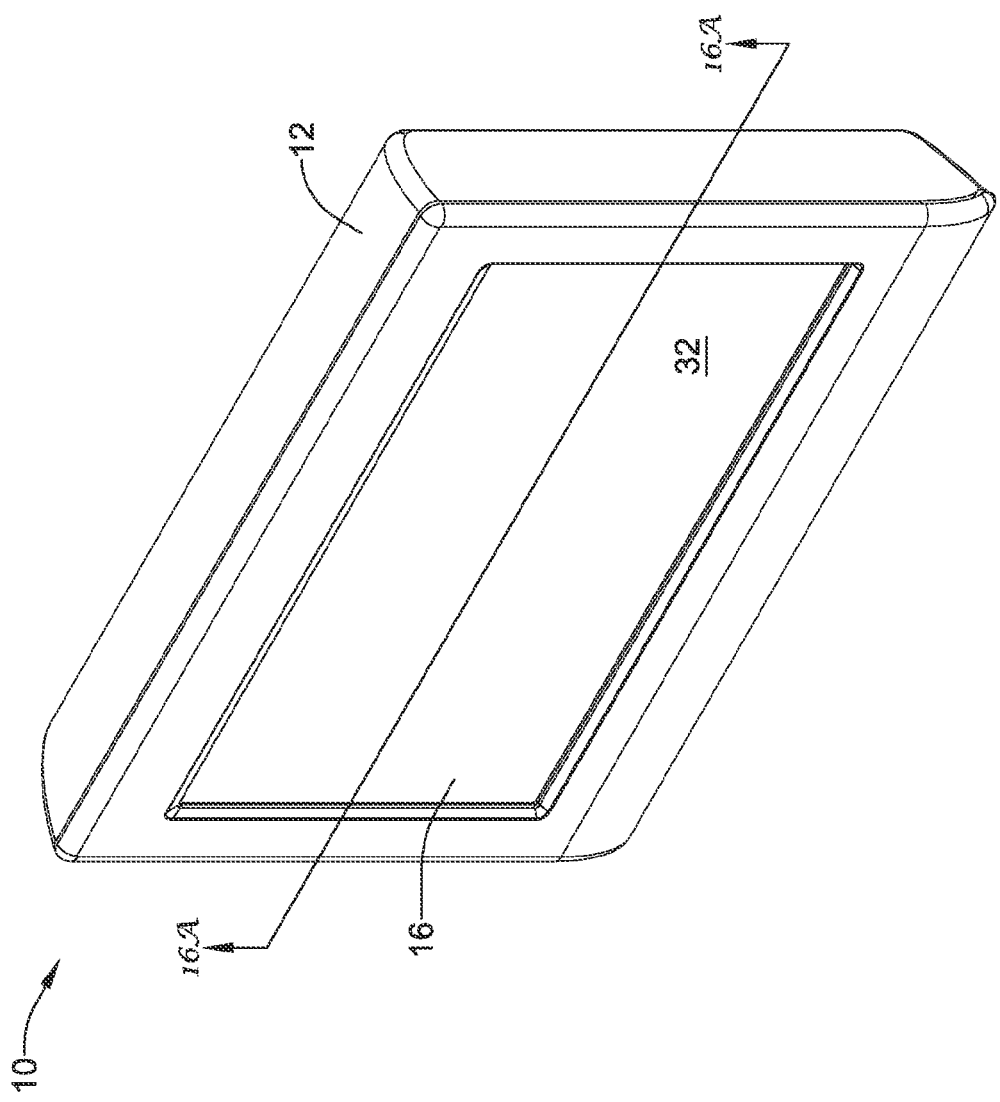
FIG. 1 is a schematic perspective view of an illustrative electronic assembly.

While the disclosure is amenable to various modifications and alternative forms, specifics thereof have been shown by way of example in the drawings and will be described in detail. It should be understood, however, that the intention is not to limit aspects of the disclosure to the particular embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements throughout the several views. The description and drawings show several embodiments which are meant to be illustrative in nature.

For convenience, the present disclosure may be described using relative terms including, for example, left, right, top, bottom, front, back, upper, lower, up, and down, as well as others. It is to be understood that these terms are merely used for illustrative purposes and are not meant to be limiting in any manner.

Figure 2:
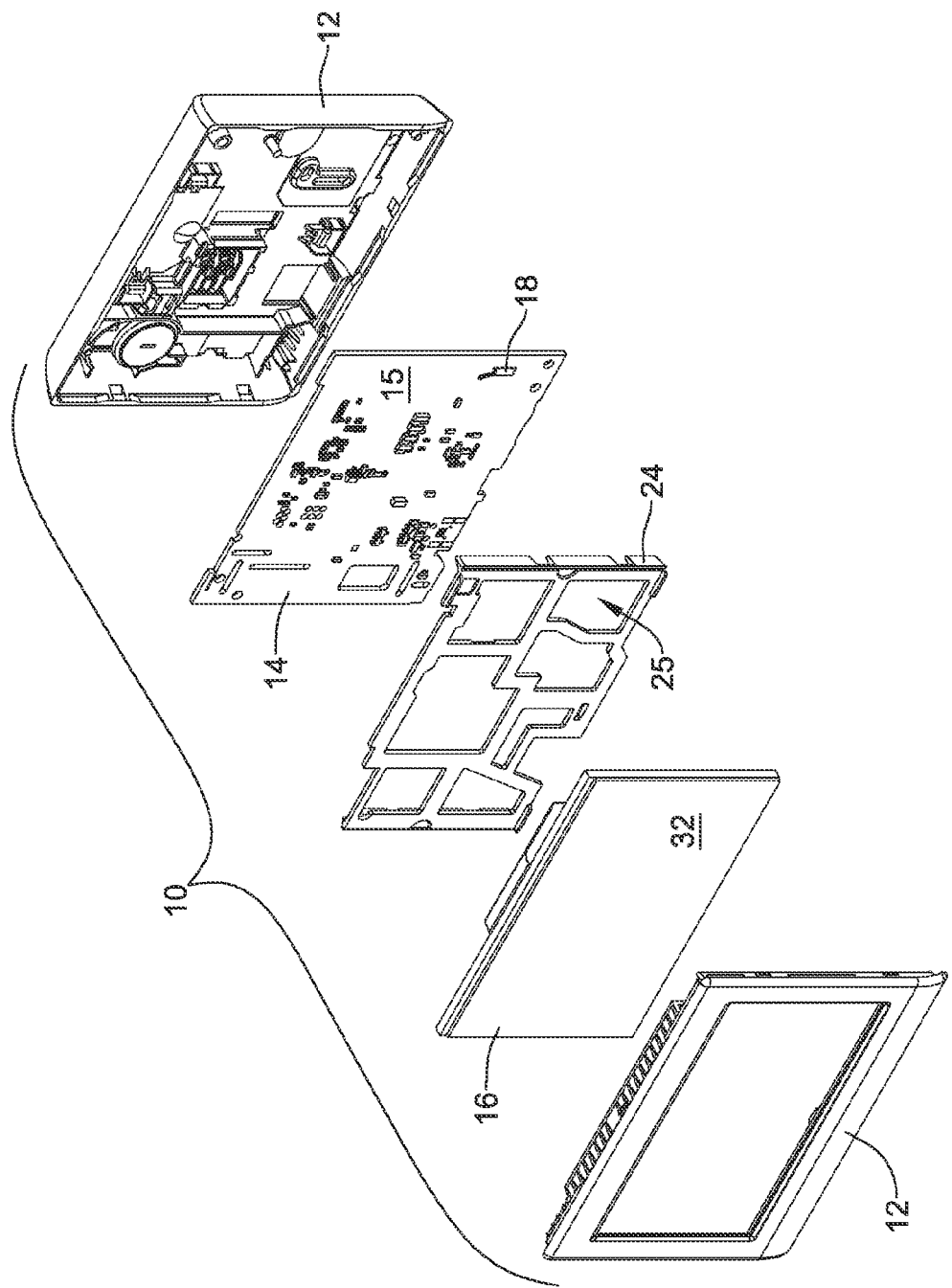
FIG. 2 is a schematic exploded perspective view of the illustrative electronic assembly of FIG. 1.

An electronic device or assembly 10 is shown in FIGS. 1 and 2. It is contemplated that the electronic device or assembly 10 may be, for example, a Heating, Ventilation, and Air Conditioning (HVAC) control panel, security system control panel, lighting control panel, irrigation control panel, or any other suitable device. In one example, the electronic device 10 may be a thermostat, but his is not required.

In some instances, as shown in FIG. 2, the illustrative electronic assembly 10 may include a housing 12, a PWA 14, an electronic component 16, and an electrically conductive extender or connector 18, where the PWA 14 and the electronic component 16 may be positioned at least partially within the housing 12. In some cases, a conductive shield may be provided adjacent the PWA 14, such as between the PWA 14 and the electronic component 16. In the illustrative example shown in FIGS. 1 and 2, the electronic component 16 may be a touch screen display that itself includes a conductive metal backing which can function as a conductive shield. The conductive shield may be electrically coupled to the ground feature of the PWA 14 via the connector 18, as further described below.

As noted above, the PWA 14 may include a grounding feature, such as a ground plane or other grounding feature (e.g., a grounding point, grounding terminal, ground pad, etc.). In some instances, the grounding feature or grounding plane may be an area of copper foil or other conductive material connected to a grounding point of the PWA 14. The grounding feature or grounding plane may serve as a return path for current from electronic components of the electronic assembly 10. The grounding feature or grounding plane is not specifically identified in the Figures, but may take the form of a conductive layer of the PWA 14, a terminal or pad on the PWA 14, or any other form as desired.

Electronic devices and their electronic assemblies 10, such as the illustrative thermostat shown in FIGS. 1 and 2, may be susceptible to electrostatic discharge (ESD) events. Such ESD events may occur when, for example, the electronic assemblies 10 are contacted by users and static electricity is discharged from the user to the electronic assembly 10. Such ESD events may be harmful to the electronic assemblies 10, as the electronic components of the electronic assemblies 10 may be short circuited or otherwise damaged by the ESD events. Providing some level of ESD protection in configuring an electronic assembly 10 is thus desirable in many situations.

From a hardware perspective, electronic devices and their electronic assemblies 10 may be at least partially protected from ESD events by, for example, including a conductive path for passing the electrostatic discharge safely to ground, and bypassing sensitive electronic components of the electronic assemblies 10. As indicate above, the electronic assembly 10 may include a printed wiring assembly (PWA) 14 that includes a ground feature, such as a ground plane. When provided, the ground plane may itself help shield sensitive electronic components from an outside ESD event.

As indicated above, and in some instances, the electronic component 16 may have a metal backing 22 (e.g., a zinc plating, sheet metal, and/or other metal or conductive material), a portion of a backing that is metal, or a metal feature extending adjacent the back of the electronic component 16. While a metal backing is used in this example, it is contemplated that any suitable conductive layer or shield may be used, if present. In one example, the electronic component 16 may be a display 32 (e.g., a liquid crystal display (LCD) or other display) that is at least partially enclosed by a metal box structure, where at least a back side of the display 32 (e.g., a side opposite a front side for viewing the display 32, where side walls may extending between the front side and the back side) includes a metal backing 22 (see FIG. 4). In some cases, the perimeter sides (e.g., side walls) of the display 32, and even a border around the front side of the display 32, may be covered by the metal box structure. Where the electronic component 16 includes metal backing 22 or another conductive feature extending adjacent the back of the electronic component 16, an electrically conductive extender or connector 18 may provide an electrical connection between the metal backing 22 or the other conductive feature and the ground feature of the PWA 14. Such an electrical connection 18 between the PWA 14 and the electronic component 16 may, for example, help ground the metal backing 22 of the electronic component 16 and reduce the chances that an ESD event will cause damage to electronic components mounted on or near the PWA 14.

In some instances, the electronic component 16 and the PWA 14 may be spaced apart from each other when mounted in the housing 12. In one example, the metal backing 22 may be spaced from the PWA 14 and/or from components on the PWA 14 by a distance greater than about two (2) millimeters, greater than about three (3) millimeters, greater than about five (5) millimeters, greater than about ten (10) millimeters, or any other distance as desired. Such a space may provide sufficient space to accommodate one or more electrical components that may be mounted to the side of the PWA facing a spacer 24 and/or electronic component 16, and in some cases, may help dissipate or distribute heat generated by the PWA 14 and/or electronic component 16 within the housing.

In some instances, to help maintain the space between the electronic component 16 and the PWA 14, the spacer 24 may be provided, as shown in for example FIGS. 2-4 and 10-12. The spacer 24 may be made from any suitable material(s). For example, the spacer 24 may be made from one or more polymers or other materials having desirable material properties. The spacer 24 may be made from an electrically insulating material, such that the spacer 24 does not create a short circuit between any conductive traces or other components on the PWA 14 and the electronic component 16. Further, the spacer 24 may be configured to help support the electronic component 16 both when users are interacting with the electronic component 16 and when the electronic component 16 may be operating on its own.

Figure 10:
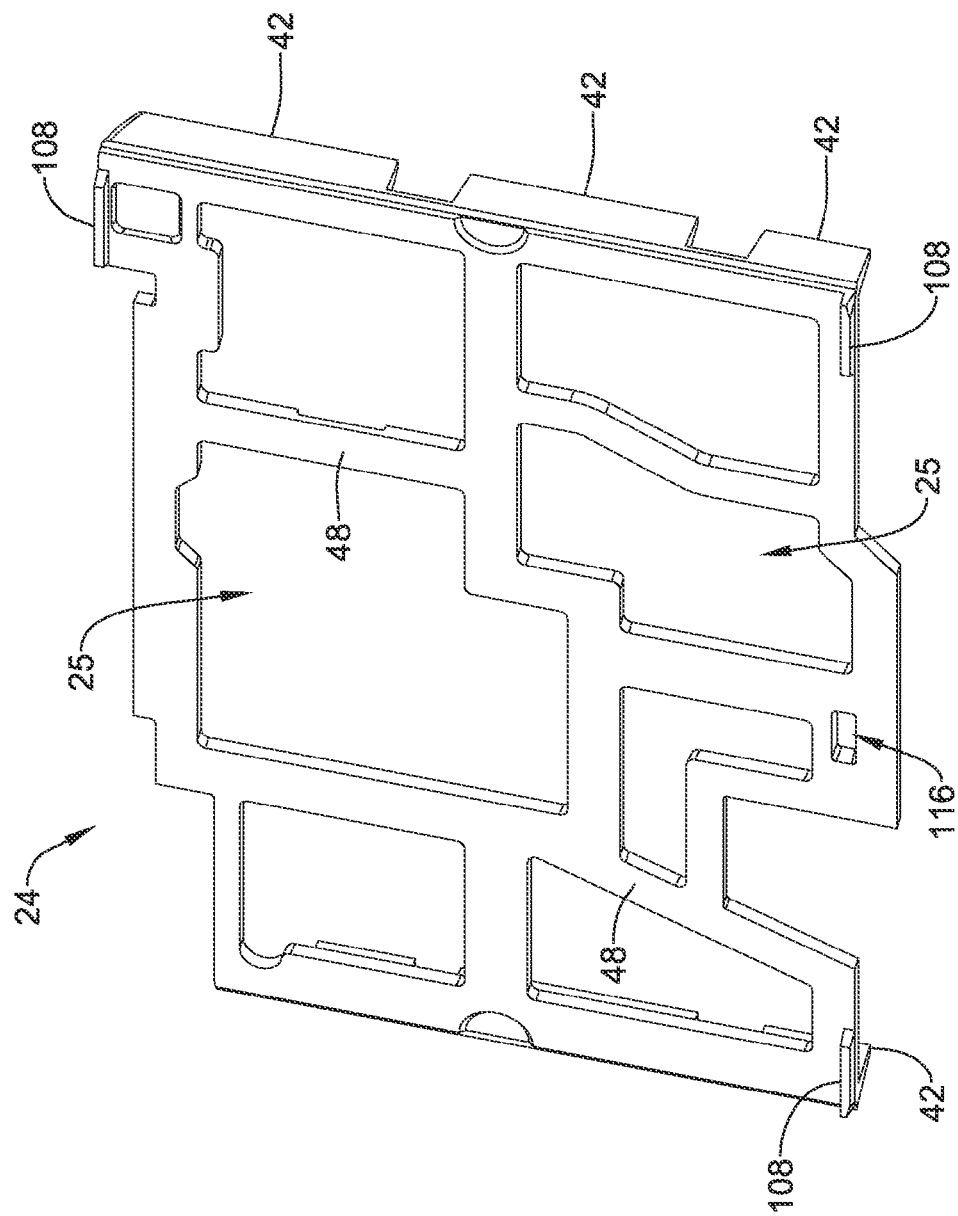
FIG. 10 is a schematic perspective view of an illustrative spacer of an electronic assembly.
Figure 11:
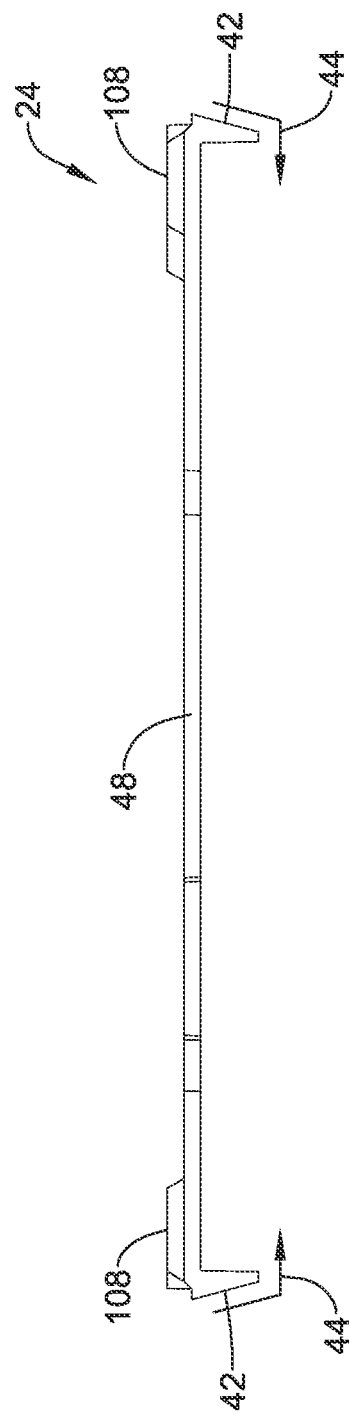
FIG. 11 is a schematic side view of the illustrative spacer of FIG. 10.
Figure 12:
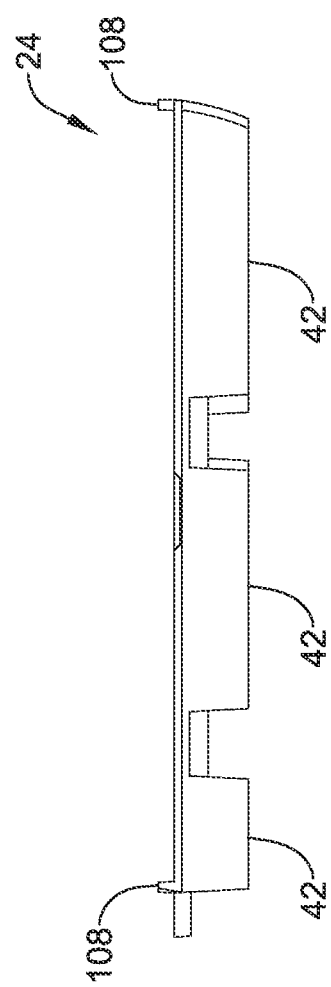
FIG. 12 is a further schematic side view of the illustrative spacer of FIG. 10.

In some instances, the spacer 24 may take on a web-like form, such as shown best in perhaps FIGS. 2, 10, 17, 19, and 21, and may have openings 25 (e.g., one or more openings 25, two or more openings 25, etc.) between structural portions 48. The openings 25 of the spacer 24 may allow for air gaps between the back side of the display 32 and the PCB 34 of the PWA 14, when the spacer is positioned therebetween (see, discussion of the positioning of the spacer 24 below). The spacer 24 may have spacer side walls 42 extending from and/or forming one or more edges of the spacer 24, as best seen in perhaps FIGS. 10-12. Illustratively, the spacer side walls 42 may extend in the direction of the PWA 14 and/or may extend along an entire edge of the spacer 24 or may extend a partial distance along an edge of the spacer 24, as seen in FIGS. 10 and 12. When in use with the housing 12, the spacer side walls 42 of the spacer 24 may be formed to mate with the housing 12, which may help provide an ESD path 44 that travels around the ends of the spacer walls 24, as best shown in perhaps FIGS. 11 and 16B. Because the length of the ESD path 44 is increased by the spacer side walls 42, the PWA 14 may be better protected from an ESD event originating from outside of the housing 12.

In some instances, the web-like configuration of the spacer 24 may allow for a double sided PWA 14 component placement, whereas a spacer 24 without openings 25 may not permit component placement on the side of the PWA 14 adjacent the electronic component 16. The openings 25 in the spacer 24 may allow components to be mounted on both sides of the PCB 34 without interfering with the electronic component 16 (e.g., display 32) of the electronic assembly 10, by providing space for the components on the side of the PCB 34 facing the component 16.

Figure 7:
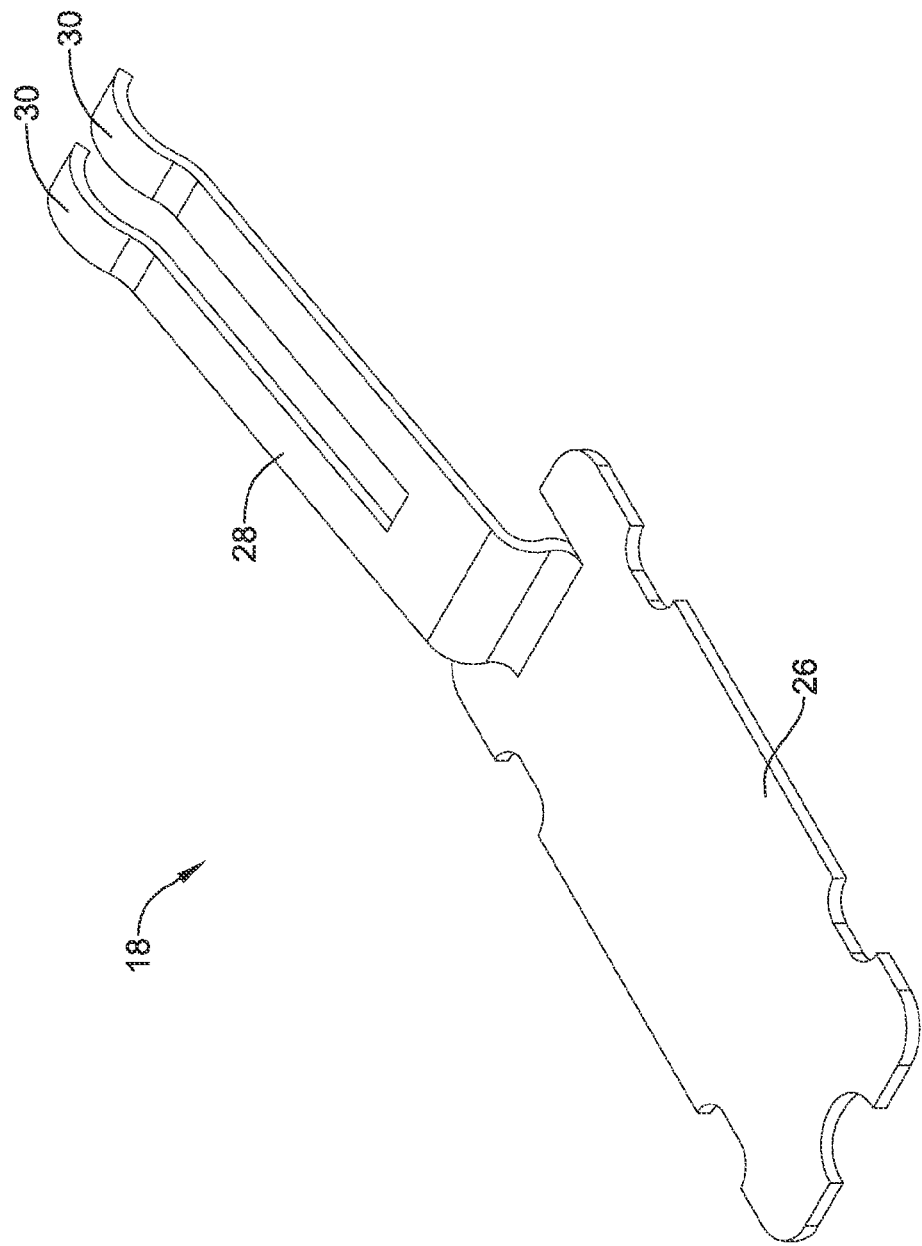
FIG. 7 is a schematic perspective view of an illustrative electrostatic discharge clip of an electronic assembly.
Figure 8:
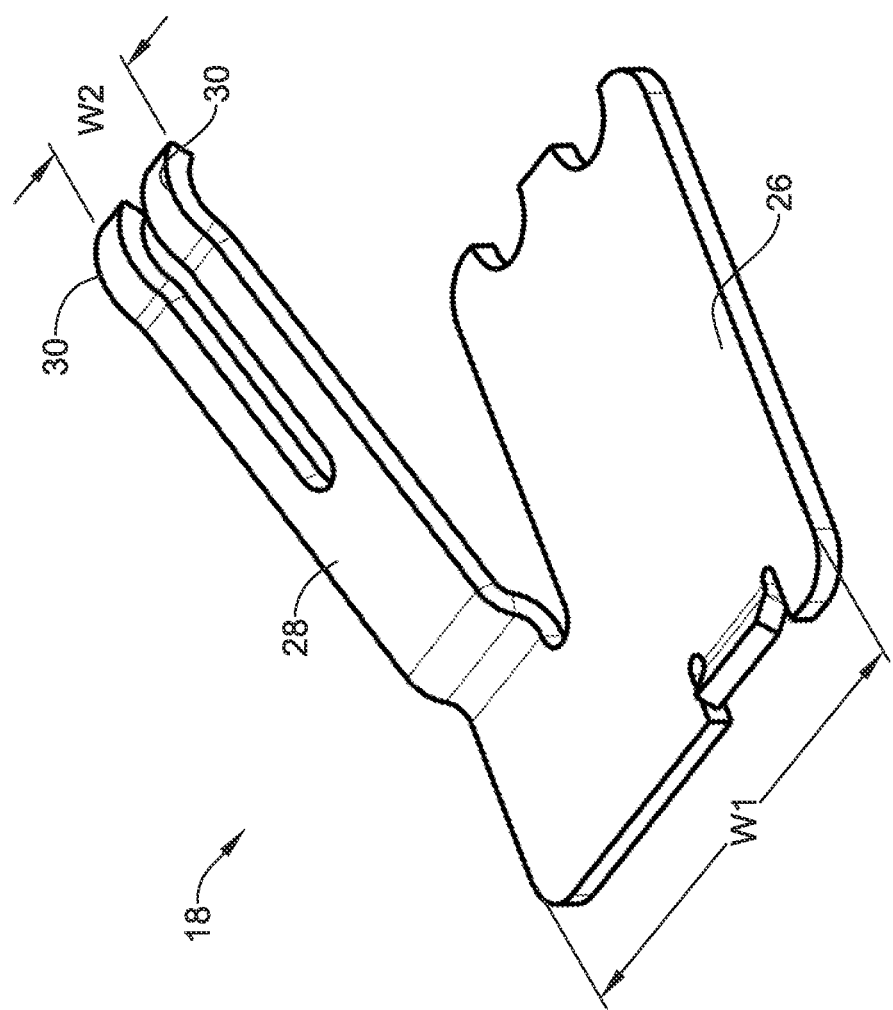
FIG. 8 is a schematic perspective view of another illustrative electrostatic discharge clip of an electronic assembly.

In some instances, the electrically conductive extender or connector 18 may have one or more portions 26, 28, as shown in FIGS. 7 and 8. Illustratively, the electrically conductive extender or connector 18 may have a first portion or connector portion 26, and a second portion or spring portion 28 (e.g., a flexible beam or other feature). In one example, the first portion or connector portion 26 may be integrally formed with the second portion or spring portion 28, as shown in FIGS. 7 and 8. In another example, the first portion or connector portion 26 may be formed separate from the second portion or spring portion 28 and combined in any manner, as desired, to form the electrically conductive extender or connector 18.

Illustratively, the electrically conductive extender or connector 18 may have a form that differs from that of the electrically conductive extender or connector 18 shown in FIG. 7. In one example, the electrically conductive extender or connector 18 may have first portion 26 with a width W1 and second portion 28 with a width W2, where width W2 may have a smaller value than width W1, as shown in FIG. 8. In this example, where width W1 is greater than width W2, the second portion 28 may be located off-center with respect to the first portion 26, as shown in FIG. 8, but this is not required.

Figure 5:
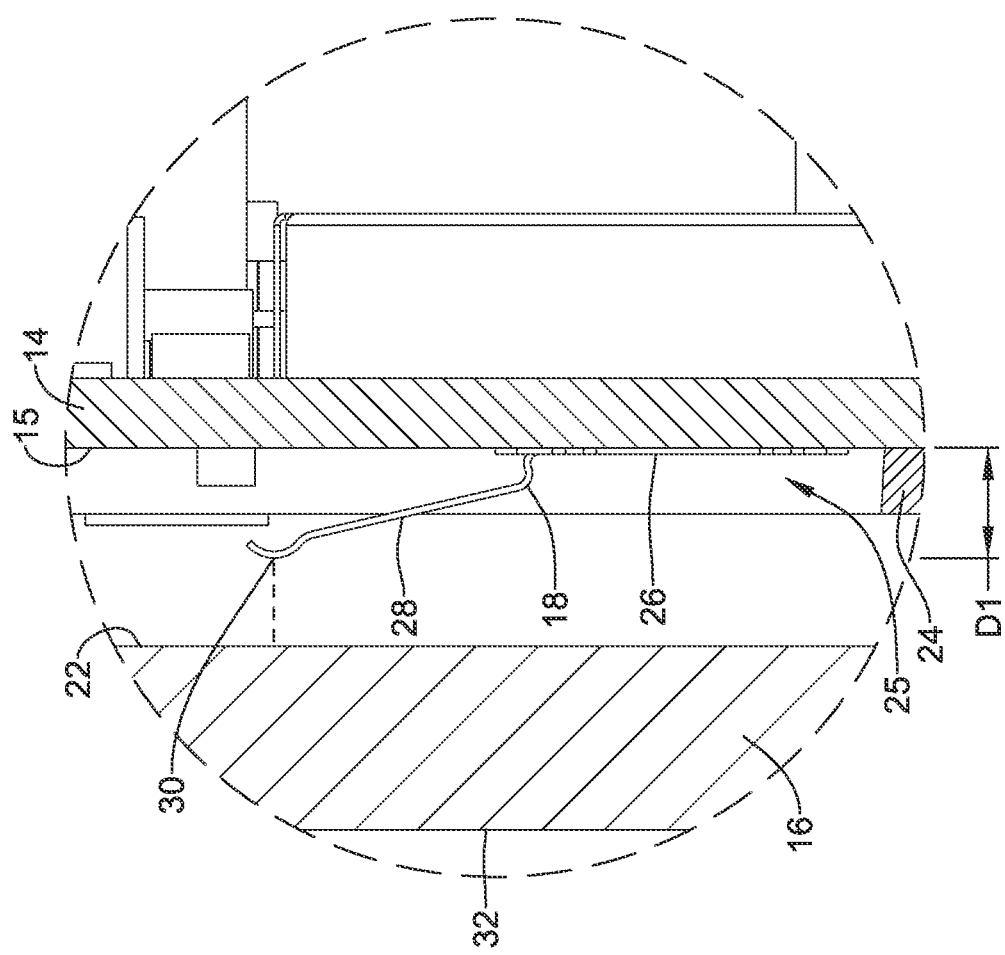
FIG. 5 is a schematic cross-sectional partially-exploded view of the features of the illustrative electronic assembly of FIG. 3 with the electrostatic discharge clip in an original position.
Figure 6:
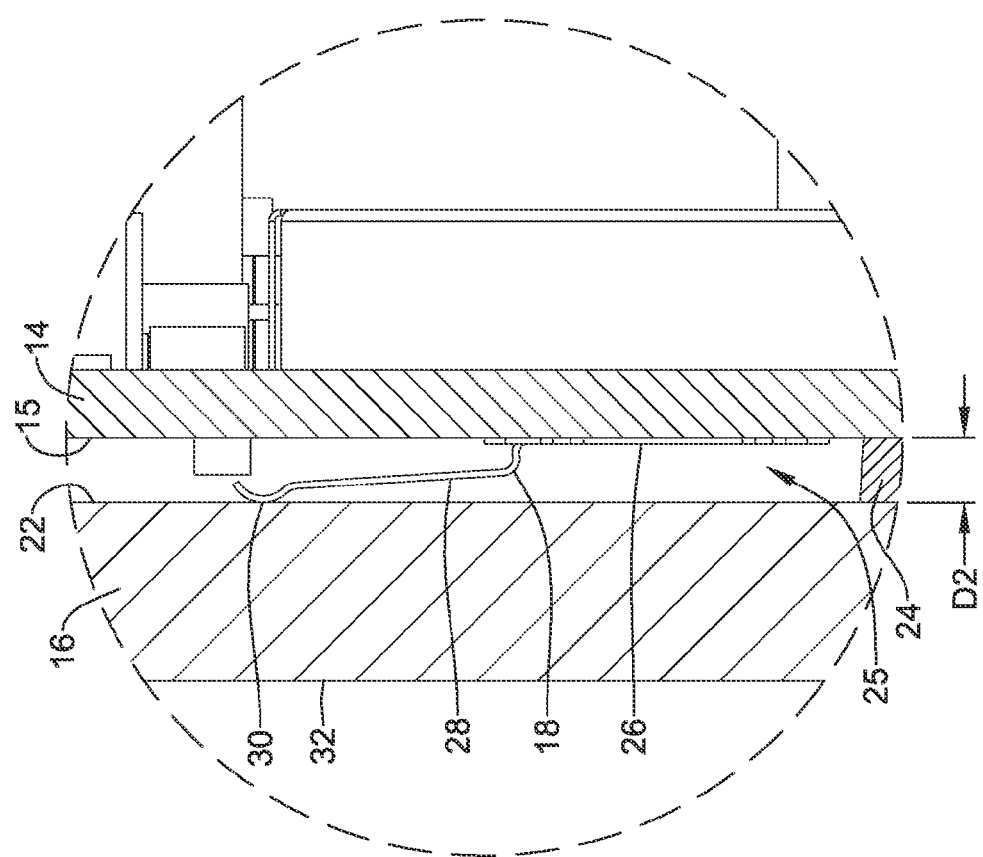
FIG. 6 is a schematic cross-sectional view of the features of the illustrative electronic assembly of FIG. 3 with the electrostatic discharge clip in an articulated position.

When the first portion or connector portion 26 and the second portion or spring portion 28 are in combination, the electrically conductive extender or connector 18 may have the form of a clip, a spring, a clasp, or other form having a configuration that may be connected to the PWA 14. In some instances, the electrically conductive extender or connector 18 may take on a clip form and may include a first portion or connector portion 26 and second portion or a spring portion 28. The first portion or connector portion 26 may be configured to mechanically connect to the PWA 14, and the second portion or of the spring portion 28 may be configured to mechanically contact and electrically connect to the metal backing 22. In some cases, the first portion or connector portion 26 of the electrically conductive extender or connector 18 may mechanically connect to the PWA 14 via surface mount technology ("SMT"). In other examples, the first portion or connector portion 26 of the electrically conductive extender or connector 18 may mechanically connect to the PWA 14 via mounting techniques that differ from SMT. In some illustrative instances, the first portion 26 of the electrically conductive extender or connector 18 may be soldered to a surface 15 of the PWA 14, such that the second portion or spring portion 28 of the electrically conductive extender or connector 18 may extend away from the surface 15 of the PWA 14 and toward the electronic component 16, as best seen in FIGS. 5-6. In some cases, the first portion 26 of the electrically conductive extender or connector 18 may be soldered to a conductive pad, such as a ground feature or ground plane.

The electrically conductive extender or connector 18 may have a feature that is configured to contact the metal backing 22 of the electronic component 16. In one example, the second portion or spring portion 28 of the electrically conductive extender or connector 18 may have a contact portion 30 for contacting the metal backing 22 of the electronic component 16. The contact portion 30 of the second portion or spring portion 28 may take on any shape and/or size. Illustratively, the contact portion 30 may have the shape of a protrusion or a bump that has a peak rising above any other portion of the electrically conductive extender or connector 18, where, for reference, the electronic component 16 is considered to be above the PWA 14.

In some instances, the electrically conductive extender or connector 18 may be resilient, such that the material and/or form of the electrically conductive extender or connector 18 has mechanically resilient properties. Illustratively, an electrically conductive resilient extender or connector 18 may be configurable between an original configuration or position, as best shown in FIG. 5, and an articulated configuration or position, as best shown in FIG. 6, where the electrically conductive resilient extender or connector 18 may provide a spring force back toward the original configuration. Where the electrically conductive resilient extender or connector 18 is in the articulated configuration (see FIG. 6), the spring force of the conductive resilient extender or connector 18 may be exerted against the metal backing 22 of the electronic component 16, the PWA 14, or the metal backing 22 of the electronic component 16 and the PWA 14.

In some instances, when the electrically conductive extender or connector 18 is configurable between an original configuration or position and an articulated configuration or position, the distance between a top portion or the contact portion 30 of the electrically conductive extender or connector 18 and the PWA 14 may vary depending on the configuration. For example, when the electrically conductive extender or connector 18 is in the original configuration, the top portion or the contact portion 30 of the electrically conductive extender or connector 18 may be 1.0-5.0 millimeters, 2.2-2.8 millimeters, 2.4-2.6 millimeters, 2.0-2.5 millimeters, 2.5-3.0 millimeters, or in any other range of distances D1 from the PWA 14, as best shown in FIG. 5. When the electrically conductive extender or connector 18 is in the articulated position, the top portion or the contact portion 30 of the electrically conductive extender or connector 18 may be 0.0-2.0 millimeters, 1.0-2.0 millimeters, 1.2-2.8 millimeters, 1.4-1.6 millimeters, 1.0-1.5 millimeters, 1.5-2.0 millimeters, or in any other range of distances D2 from the PWA 14, as best shown in FIG. 6.

Illustratively, the force between the electrically conductive extender or connector 18 and, for example, the metal backing 22 of the electronic component 16 may be relatively small when in the articulated position. In one example, the force between the electrically conductive extender or connector 18 and the metal backing 22 in the articulated position may be such that the performance of the display 32 is not affected by the contact force applied to the metal backing 22 from the electrically conductive extender or connector 18 (e.g., such that display 32 is devoid of any color areas or other display of sensitivity to a force acting on the metal backing 22 of the display).

In some instances, large contact forces or resistances between the metal backing 22 and the electrically conductive extender or connector 18 may not be necessary to provide ESD protection. For example, because ESD events typically have relatively high voltage (e.g., approximately 10 kV or other value) and the electric breakdown of the surrounding air is up to 3 kV/mm (e.g., at dry air), an electrostatic discharge may find its way to the electrically conductive extender or connector 18 rather than jump across the space created by the spacer 24 and to an ESD sensitive electrical component mounted on the PWA 14, despite the relatively low contact force between the metal backing 22 and the electrically conductive extender or connector 18.

The electrically conductive extender or connector 18 may be made from any of one or more materials. In some instances, the electrically conductive extender or connector 18 may be made from an electrically conductive material, a resilient material, any other material having desirable properties, and/or any combination of materials having these or other properties. For example, the electrically conductive extender or connector 18 may be made from a phosphor bronze (e.g., a copper alloy), steel, a conductive polymer, or any other suitable material.

Figure 9:
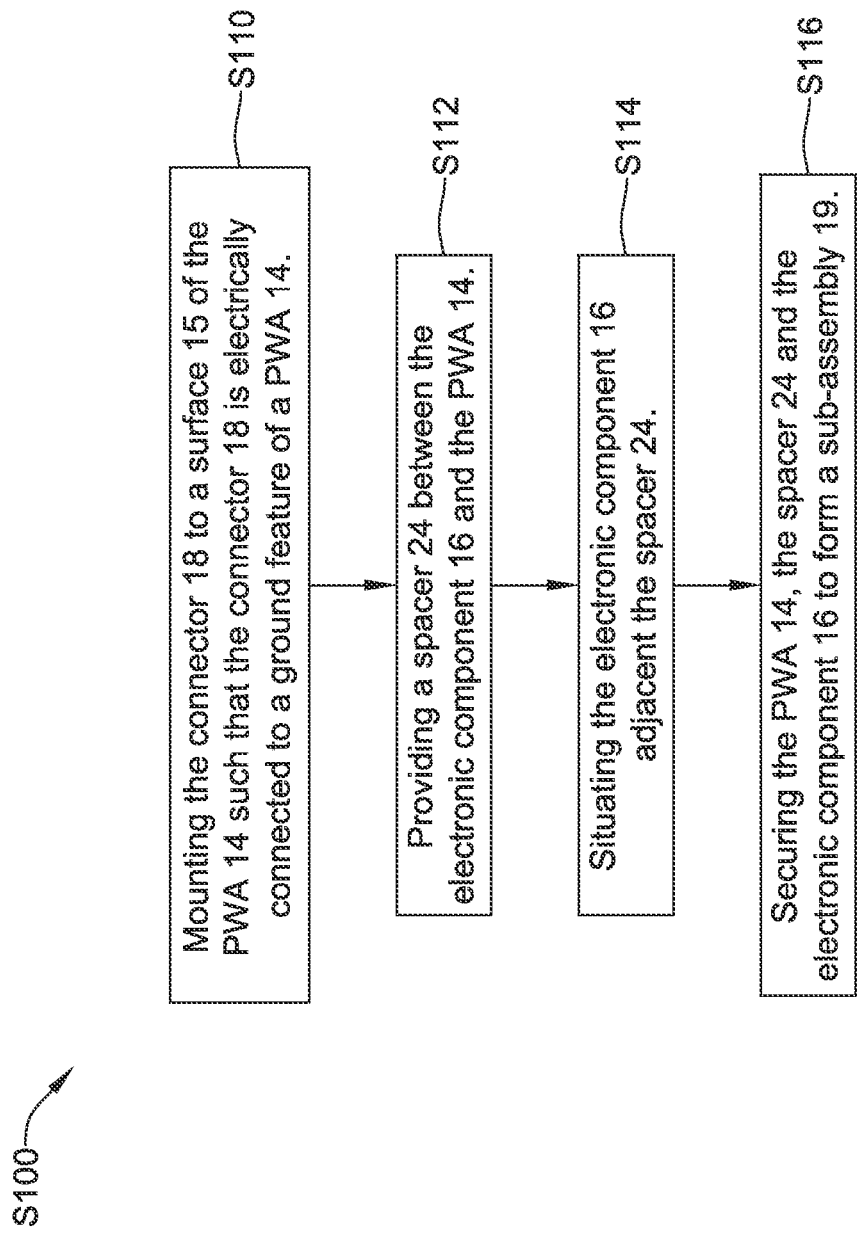
FIG. 9 is a schematic flow diagram of an illustrative method of grounding an electronic component of an electronic device.

In some instances, the electrically conductive extender or connector 18 may be used in an illustrative method (S100) of grounding an electronic component 16 of an electronic device or assembly 10, as depicted in FIG. 9 (where the steps listed may be performed in the order depicted or in another order, if at all, as desired). The grounding of the electronic component 16 of the electronic device or assembly 10 may help reduce or prevent electrical damage to one or more electrical components of the electronic device or assembly 10 in response to an ESD event.

Illustratively, the method (S100) may include electrically connecting an electrically conductive extender or connector 18 (e.g., a resilient electrically conductive extender or connector) to a grounding connection or feature of a PWA 14 of the electronic device or assembly 10. In some instances, the method (S100) may include mounting the electrically conductive extender or connector 18 to the surface 15 of the PWA 14 (S110). The electrically conductive extender or connector 18 may be mounted to the surface 15 of the PWA 14 with surface mount technology or any other mounting technique. Illustratively, a first portion or connector portion 26 of the electrically conductive extender or connector 18 may be mounted directly or indirectly to the PWA 14. In some cases, the first portion or connector portion 26 of the electrically conductive extender or connector 18 may be mounted to the PWA 14 via an interference type connector such as a screw type connector, a bayonet type of connector, or any other type of interference type connector. In some cases, the first portion or connector portion 26 may be soldered to the surface 15 of the PWA 14. In any event, the electrically conductive extender or connector 18 may be mounted such that the second portion or spring portion 28 thereof may extend away from the surface 15 of the PWA 14 and toward the electronic component 16.

In some instances, the method may include providing a spacer 24 between the electronic component 16 and the PWA 14 (S112) and situating the electronic component 16 adjacent the spacer 24 (S114). In one example of situating the electronic component 16 adjacent the spacer 24 (S114), the electronic component 16 may be situated such that the electrically conductive extender or connector 18 may extend from the PWA 14, through an opening 25 in the spacer 24, and make electrical and mechanical contact with a metal backing 22 or other electrically conductive feature of the electronic component 16. In this example, the electrically conductive extender or connector 18 may be in a flexed or other configuration such that it exerts a spring force against the metal backing 22 or other electrically conductive feature of the electronic component 16. In some cases, the spring force of the electrically conductive extender or connector 18 exerted on the metal backing 22 or other electrically conductive feature of the electronic component 16 may be configured and/or set to maintain an electrical connection with the metal backing 22 or other electrically conductive feature of the electronic component 16. The spring force exerted by the electrically conductive extender or connector 18 may maintain an electrical connection with the metal backing 22 or other electrically conductive feature of the electronic component 16 over a range of spacing between a surface 15 of the PWA 14 and the metal backing 22 of the electronic component 16. Illustratively, the range of spacing may be 0.0-3.0 millimeters, 0.0-2.8 millimeters, 0.0-2.6 millimeters, 0.0-2.5 millimeters, 0-2.0 millimeters or any other range of spacing between the PWA 14 and the electronic component 16.

Figure 3:
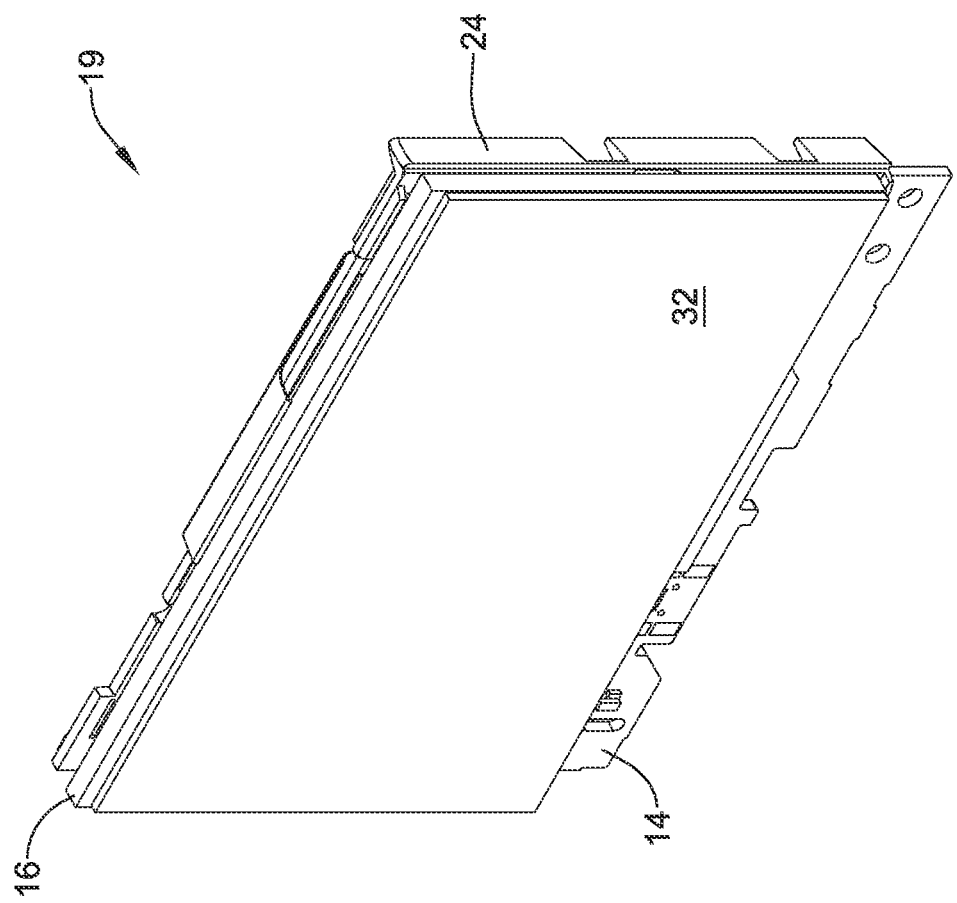
FIG. 3 is a schematic perspective view of an illustrative sub-assembly of an illustrative electronic assembly.
Figure 4:
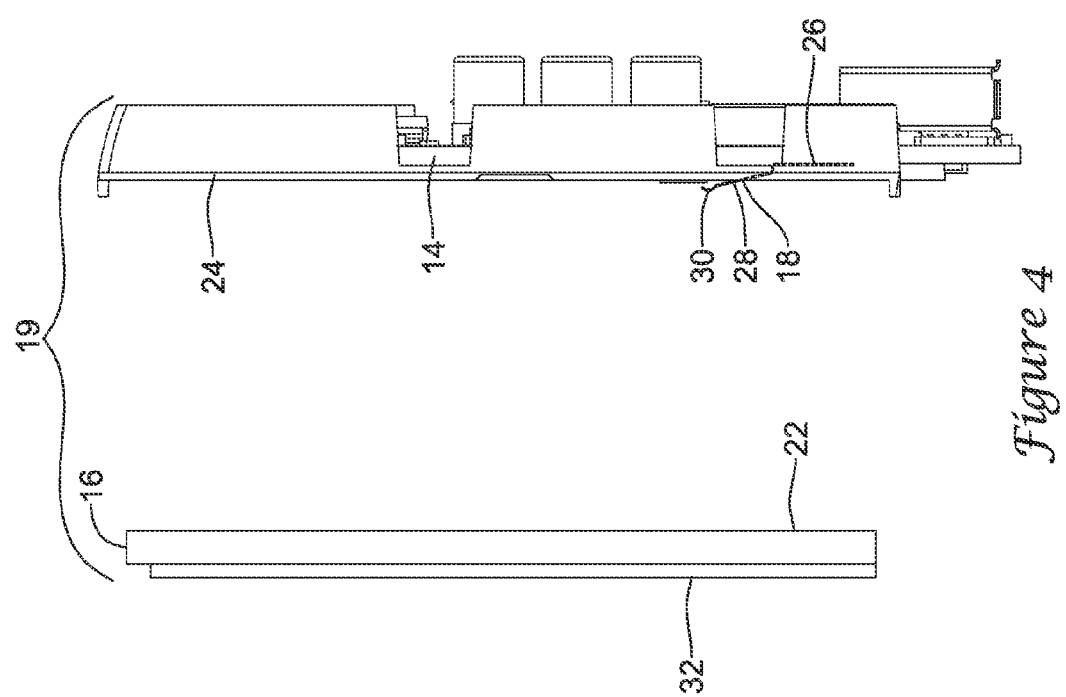
FIG. 4 is a schematic partially exploded side view of the illustrative sub-assembly of the illustrative electronic assembly of FIG. 3.

In some instances, the method (S100) may include securing the PWA 14, the spacer 24, and the electronic component 16 together to form a sub-assembly 19 (S116) (see FIGS. 3-4). Securing the PWA 14, the spacer 24, and the electronic component 16 together may be performed using any connecting technique and/or connecting features, as desired. For example, the spacer 24 may clip to the PWA 14 and the electronic component 16, the spacer 24 may be glued to the PWA 14 and the electronic component 16, or the PWA 14, the spacer 24, and the electronic component 16 may be connected in any other manner as desired to form a sub-assembly 19 (see FIG. 4).

Illustratively, the mounting of the electrically conductive extender or connector 18 to the PWA 14 may include performing the mounting before or after the sub-assembly 19 is assembled. When mounted before, the contact portion 30 of the electrically conductive extender or connector 18 may move laterally along the surface 15 of the metal backing 22 as the electronic component 16 is moved toward the PWA 14 and as the electrically conductive extender or connector 18 moves from the original position (see FIG. 5) to the articulated position (see FIG. 6). In some cases, the lateral motion may help the contact portion 30 of the electrically conductive extender or connector 18 make a good electrical contact with the metal backing 22 of the electronic component 16. As best shown in FIGS. 2, and 4-6, in some instances, the electrically conductive extender or connector 18 may be mounted to the PWA 14 such that it extends through an opening 25 in the spacer 24.

In instances where the electronic component 16 is a display 32 or other electronic component 16 that may produce heat, the display 32 or other electronic component 16 may be an unintended heat generator, which may heat and/or influence thermistors located at the PWA 14, if such thermistors are present. The spacer 24 may be configured to provide an air gap between the display 32 and the PWA 14 due to its, optional, web-like configuration. The web-like configuration may limit the heat transfer to the PWA 14 from the display 32, while maintaining an overall thin profile of the electronic assembly 10. Further, to prevent direct heat transfer to the thermistors (if present) on the PWA 14 through the material of the spacer 24, the material of the spacer 24 may be cut away in, around and/or over any such thermistors.

The electronic assembly 10 may have internal, unintended heat sources (e.g., the display 32, electronic component on the PWA 14, and/or other unintended heat sources) that may affect the ability of the electronic assembly 10 (e.g., a thermostat as shown in FIGS. 1-43) to accurately sense an ambient temperature. Generally, the internal heat generated by electronic components of the electronic assembly 10 may be related to the input voltage of the electronic assembly 10. In some instances, the input voltage may vary, which may cause the internal temperatures to similarly vary regardless of the actual ambient temperature. Additionally, or alternatively, initial conditions of the electronic device (e.g., before, during, and/or after powering up the electronic device of the electronic assembly 10 or a feature thereof) may affect sensing of the ambient temperature. Illustratively, "powering up" may refer to any time a microprocessor of the electronic assembly 10 comes out of reset or powers on after being powered down (e.g., any time the microprocessor receives power after not receiving power, after an error recover reset, after a self-imposed test, etc.).

An example of when an initial condition may affect sensing of the ambient temperature may include when an electronic device 10 is powered up after it has been in an OFF state for an amount of time such that the whole device may have cooled down/warmed up to the surrounding temperature. On the other hand, if the electronic device is quickly re-powered or re-started, the electronic device may not have cooled down/warmed up from its operating temperature. Further, in some instances, where the electronic device was forced into restarting, the electronic device may not have immediate access to temperature histories and has to start temperature compensation for unintended heat over. All of these considerations may affect the sensing of an ambient temperature and the ability of the electronic assembly 10 to compensate a sensed ambient temperature for unintended heat sources inside of the housing.

A temperature compensation model may be developed for steady state conditions (e.g., when unintended heat within an electronic device reaches a steady state, that is, when the electronic device has been powered on for a period of time post-start up). Further, it has been found that using the temperature compensation model that was developed for steady state conditions to calculate compensated sensed ambient temperatures at initial startup (e.g., during an initial transient period), may result in providing sensed temperatures that represent relatively large errors from the actual ambient temperature.

Illustratively, to increase ambient temperature estimation accuracy and/or for other purposes, the electronic assembly 10 may use a compensation method upon powering up the electronic device (e.g. during a transient power state) that differs from a compensation method used after running the electronic device for a period of time (e.g. during a steady power state). For example, the electronic assembly 10 may be configured to read an input voltage and/or sense other conditions and use the input voltage levels and/or other sensed conditions in temperature compensation models to provide offsets configured to be used to provide calculated compensated ambient temperatures for use by the electronic assembly 10. Other sensed conditions may include, but are not limited to, an amount of time a screen of the thermostat has been lit over a period of time, a signal from one or more thermistors in the housing, a radio activity status, an LED status, and a power level at user interface buttons.

Using two or more temperature compensation models (which may or may not be combined to form a single model) may increase the accuracy of temperature compensation. For example, a first model may be used to accurately resolve or compensate a sensed temperature for initial and/or transient conditions, where this first model may or may not accurately compensate temperatures during steady states, and a second model may be used to accurately resolve or compensate a sensed temperature for steady state conditions (e.g. at a time post powering up), where the second model may or may not accurately compensate temperatures during initial transient conditions. In some instances, the two or more models may be used concurrently, such that the initial model may fade out (e.g. may be weighted less) as time and/or voltage input or other conditions change and the second or further model fades in (e.g. may be weighted more) as time and/or voltage input or other conditions change. Such a combination of compensation models/methods may result in more accurate compensation for sensed temperature calculations under different electronic assembly 10 operating conditions.

It is contemplated that a first "transient" temperature compensation model may be used during any transient period, and not just during an initial power up of the electronic assembly 10. For example, in some cases, the display 32 may consume relatively large amounts of power, and thus generate a relatively large amount of heat, when activated by a user. Moreover, the display 32 may consume a relatively lower amount of power when in a sleep mode. It is contemplated that a first "transient" temperature compensation model may be used during the transient periods, such as for a period after the user activates the display 32 and/or for a period after the display 32 returns to a sleep mode. A second "steady state" temperature compensation model may be used during steady state periods between the transient periods.

Figure 43:
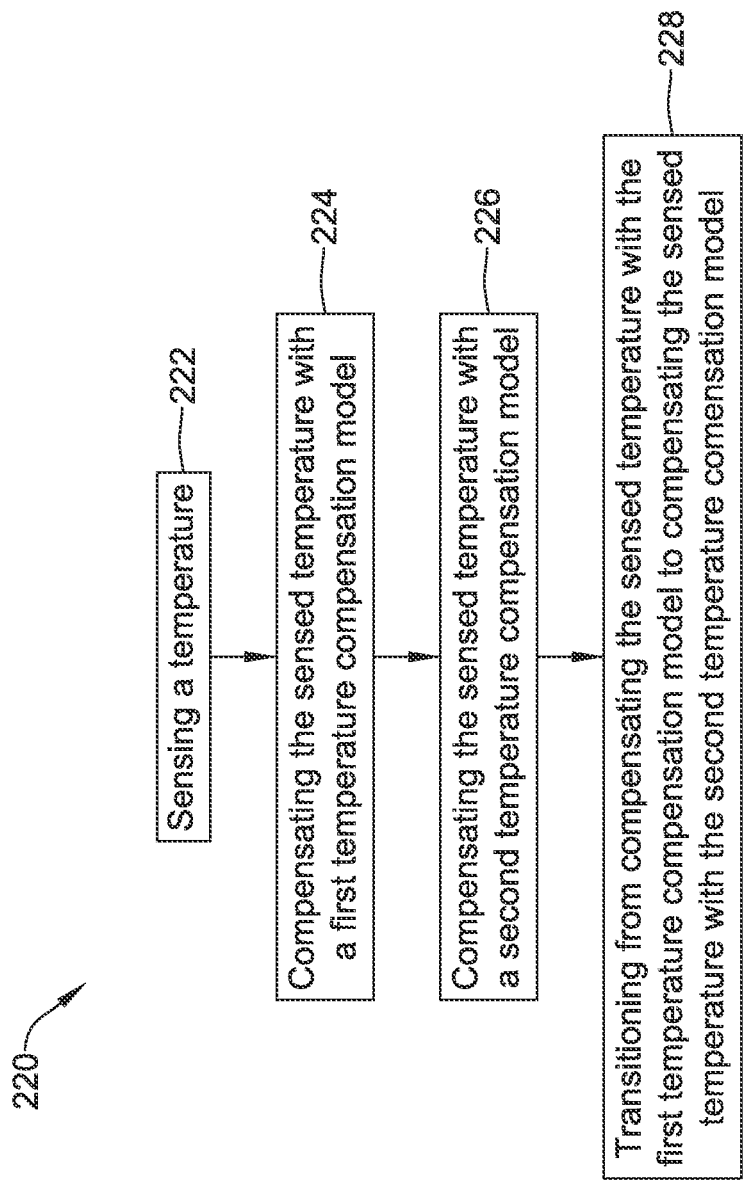
FIG. 43 is a schematic flow diagram of an illustrative method of compensating a sensed temperature.

Illustratively, a method 220, as shown in FIG. 43, may be utilized to compensate a temperature reading of an electronic assembly 10 (e.g., a thermostat, etc.), wherein the electronic assembly 10 may include a housing 12 and one or more temperature sensors for sensing a temperature within the housing 12. In some instances, a processor and/or memory of an electronic assembly may perform compensation of a temperature reading or sensed temperature by the electronic assembly 10.

The method 220 may include sensing 222 a temperature using the one or more temperature sensors of the electronic assembly 10. In the method 220 the sensed temperature may be compensated by a plurality of temperature compensation models. In one example, the sensed temperature may be compensated 224 with a first temperature compensation model and the sensed temperature may be compensated 226 with a second temperature compensation model. During compensation of the sensed temperature, the method 220 may include transitioning 228 through two or more of the plurality of temperature compensation models. In one example, the transitioning 228 may include transitioning from compensating the sensed temperature with the first temperature compensation model to compensating the sensed temperature with the second temperature compensation. In some instances, the transitioning feature 228 of the method 220 may include transitioning over time and/or independent of the sensed temperature and/or any other sensed temperature.

In some instances, weights may be applied to the temperature compensation models to facilitate transitioning from compensating the sensed temperature with the first temperature compensation model to compensating the sensed temperature with the second temperature compensation model. Illustratively, the weighting of the temperature compensation models with respect to one another may be adjusted over time and/or as a function of some other variable. In one example, when the temperature compensation models are weighted with respect to one another and/or over time, the sensed temperature may be compensated with two or more compensation models simultaneously.

In instances when the sensed temperature is compensated by a first temperature compensation model and a second temperature compensation model, weights applied to the temperature compensation models may be adjusted over time such that the first temperature compensation model may be more heavily weighted than the second temperature compensation model near a time of an initial power on of the electronic assembly 10 and the second temperature compensation model may be more heavily weight near a time when the electronic assembly 10 may be reaching a steady state. In one example, a weight that is adjusted over time or that changes over time may be applied to a first temperature compensation model (e.g. an initial condition or transient temperature compensation model), where the weight may have a greater weight at a time of powering up of the electronic assembly 10 than at a time of powering up plus a period of time. Additionally, or alternatively, a weight that is adjusted over time or that changes over time may be applied to a second temperature compensation model (e.g., a steady state temperature compensation model), where the weight may have a greater weight at a time of powering on plus a period of time than at a time of powering on of the electronic assembly 10.

Figure 42:
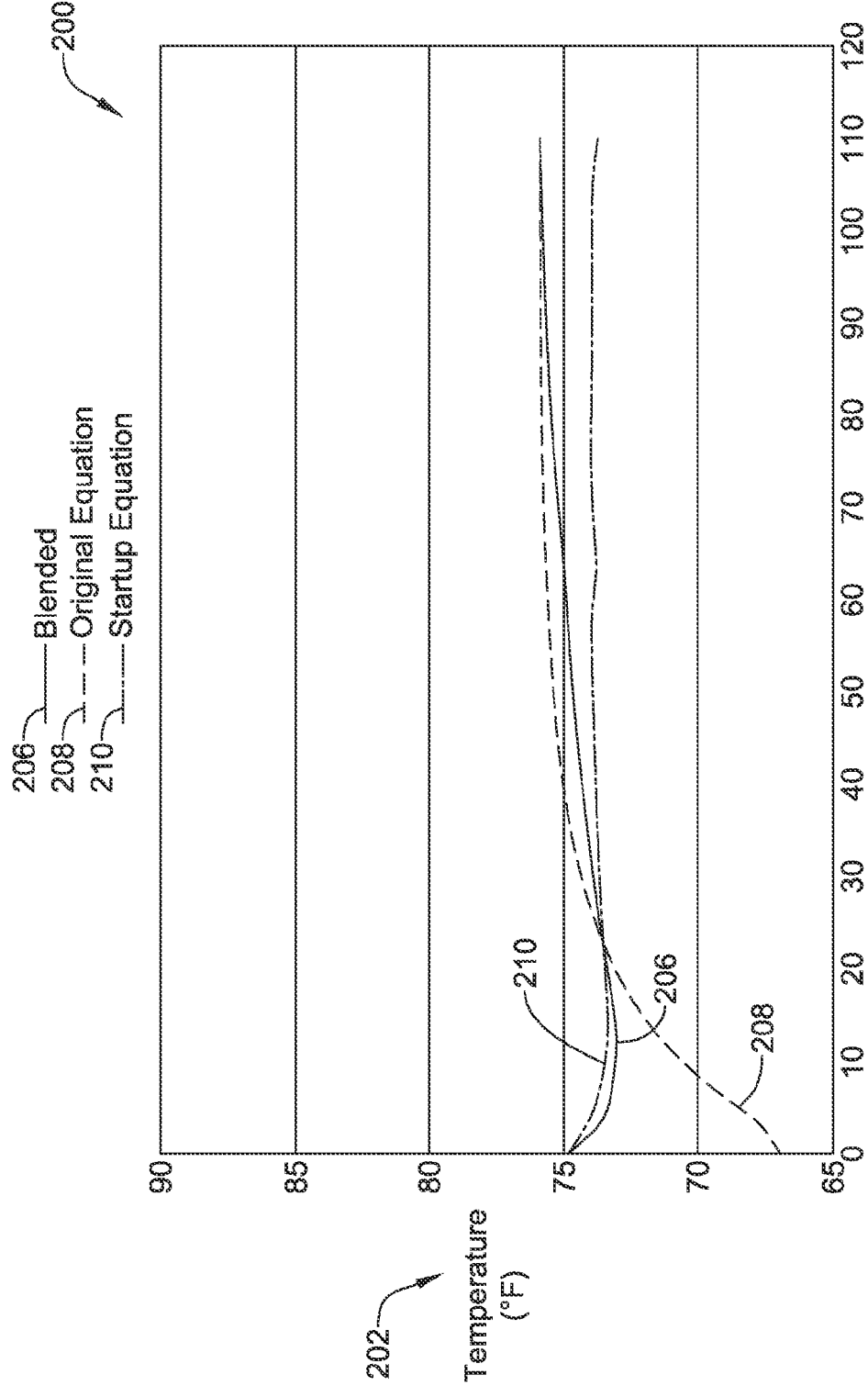
FIG. 42 is a schematic graph depicting an illustrative thermal compensation model over time.

FIG. 42 depicts a schematic graph 200, with temperature 202 on the y-axis and time 204 on the x-axis, of a compensated sensed temperature, where the sensed temperature is compensated with only a first (e.g., a transient, startup, power up, and/or initial) temperature compensation model 210, with only a second (e.g., an original or steady state) temperature compensation model 208, and with a blended temperature compensation model 206 combining the first and second temperature compensation models 210, 208. In FIG. 42, the illustrated temperature from the blended temperature compensation model 206 is a result of weighting the first temperature compensation model 210 and the second temperature compensation model 208 with respect to one another and modifying the weights over time.

In the example of FIG. 42, at time=0 minutes, the weight of the first temperature compensation model 210 is 1 and the weight of the second temperature compensation model 208 is 0, whereas at time=112 minutes the weight of the first temperature compensation model 210 is 0 and the weight of the second temperature compensation model 208 is 1. In this example, a time for the transition from the first temperature compensation model 210 to the second temperature compensation model 208 is one hundred twelve (112) minutes, and in the blended temperature compensation model 206, the weights are linearly transitioned from the first temperature compensation model 210 to the second temperature compensation model 208 over the one hundred twelve (112) minute transition period. Thus, when the blended temperature compensation equation is utilized to compensate a sensed temperature, at time=0 minutes the compensated temperature from the blended temperature compensation model 206 equals the compensated temperature of the first temperature compensation model 210 and the at time=112 minutes the compensated temperature from the blended temperature compensation model 206 equals the compensated temperature of the second temperature compensation model 208.

The temperature compensation models may be weighted with respect to one another as a function of time and the weights may be adjusted over time in any manner to facilitate transitioning from one temperature compensation model to another temperature compensation model. In one instance, as in the example shown in FIG. 42, the weights applied to the temperature compensation models may be adjusted linearly over a set period of time (e.g., a set transition period of time). Alternatively, or in addition, transitioning from one temperature compensation model to another temperature compensation model over time may be accomplished by adjusting the weights associated with the temperature compensation models in a non-linear manner over a time period.

In one illustrative example of compensating a sensed temperature, an equation or function may be utilized to transition from a first temperature compensation model, $F_{first}$, (e.g. an initial condition or transient temperature compensation model) to a second temperature compensation model, $F_{second}$, (e.g., a steady state temperature compensation model). The equation may comprise:

$$Temp_{comp}=F_{blend}(TIME)=((T-TIME)/T)*F_{first}+(TIME/T)*F_{second}$$

wherein:
T=time of transition (e.g., a predetermined time of transition, which may be determined for a particular electronic assembly 10 or other time of transition) from initial power up of the electronic assembly to steady state of the electronic assembly;
TIME=the time from initial power up, where TIME=0;
$F_{first}$=function of the first temperature compensation model (e.g., a temperature compensation model based on multiple input sources that may be configured to compensate a sensed temperature during a variety of electronic assembly 10 startup or power up conditions);
$F_{second}$=function of the second temperature compensation model (e.g., a temperature compensation model based on multiple input sources that may be configured to compensate a sensed temperature at steady state conditions of the electronic assembly 10);
$F_{blend}$=Function resulting in a compensated sensed temperature at a time=TIME; and
$Temp_{comp}$=compensated temperature for a sensed temperature.

Such an illustrative equation may allow the weights associated with the first and second temperature compensation models to be adjusted over time (e.g., linearly adjusted over time) to provide an accurate compensated sensed temperature for the purpose of accounting for unintended heat sources and/or conditions. The multiple inputs or variables may include, but are not limited to, a voltage level at the thermostat, an amount of time a screen of the thermostat has been lit over a period of time, a signal from one or more thermistors in the housing, a radio activity status, an LED status, a power level at user interface buttons, and/or any other variable or input that may affect the temperature at an electronic assembly 10.

Although weighting of temperature compensation models is primarily discussed herein with respect to weighting over time in a linear manner, it is contemplated other adjustments of weights of the temperature compensation models may be utilized. For example, the weights may be applied to the temperature compensation models on a non-linear basis (e.g., on an exponential or other basis), such that the weights are adjusted slowly over time at times near the startup and near the steady state of the electronic assembly 10, but the weights are adjusted relatively rapidly in between times near startup and times near steady state of the electronic assembly 10. Alternatively, the weights may be applied to the temperature compensation models such that the weights are adjusted rapidly over time at times near the startup and near the steady state of the electronic assembly 10, the weights are adjusted relatively slowly in between times near startup and times near steady state of the electronic assembly 10.

Figure 13:
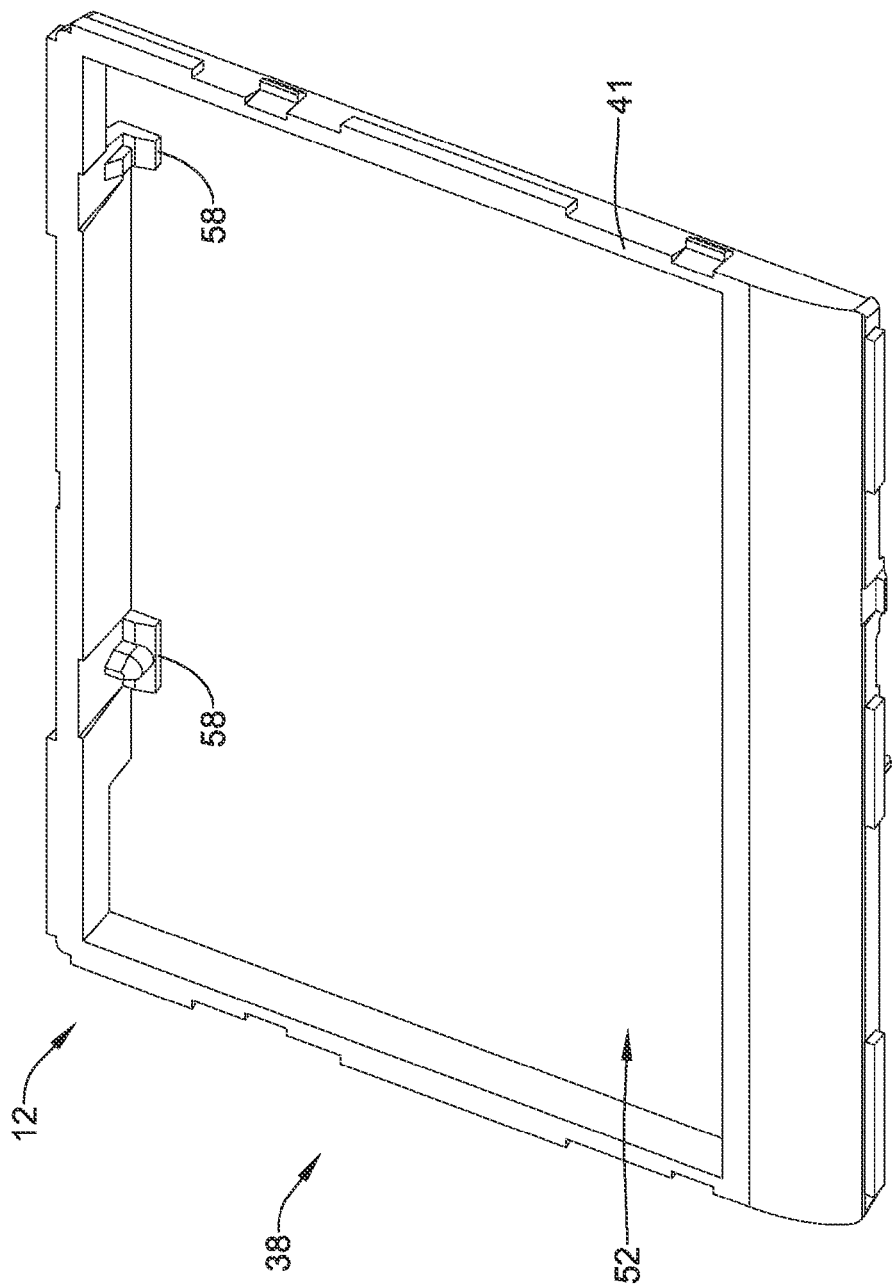
FIG. 13 is a schematic perspective view of an illustrative front cover of an electronic assembly.
Figure 14:
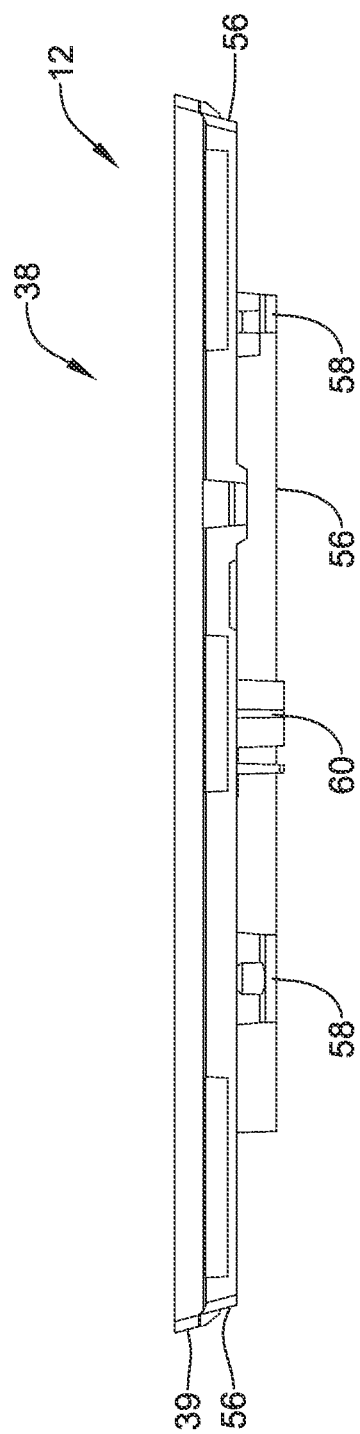
FIG. 14 is a schematic side view of the illustrative front cover of FIG. 13.
Figure 15:
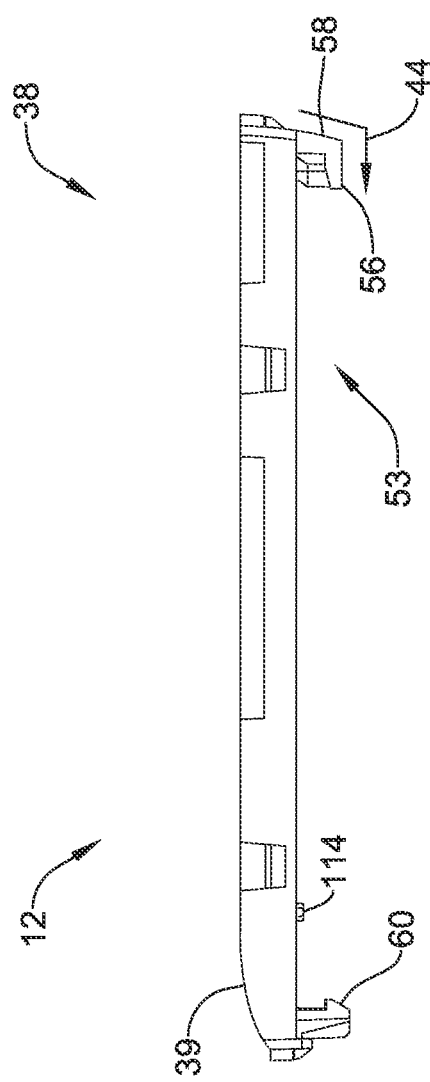
FIG. 15 is a further schematic side view of the illustrative front cover of FIG. 13.

Referring now to FIG. 13, the housing 12 may have a front cover 38. In the example shown, the front cover 38 may generally be a frame for receiving an electronic component (e.g., a touch screen component or other component or device) and may have an opening 52 extending therethrough, as best shown in FIGS. 13-15, 17, and 21. In some instances, the front cover 38 may include one or more front cover walls 56, where the front cover walls 56 may be configured to mate with surfaces of a back cover 36 of the housing 12 and/or the spacer 24, as shown in for example FIGS. 16A and 16B. Similar to the spacer walls 42, the front cover walls 56 may help define an ESD path 44 for the ESD events, as seen in FIG. 15, which may enter the housing 12 through a gap in the housing 12 at a parting line 40 or at any other location.

It is known that ESDs travel through a medium or travel along surfaces by following the shortest possible ESD path 44 with the least resistance when discharged from a user or other device or source. A parting line between portions of the housing of an electronic device may be a suitable inlet through which ESD may travel to the inside of the electronic device. For example, where the front cover 38 and the back cover 36 of the housing 12 meet, a parting line 40 may be formed, as best shown in FIGS. 16A and 16B, and it has been found that ESDs may travel to the inside of the electronic assembly 10 through this parting line 40.

During testing, it was determined that ESDs may carry voltage of up to about 15 kilovolts (kV) or more (although, voltage of an ESD may vary greatly), which is a relatively high voltage. Generally, the electric breakdown strength of dry air in substantially ideal conditions is approximate 3 kV/millimeter (mm). This means that in ideal conditions, a gap having a distance greater than 5 mm is needed to prevent a discharge directly from an electronic component 16 to the PWA 14. In some instances, the ESD may not dissipate as expected due to materials (e.g., mating walls, dirt, humidity) or other factors slowing the dissipation of the ESD and thus, the ESD may travel farther than it is expected to travel in ideal conditions.

As a result of ESDs traveling farther than they would be expected to travel in ideal conditions, it is desirable to extend the ESDs' path of least resistance with the goal of the ESD dissipating prior to it reaching any electronic components of the electronic assembly 10. As shown in FIGS. 16A and 16B, the parting line 40, which may provide an avenue through which ESDs make their path to an interior of the of the electronic assembly 10 to the closest electrically sensitive area, may be extended a distance by the placement of the mating walls of the electronic assembly (e.g., the front cover 38, the back cover 36, and the spacer walls 42 of spacer 24).

For example, the spacer 24 may be positioned within the housing 12, such that the spacer 24 contacts the front cover 38 and the back cover 36. Such positioning of the mating surfaces may extend the distance the ESD must travel to contact an electrically sensitive area within the housing 12 to a distance equal to a length of protective walls 56 of the front cover 38 starting at a gap at an outer surface of the housing 12 between the front cover 38 and the back cover 36 plus a length of the spacer walls 42. In some illustrative instances, the extended distance the ESD may have to travel to an electrically sensitive area may be set at least 5 mm, at least 8 mm, at least 10 mm, or other distances of travel greater than 10 mm.

In some instances, and as disclosed further herein, the spacer 24 may be situated between the electronic component 16 and the PWA 14, and in some cases, may engage both the facing surfaces of the electronic component 16 and the PWA 14. When the spacer 24 is situated between the electronic component 16 and the PWA 14, a component on the PWA 14 may extend through an opening 25 in the spacer 24. For example, the electrically conductive extender or connector 18 extending from the PWA 14 may extend through an opening 25 in the spacer 24, as shown in FIGS. 2, 5 and 6. In one example, the electrically conductive extender or connector 18 may extend from the PWA 14, through an opening 25 in the spacer 24, and may mechanically engage and electrically connect to the metal backing 22 of the electronic component 16, as best shown in FIG. 6.

In some instances, the front cover walls 56 of the front cover 38 may be configured to engage and/or align other features of the electronic assembly 10. For example, wall extensions 58 may extend from the front cover walls 56 or other portions of the front cover 38 and interact with the PWA 14 or other feature to align the PWA 14 within housing 12, and in some cases, to at least partially secure the PWA 14 within the front cover 38. Additionally, or alternatively, a clip 60 of the front cover 38 may extend from a base 39 of the front cover 38 and optionally engage and/or align the PWA with the front cover 38. Further, in some instances, the front cover walls 56 may have beveled or chamfered outside edges (e.g. beveled or chamfered vertical edges when the electronic assembly 10 is attached to a wall structure), as shown in FIG. 15) that may engage and/or abut mating chamfered or beveled walls of the back cover 36, as shown in FIGS. 16A and 16B.

Figure 24:
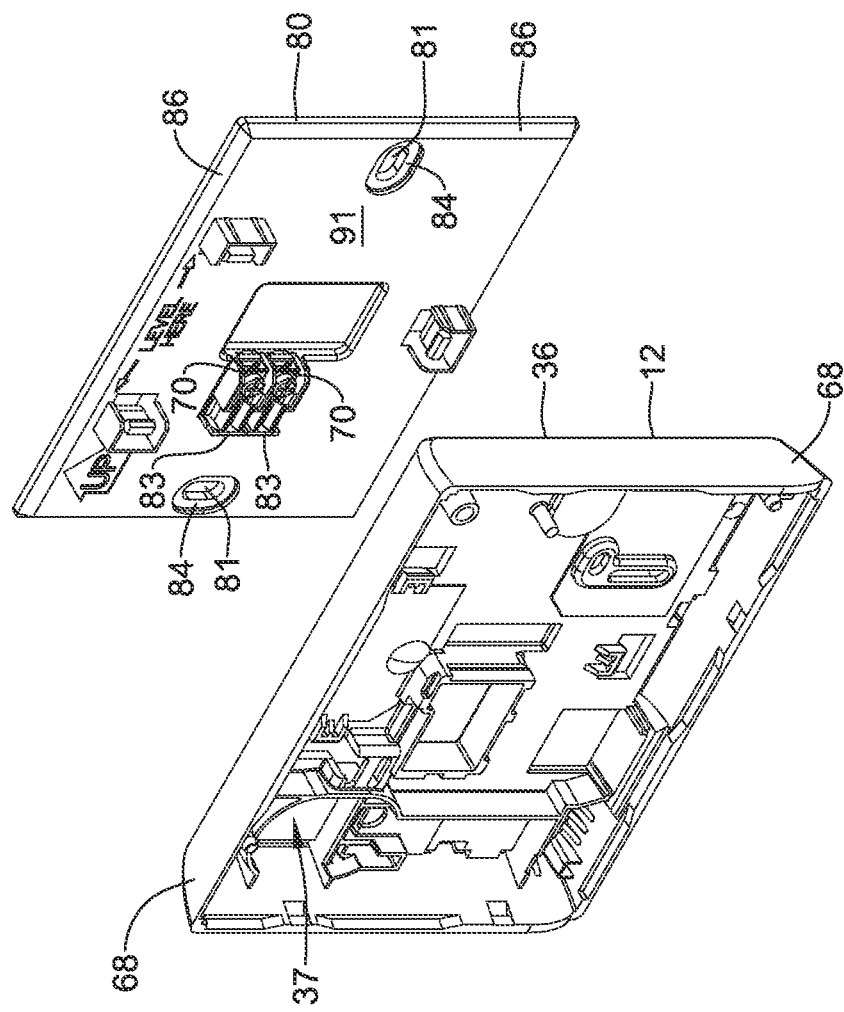
FIG. 24 is a schematic front perspective view of an illustrative back cover and wall plate of an illustrative electronic assembly.
Figure 25:
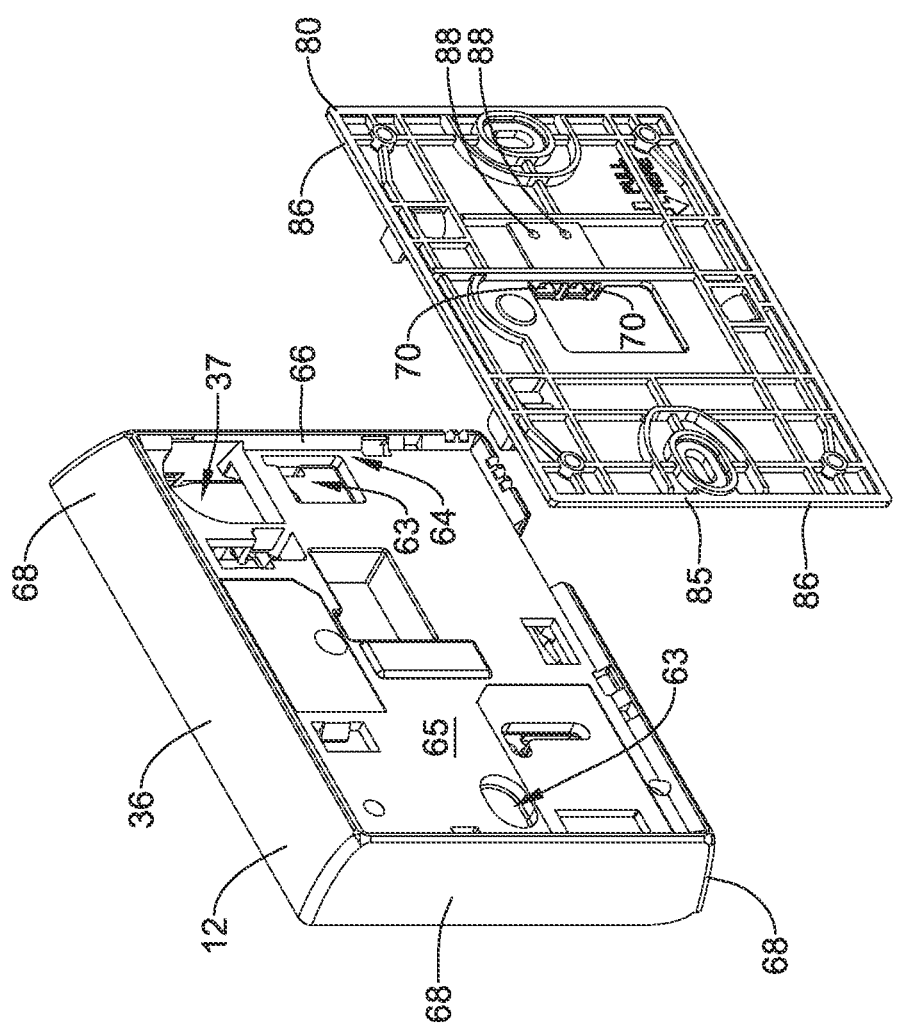
FIG. 25 is a schematic exploded back perspective view of an illustrative back cover and wall plate of an illustrative electronic assembly.

Generally, the features of the electronic assembly 10 may be configured to give the electronic assembly 10 a slimming look and a thin or minimalist configuration. In some instances, and as best shown in FIGS. 24-25, one or more terminal blocks 70 that may receive electrical wiring configured to connect power and/or control signals to the electronic assembly 10 may be positioned on a wall plate 80 and recessed into the housing 12 so as to not extend the profile of the electronic assembly 10 away from the wall. Despite being designed to create a thin profile, the electronic assembly 10 may be configured to allow plastic material to surround all electronics of the electronic assembly 10 and prevent substantially all of the electronics from being seen by a user from outside of the electronic assembly 10.

In some instances where the electronic component 16 may be or may include a display 32 (e.g., a liquid crystal display (LCD) or other display, where the display 32 may be a color display or other display), the front cover 38 may be or may include a display holder (e.g., an LCD display holder or other display holder). In such instances, and possibly other instances, the electronic assembly's 10 foot print and/or components may be configured around the size of the display 32. For example, the display 32 may include a display having an approximate diagonal D of 4.3 inches with a height H of approximately 3 inches and a width W of approximate 4 inches, as best shown FIG. 19. The display 32 of the electronic component 16 may have other dimensions, as desired.

In some examples, where the size of the display 32 is approximately 4.3 inches diagonal (approximately 4 inches wide and 3 inches tall), the PCB 34 of the PWA 14 may be slightly taller than three inches. This extra length of the PCB 34 may accommodate an antenna (e.g., a Wifi antenna or other antenna) that would otherwise be shielded or blocked by metal backing 22 of the electronic component 16 (e.g. display 32). As a result, the base size of the PCB 34 may be approximately 4 inches wide and 3.35 inches tall, and all of the electronics may be consolidated and/or packaged close together to fit within this footprint. Additionally, or alternatively, the electronics may be packaged along with the display 32, which may allow the device to have a thin profile.

Further, the opening 52 of the front cover 38 may be sized to allow a user to view and/or interact with the display 32 or other electronic component 16, while protecting the electronic component 16. For example, the opening 52 in the front cover 38 may be sized to allow free access to a touch pad of the electronic component 16, sized to cover the visual area viewing angles, sized to protect the PWA against contamination, sized to prevent the cover from interacting with an active touch pad area of the electronic component 16, and and/or sized for any other purpose.

Figure 21:
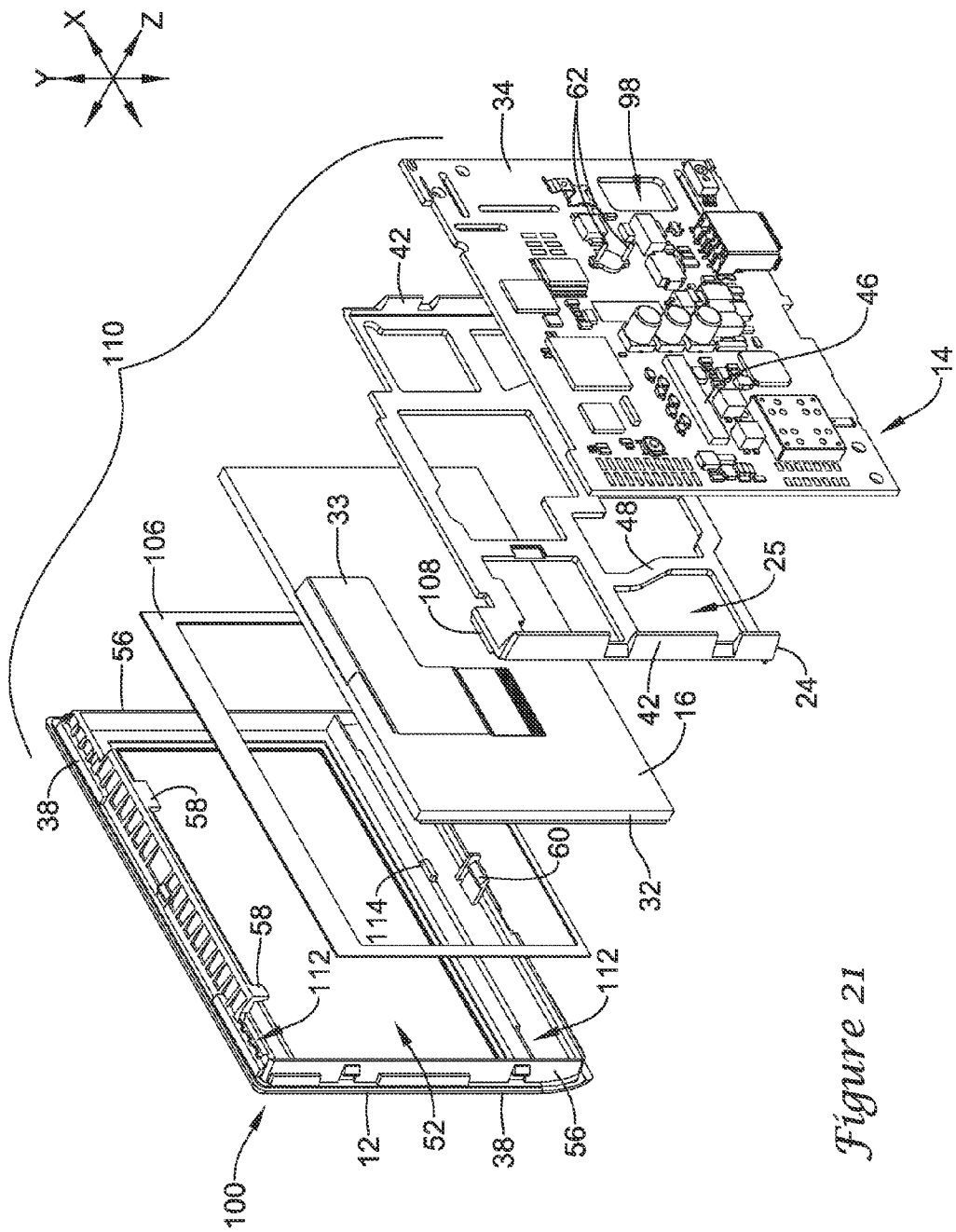
FIG. 21 is a schematic exploded perspective view of an illustrative front cover, gasket and electronic component of the illustrative electronic assembly of FIG. 17.
Figure 22:
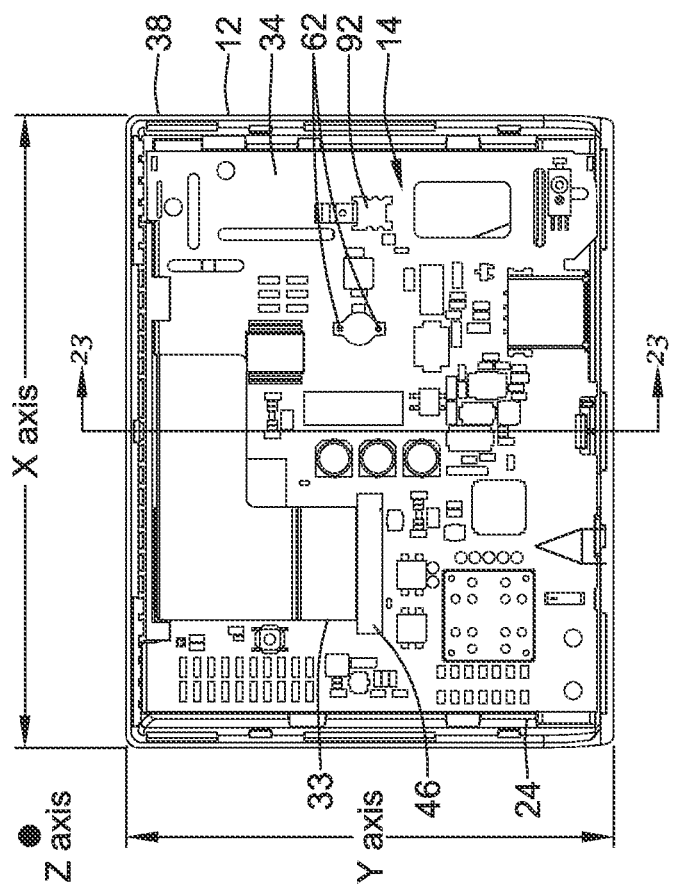
FIG. 22 is a schematic back view of the illustrative electronic assembly of FIG. 17.
Figure 23:
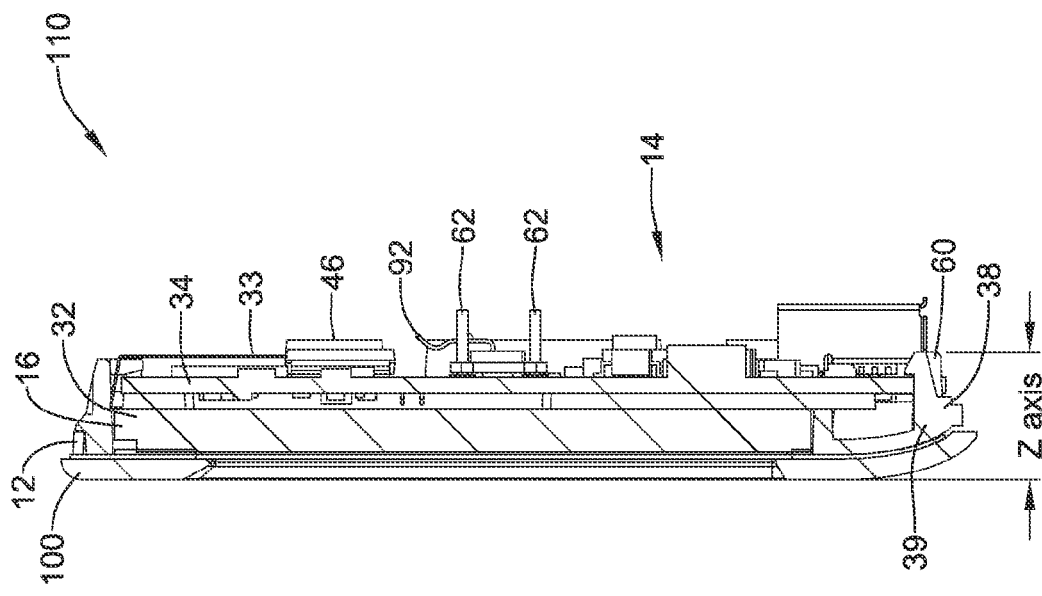
FIG. 23 is a schematic cross-sectional view of the illustrative electronic assembly of FIG. 22, taken along line 23-23.

In some illustrative instances, the front cover 38 may be configured to accept the electronic component in the X and Y directions, as shown in FIGS. 21-23, in a tight to loose fit. In the Z direction, the fit may be tight to prevent the electronic component 16 from rattling while a user interacts with the electronic assembly 10. Such a tight fit in the Z direction may be facilitated by using the gasket 106, which may compress to fill any extra space resulting from manufacturing tolerances of the front cover wall 56 and the front cover 38.

Figure 17:
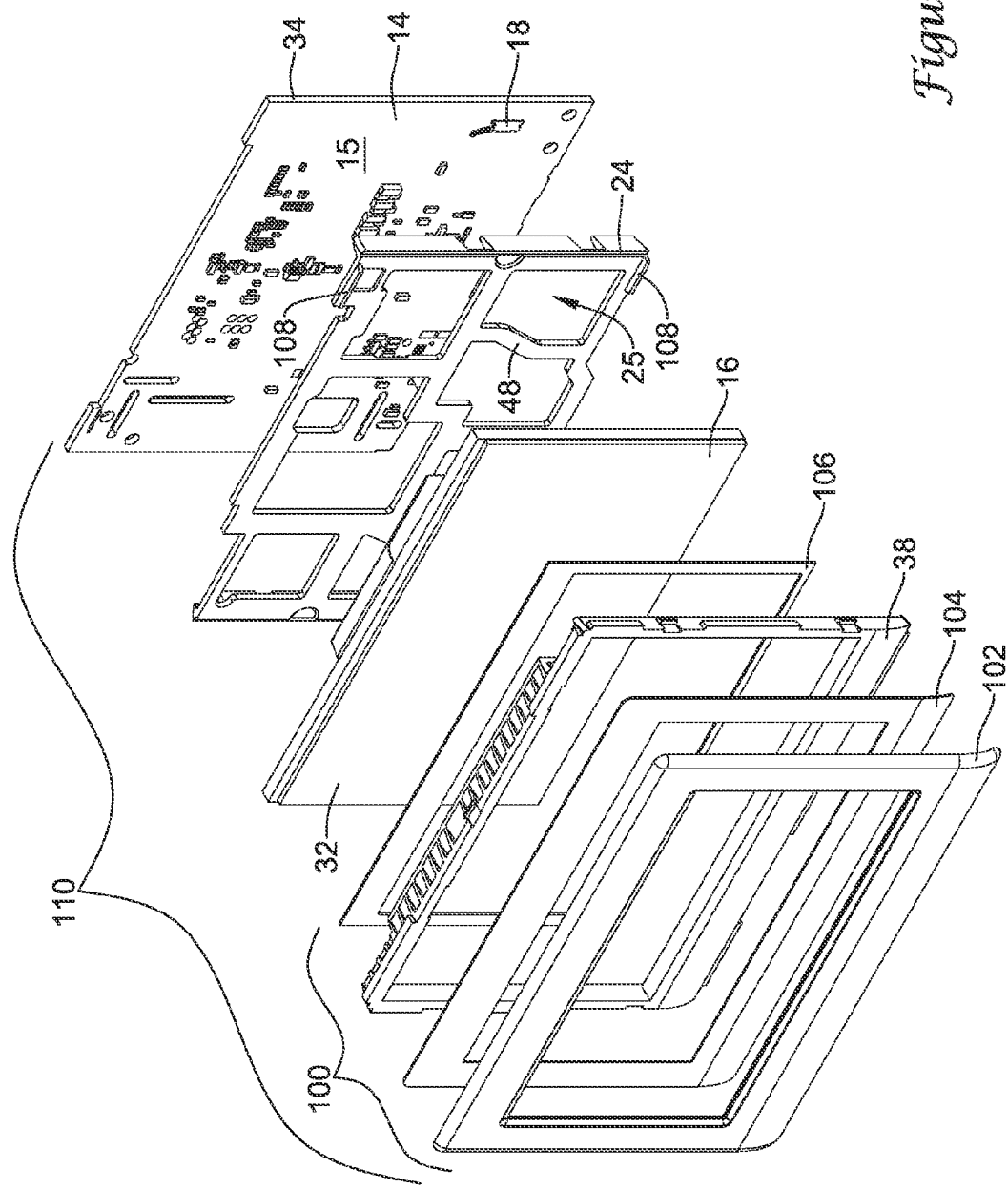
FIG. 17 is a schematic exploded perspective front view of an illustrative front cover, gasket, electronic component, spacer, and printed wiring assembly of an illustrative electronic assembly.
Figure 18:
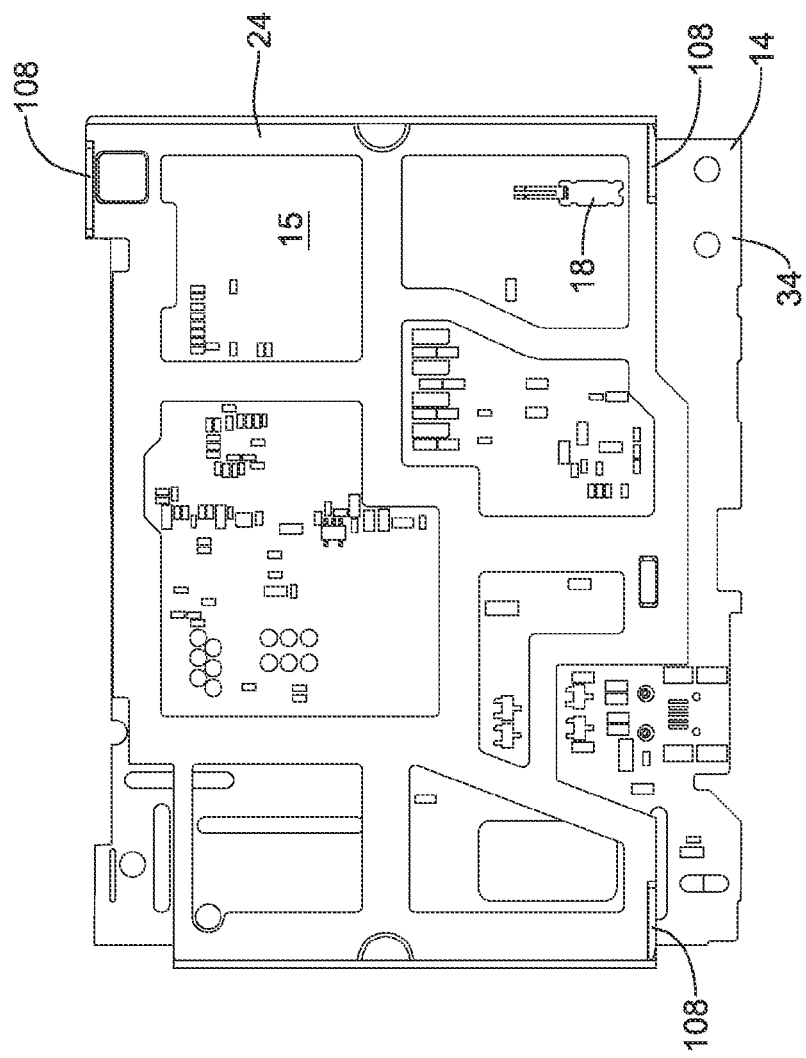
FIG. 18 is a schematic front view of an illustrative spacer engaged with an illustrative printed wiring assembly of an illustrative electronic assembly.

In some instances, the front cover 38 may have a bezel formed at least partially from the base 39 that wraps around the product and which may allow a user to contact the electronic assembly 10 without interacting with the electronic component 16 (e.g., the display 32). Further, the front cover 38 may be a front window assembly (FWA) front cover 100 of the housing 12, as best shown in FIG. 17. The FWA front cover 100 may operate like a rigid display 32 and PWA 14 holder, such that the FWA front cover 100, the display 32 and the PWA 14 may be placed in the final electronic assembly 10 as a single sub-assembly 110.

The FWA front cover 100 may be made from a front window 102, adhesive layer 104, front cover 38 (e.g., a display holder), and gasket 106 (e.g., a sealing gasket or other gasket), as best shown in FIG. 17-20. These parts may be supplied to an assembly line as a single part, separate parts, or a combination of single parts and combined parts, as desired.

Figure 19:
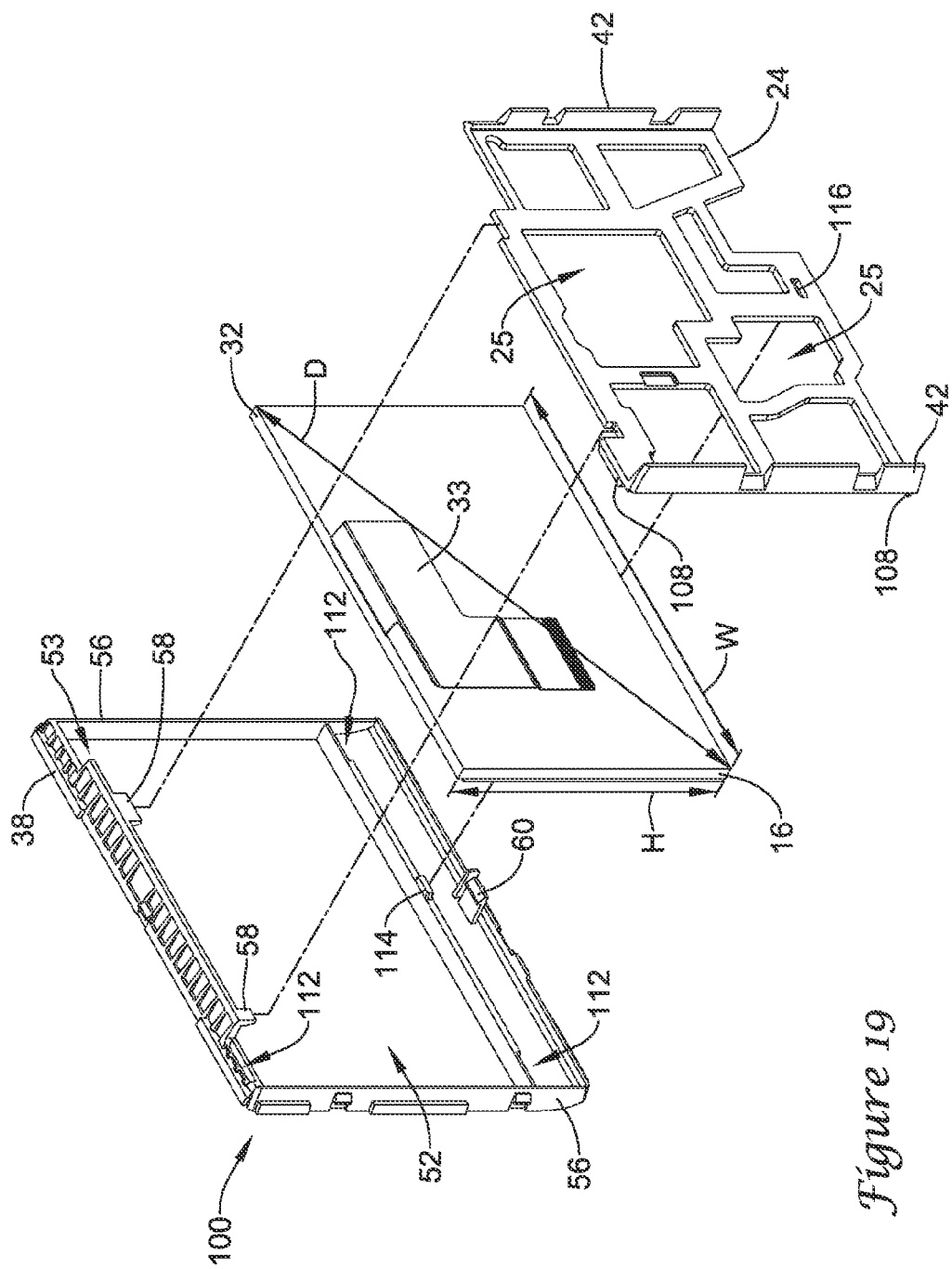
FIG. 19 is a schematic exploded perspective back view of an illustrative front cover, electronic component, and spacer of the illustrative electronic assembly of FIG. 17.

The front cover 38 or display holder may include a recess 53 for receiving at least part of the display 32 (see, FIG. 19). When the front cover 38 or display holder receives the display 32, the gasket 106 may be positioned between the front cover 38 and the display 32 (e.g., the front side of the display 32). The display 32 may be placed within the front cover 38 of the FWA front cover 100 through the recess 53 of the front cover 38 or display holder such that the front cover or display holder may extend adjacent part of the front side of the display 32 and adjacent at least part of the side walls of the display 32.

Figure 20:
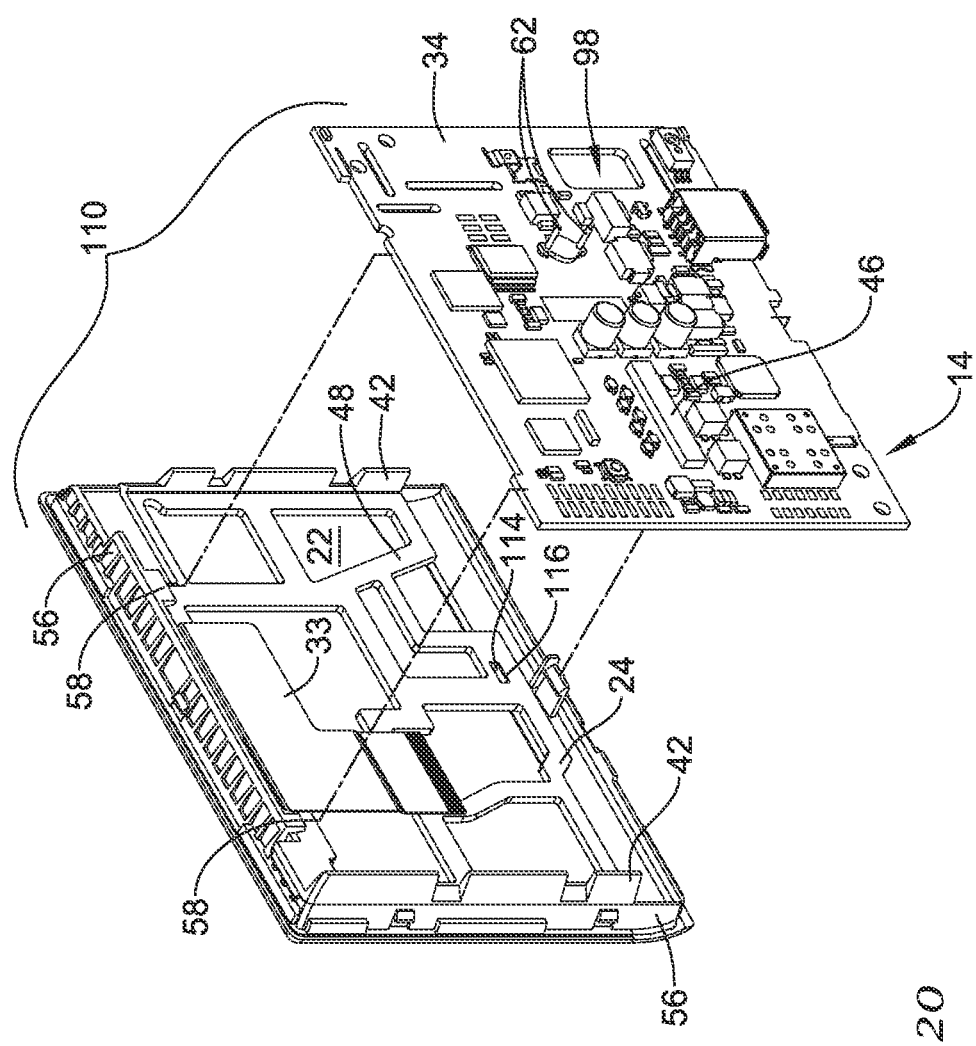
FIG. 20 is a schematic partially exploded view of an illustrative printed wiring assembly exploded from an illustrative front cover, electronic device, and spacer of the illustrative electronic assembly of FIG. 17.

The spacer 24 may be positioned adjacent the display 32, and the sub-assembly 110 may be closed by adding the PWA 14 adjacent to the spacer 24 and securing the PWA 14 to the front cover 38 or display holder adjacent the back side of the display 32 (see, FIG. 20). Such a configuration may sandwich the display 32 between the front cover 38 or the display holder and the PCB 34 of the PWA 14. The term "sandwich" or "sandwiched", as used herein, means positioned between or positioned in any other similar position.

The PCB 34 of the PWA 14 may include a front side configured to face the front cover 38 or display holder and/or the display 32, a back side opposite the front side, and side walls extending between the front side and the back side. The spacer 24 may have spacer side walls 42 that, when the spacer 24 is positioned between the PCB 34 and the display 32, may extend adjacent to at least part of the side walls of the PCB 34 and/or beyond the back side of the PCB 34, when desired.

In some instances, the display 32, spacer 24, and PWA 14 may be held in position in the sub-assembly 110 with one or more features of the front cover 38 or display holder, such as one or more hinges or wall extensions 58 (e.g., releasable hinges or wall extensions), one or more latches or clips 60 extending from the base 39 of the front cover 38, and/or one or more other features. In one instance, the one or more features of the front cover 38 or display holder may be configured to sandwich the display 32 and the spacer between the front cover 38 or display holder and the PCB 34 of the PWA 14. Alternatively, or additionally, the hinges or wall extensions 58 of the front cover 38 or display holder may hinge the PCB 34 of the PWA 14 with respect to the front cover 38 or display holder until the latch(es) or clip(s) 60 latch or clip the PCB 34 of the PWA 14 relative to the front cover 38 or display holder. Further, the sub-assembly 110 may be configured such that a flex tail 33 of the display 32 may be inserted into a connector 46 on the PWA 14, as best shown in FIG. 23, to place the PWA 14 and the PCB 34 thereof in electrical communication with the display 32.

As discussed, the front cover 38 may receive the display 32 therein. In some instances, the display 32 (e.g., the front of the display) may rest against the gasket 106 within the front cover 38. The gasket 106 may have several purposes. For example, the gasket 106 may prevent liquid from getting into the electronic assembly 10, the gasket 106 may help create a tighter fit for the components of the electronic assembly 10, the gasket 106 may help prevent ESDs from entering the electronic assembly 10, etc.

In some instances, the spacer 24 and the front cover 38 or display holder may be mating components and may contain several positioning features that do not allow an operator to assemble them in an incorrect orientation. These orientation features include, but are not limited to: ribs 108 in the spacer 24 configured to engage pockets 112 in the front cover 38 or display holder to assist or help in aligning the spacer 24 with the front cover 38 or display holder; grooves in the edges of the spacer 24 and/or the front cover 38; an alignment feature 114 (e.g., a rib, a pin, or other alignment feature) of the front cover 38 or display holder configured to engage an alignment feature 116 (e.g., a pocket, a pin hole, or other alignment feature) in the spacer 24 to align the spacer and the front cover or the display holder, as best shown in FIG. 19; and/or other positioning features used in any uncombined or combined manner, as desired. In addition to facilitating the proper alignment of the front cover 38 and the spacer 24, the positioning features may help prevent the spacer 24 from moving until the PWA 14 is assembled and the sub-assembly 110 may be fully assembled and locked together.

In some instances, the electronic assembly 10 may be at least partially powered with a battery 90 (e.g., a coin cell battery or other battery). Illustratively, to structurally facilitate use of the battery 90, the back cover 36 may have a pocket, an opening, or an aperture 37 configured to receive the battery 90, as seen in FIG. 29. The pocket, opening, or aperture 37 may be at least partially defined by walls 130 of the housing 12 (e.g., walls 130*c* shown in FIGS. 27-28). Through the pocket, opening, or aperture 37, the battery 90 may be installed directly on a surface of the PCB 34 or other connection with the PWA 14. As shown in FIG. 27, walls 130*c* may at least partially form a recess 43 for receiving the battery 90 inserted through the pocket, opening, or aperture 37, where the recess 43 and/or the walls 130*c* may limit access to electrical terminals of the PCB 34 from outside or exterior the housing 12.

An illustrative method of using the battery 90 with the electronic assembly 10 may include inserting the battery 90 through the pocket, opening, or aperture 37 in the back cover 36 of the housing 12. Once the battery 90 has been placed in the back cover 36, it may be positioned against the PCB 34 within the housing 12 and slid down (e.g., in a lateral direction) to the recess 43 in the housing 12 and/or to a battery seat region 35 (see, for example, FIG. 29) having electrical terminals for electrically connecting the battery 90 to the PCB 34 when the coin cell battery is place in the battery seat region 35. In addition to or as an alternative to being electrically connected to the PCB 34, the battery 90 may be removably secured to the PCB 34 when the battery 90 is at least partially positioned on the battery seat region 35.

The battery 90 may extend along a primary plane and when the battery is positioned in the battery seat region 35, the primary plane of the battery 90 may be substantially parallel to a surface (e.g., a main or major surface 34*a*, as shown in FIG. 29) of the PCB 34. The battery seat region 35 may at least partially overlap with and/or may be at least partially offset (e.g., laterally offset) from the pocket, opening, or aperture 37, but the battery 90 may be accessible therethrough when positioned at the battery seat region 35. In some instances, the battery 90 may be at least partially (e.g., a minor portion that may be less than half of the battery 90, a major portion that may be half or more of the battery 90, or other portion of the battery 90) covered and/or protected by the housing 12 when it is positioned within the battery seat region 35.

In some cases, the battery 90 may be held in place on the PCB 34 by a battery holder 92 (e.g., an electrical terminal on the PCB 34) having a contact and affixed to the PCB 34 and/or the back cover 36 (see, FIGS. 29, 32-33). In one example, a negative contact or electrical terminal may be located at the battery seat region 35 of the PCB 34 and a positive contact or electrical terminal may be formed adjacent (e.g., over or otherwise adjacent) the battery seat region 35 of the PCB 34 with the battery holder 92. Alternatively, the contact polarity may be switched.

The battery holder 92 may include a mounting portion or mounting region 92*a* for mounting to the PCB 34 at or adjacent the battery seat region 35 (see FIGS. 32-33). Additionally, or alternatively, the battery holder 92 may include an elongated spring region that may extend over and/or electrically contact a battery 90 positioned at least partially on or adjacent the battery seat region 35. In one illustrative example, as shown in FIGS. 32 and 33, the battery holder 92 may be a Z-shaped electrical terminal, but this is not required.

The battery holder 92 may be an electrical terminal for the battery 90 and may be made from electrically conductive material. For example, the battery holder 92 may be made from sheet metal and bent or otherwise formed to the desired shape (e.g., Z-shape or other shape) and may be configured to contact a positive (or alternatively, a negative side of the battery 90). The battery holder 92 may be flexible enough to allow for battery 90 insertion and/or removal, while still applying pressure on the battery 90 with a required force to help assure proper electrical contact and maintaining the battery 90 at its position with friction forces or other forces.

Further, the battery holder 92 may be protected from excessive loads by the surrounding material (e.g., plastic material) of the housing 12.

When the battery 90 is correctly installed at the battery seat region 35, the force from the battery holder 92 and gravity (e.g., when the electronic assembly 10 is mounted on a wall or other at least partially vertical structure) may help assure that the battery maintains good electrical contact with the connection on the PCB 34 and will remain in its desired position during handling of the electronic assembly 10. Such design for battery 90 insertion into and removal from the electronic assembly 10 may simplify the assembly process because the battery may be delivered as a separate part and installed at an area where the electronic assembly 10 will be used as opposed to at a manufacturer or offsite. Additionally, or alternatively, the configuration of the electronic assembly for battery 90 insertion may facilitate placing and maintaining the battery 90 within the housing 12 without adjusting any part of the housing 12.

Figure 30:
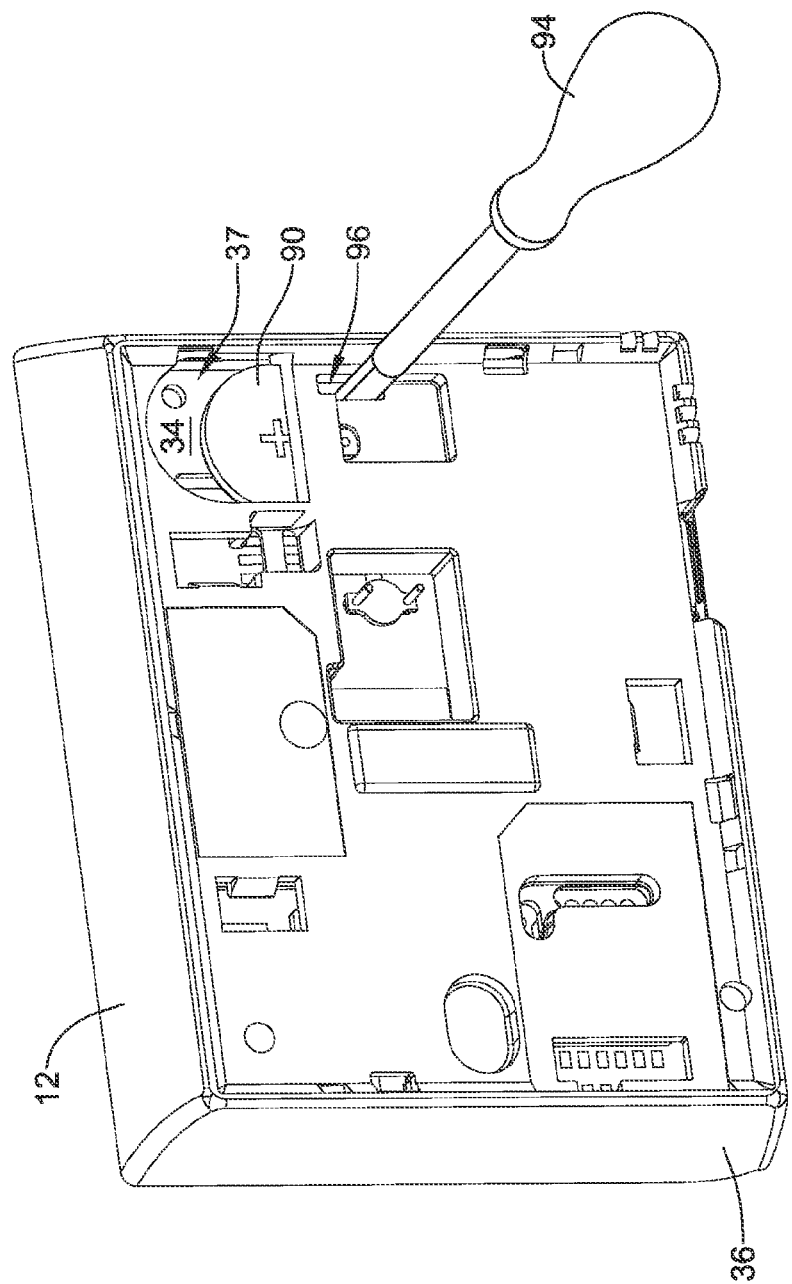
FIG. 30 is a schematic perspective view of an illustrative electronic assembly with a tool inserted therein.

In the illustrative method of using the battery 90 discussed above, the battery 90 may be removed by a user with the assistance of a screwdriver 94 or other tool, as best shown in FIGS. 30 and 31, or in any other manner. For example, a user may insert the screwdriver 94 or other tool into a slot 96 in the back cover 36 of the housing 12. The slot 96 may be configured to expose a portion of the battery 90 (e.g., an edge of the battery 90 when the battery 90 is positioned in the battery seat region 35). The screwdriver 94 may be slid up along the slot 96 to push the battery 90 from below, which may cause the battery 90 to slide up and laterally out from the battery seat region 35 and/or the battery holder 92 toward the pocket, opening, or aperture 37 in the back cover 36 for removal through the pocket, opening, or aperture 37 from the housing 12 by hand or other tool.

In some instances, the slot 96 may be configured for a particular tool. For example, the slot may be an elongated slot and may be configured to receive a flat head screw drive. Alternatively, or additionally, other slot dimensions may be utilized for the slot 96 to accommodate a variety of tools.

Generally, there may be limited risk of the battery 90 shorting when removed with the tool or screwdriver 94 because the slot 96 may not allow the screwdriver 94 or other tool to touch the positive and negative battery contacts simultaneously. Additionally, or alternatively, the risk of shorting the PWA 14 may be limited by not locating conductive traces and electrical components on the PWA 14 near the slot 96, so that the screwdriver 94 or tool may not contact any conductive traces and/or electrical components.

Figure 28:
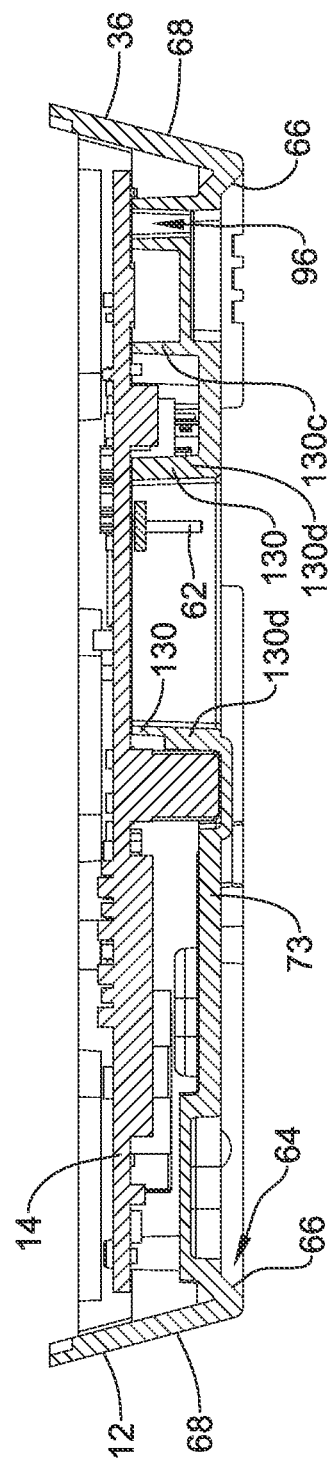
FIG. 28 is a schematic cross-sectional view of an illustrative PWA and a back cover of an illustrative electronic assembly.
Figure 29:
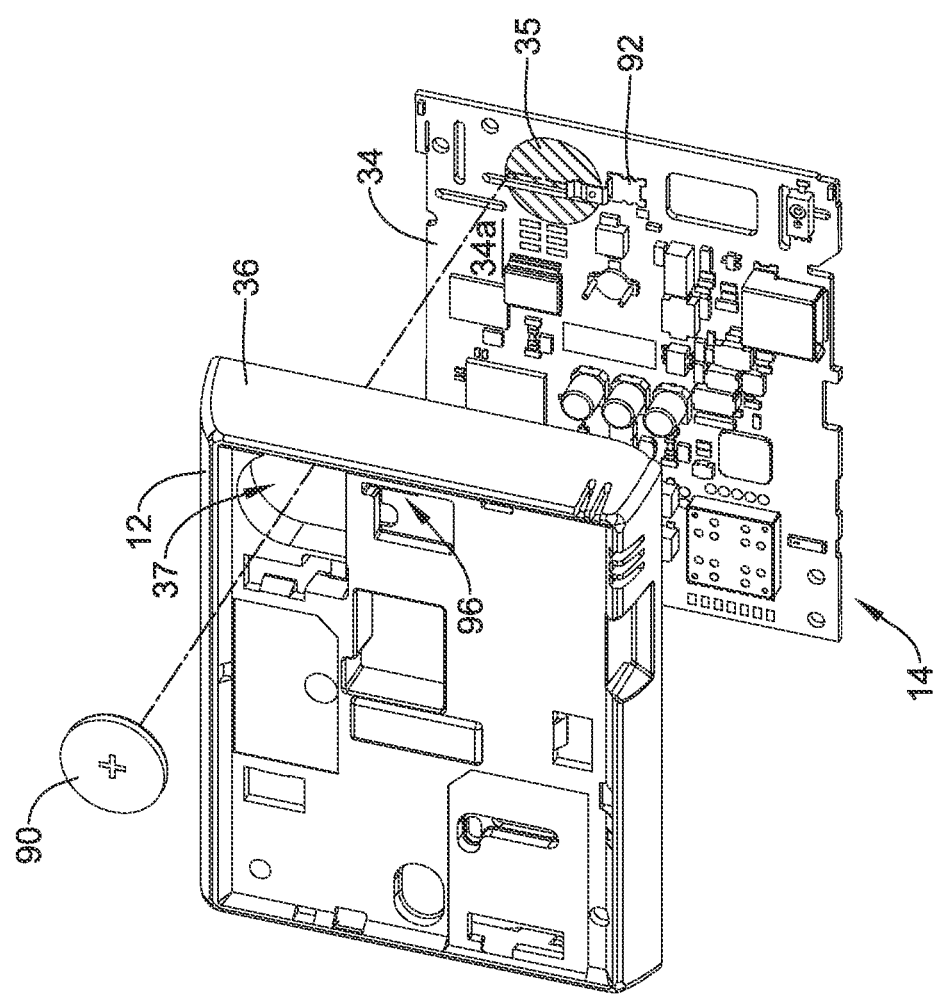
FIG. 29 is a schematic exploded perspective view of an illustrative back cover, printed wiring assembly, and battery of an illustrative electronic assembly.

Turning now to FIGS. 27 and 28, in some instances, the back cover 36 may be configured to support the PWA 14 and/or the electronic component 16 (e.g., display 32). Supporting the PWA 14 and/or the electronic component 16 from a back side may assist in preventing unexpected bending of the PWA 14 and/or the electronic component 16 when a user is pressing against the display 32 or other front side features, which could contribute to the electronic device malfunctioning.

In one example, the back cover 36 may include an outer shell 73 and one or more inner walls 130 (e.g., inward extending walls or other inner walls) that extend from the outer shell 73 toward the PWA 14 to support the PWA 14 from the back side when it is fully assembled in the electronic assembly 10. The inner walls 130 may have one or more functions. For example, the inner walls 130 may: provide mechanical support for the PWA 14 and/or the electronic component 16; help to prevent ESDs from progressing to shielded areas of the PWA 14; divide an inner volume between the PWA 14 and the back cover 36 into separate spaces (e.g., pockets and/or areas on the PWA 14) and separate colder areas from warmer areas to assist in improving temperature sensing and/or compensation capabilities such as described in U.S. Pat. No. 8,280,637, which is incorporated herein by reference. Alternatively, or in addition, the inner walls 130 may have one or more other functions that may or may not be combined with the listed functions of the inner walls 130.

In some instances, the inner walls 130 of the back cover 36 may have one or more portions. For example, as shown in FIG. 27, the inner walls 130 of the back cover 36 may have: a wall portions 130a configured to surround the pins 62 on a region of the PWA 14 for connection to terminals 70 in the wall plate 80 (e.g., where the outer shell 73 may include an aperture 71 with wall portions 130a extending inward toward the PWA 14 to form a sidewall of the aperture 71 extending substantially to the PWA 14), which may help prevent users from contacting electronic components on the PWA 14 other than the pins 62; wall portions 130b configured to form thermistor pockets 132 and surround one or more thermistors or temperature sensors (e.g., a first temperature sensor and a second temperature sensor in a first area and/or a first pocket) on the PWA 14; wall portions 130c forming a pocket and/or surrounding the battery aperture or opening 37 (e.g., where the wall portions 130c form a sidewall of the battery aperture or opening 37 and provide access to a region on the PWA 14 (see, for example, the discussion of the region with respect to the aperture 71 above) and one or more connectors (e.g., battery holder 92 or other connectors)), which may help prevent users from contacting other electronic components on the PWA 14 when installing and/or removing the battery 90; wall portions 130d forming pockets separating warm areas of the PWA 14 (e.g., the first area and/or the first pocket with air of a first temperature during operation of the electronic assembly 10) from colder areas of the PWA 14 (e.g., a second area and/or second pocket with air of a second temperature that is cooler than the first temperature during operation of the electronic assembly 10), which may improve the temperature sensing and/or compensating capabilities of the electronic assembly 10; and wall portions 130e forming pockets and/or surrounding a humidity sensor attached to the PWA (e.g., where the humidity sensor is in one of the first pocket, the second pocket, a third pocket, and/or any other pocket). The regions on the PWA 14 discussed above may be regions including the pins 62, the battery holder 92, and/or is substantially devoid of ESD sensitive electronic components, electronic components other than one or more connectors such as a pin or battery connector, or any other electronic component.

Further, in some cases, an interior of the back cover 36 may have one or more alignment feature 136 configured to engage one or more openings in the PWA 14 and align the back cover 36 with respect to the PWA 14, which may be within sub-assembly 110. Additionally, the back cover 36 may include one or more PWA supports 134, which may have the dual purpose of providing a testing opening through back cover 36.

With the above illustrative structure of the back cover 36, the wall portions 130 (e.g., wall portions 130a-130e) may help support PWA 14 by touching or contacting a back side of the PWA 14 at some or at least substantially all of the positions atop the wall portions 130 when the printed circuit board is enclosed in the housing 12. In some instances, the wall portions 130 may facilitate ESD shielding by, for example, walling off a central opening 71 for connecting pins 62 to terminal 70 on a wall plate 80. Additionally, or alternatively, the wall portions 130 may improve temperature sensing accuracy by at least partially separating cold areas (e.g., an area surrounding the battery 90) where there are no, or a limited number of, components generating unintended heat, from other areas. In the cold areas of the PWA 14 as defined, for example, by the wall portions 130d of the back cover 36, one or more thermistors and/or one or more humidity sensors may be positioned so as to not be affected so much by heat creating electronic components on the PWA 14.

As indicated by the placement of thermistor pockets 132 in the back cover 36, the thermistors on the PWA 14 may be located at top and bottom edges (or in some cases opposite edges) of the PWA 14. To further isolate at least some of the thermistors on the PWA 14 from unintended heat, the wall portions 130 of the thermistor pockets 132 may substantially entirely surround a thermistor and contact the surface of the PWA 14. Such direct contact between the wall portions 130b and the PWA 14 may assist in isolating the thermistor pockets 132. Dividing the inner volume between the PWA 14 and the back cover 36 into separate spaces (e.g., pockets and/or areas on the PWA 14) and separate colder areas from warmer areas may assist in temperature sensing and/or compensation capabilities of the electronic device such as described in U.S. Pat. No. 8,280,637, which is incorporated herein by reference.

Additionally, or alternatively, the wall portions 130d surrounding a humidity sensor at the bottom of the PWA 14 may protect the humidity sensor and have vents 138 to help bring humidity changes to this compartment. In some illustrative instances, including optionally the examples above, the first thermistor pocket and the second thermistor pocket may be free from air vents 138 through the housing 12 to the external environment. The third pocket, which may house the humidity sensor, may include an air vent 138 extending through the housing 12 to an exterior environment. As a result of these features and others, the back cover 36 may be configured to support the PWA 14 and/or the electronic component 16, protect features on the PWA 14, and provide an electronic assembly 10 that has robust and accurate electronic sensing capabilities.

In some instances, the housing 12, particularly the front cover 38 and the back cover 36, may be formed by any desirable manufacturing process and may be made from any desirable material. For example, the housing 12 may be molded and made from a plastic material. Alternatively, or in addition, the housing may be made from a different mechanical process and/or a different material.

As shown in FIGS. 24-26C, the back cover 36 (e.g., a back side of a housing 12 having a back side and a front side) may engage a wall plate 80 (e.g., in a releasably connectable manner), where the wall plate 80 may be a portion of the electronic assembly that is used to hang the electronic assembly 10 (e.g., a thermostat) on a wall or other structure. In some cases, the wall plate 80 may have a perimeter defined or at least partially defined by side walls 86, and in some cases, the engaged back cover 36 may partially or substantially enclose the wall plate 80.

In some instances, the wall plate 80 may be secured to a wall or other structure with screws 82 or other fastening mechanisms. The wall plate 80 may include one or more apertures 81 extending through the wall plate 80 that are configured to receive one or more screws or other fastening mechanisms. Where screws 82 are used to fasten the wall plate 80 to a wall or other structure, it is contemplated that the wall plate 80 and/or the back cover 36 may include pockets 84 (e.g. relief features) in the wall plate 80 and/or pockets 63 (e.g., relief features) in the back cover 36 to accommodate a portion of a screw head to help ensure the heads of the screws 82 do not act as a limiting factor in the thinness or thickness of the electronic assembly 10. In instances where there are pockets 84 in the wall plate 80 and pockets 63 in the back cover, the pockets 84, 63 may be aligned with one another.

The housing 12 (e.g., the back cover 36 or other portion of the housing 12) and the wall plate 80 may be provided and/or configured such that the housing 12 and the wall plate 80 initially engage one another, with the wall plate 80 misaligned relative to the housing 12. As the wall plate 80 and the housing 12 are moved (e.g., slid or otherwise guided) together or toward one another, the housing 12 and wall plate 80 may be guided into alignment with one another.

In some instances, the back cover 36 may have a raised perimeter 64 at least partially defining a recess that is configured to accept and/or receive at least a part or portion of the wall plate 80, where the recess may include a recess back wall 65. The recess may have a depth and the wall plate 80 may have a thickness such that the volume of the recess of the housing 12 may receive at least a majority of the thickness of the wall plate 80. Alternatively, or in addition, the wall plate 80 may have a raised portion in a front wall 91 that at least partially defines a recess that is configured to accept and/or receive at least a part or portion of the back cover 36 or other portions of the housing 12, where the recess may include a recessed front wall (not explicitly shown).

Although the engaging and aligning related features are discussed herein with respect to the recess being positioned in the back cover 36 of housing 12, similar engaging and/or aligning related features may be incorporated into the electronic assembly 10 having a recess in the wall plate 80 that receives at least part of the back cover 36 or other portion of the housing 12.

Referring to FIGS. 24-25, the raised perimeter 64 of the back cover 36 may have recess side walls 66 that may correspond with wall plate side walls 86 of the wall plate 80, and may allow at least a part or portion of the side walls 86 of the wall plate 80 to mate with the recess side walls 66 of the back cover 36 of the housing 12. In some cases, the side walls 86 of the wall plate 80 are tilted or slanted at an angle relative to the back wall 65, and the recess side walls 66 of the back cover 36 may be similarly titled or slanted at an angle to mate with the side walls 86 of the wall plate 80. More generally, in some instances, the recess side walls 66 may have a first perimeter 67 adjacent the recessed back wall 65 and a second perimeter 69 toward the back side of the housing 12 and the wall plate 80, where the second perimeter 69 is larger than the first perimeter 67. Likewise, the side walls 86 of the wall plate 80 may have a first perimeter 87 adjacent the housing 12 when the wall plate 80 is engaging the housing 12 and a second perimeter 89 closer to a mounting surface 85 of the wall plate than the first perimeter, where the second perimeter 89 is larger than the first perimeter 87 (see, for example, FIG. 26B).

In some cases, the respective walls 66, 86 may be used to self align the back cover 36 with the wall plate 80. For example, in some instances, the side walls 66 of the housing and the side walls 86 of the wall plate 80 may be configured such that the recess in the back of the housing 12 may receive the wall plate 80 with the wall plate 80 misaligned relative to the housing 12, and then as the housing 12 is moved toward the wall plate 80, the side walls 66 of the housing and the side walls 86 of the wall plate 80 progressively further align the housing 12 with the wall plate 80.

In a similar manner, it is contemplated that a recess in the wall plate 80 (not explicitly shown) in conjunction with the back cover 36 or other portion of the housing 12 may be configured such that the recess of the wall plate 80 may initially receive the back cover 36 or other portion of the housing 12 with the wall plate misaligned relative to the back cover 36 or other portion of the housing 12, and then progressively further align the back cover 36 or other portion of the housing 12 with the wall plate 80 as the back cover 36 or other portion of the housing 12 are moved closer to one another.

A method of securing a back cover of a housing 12 and a wall plate 80 may include moving the wall plate 80 into engagement with the back cover 36 (or back side of the housing 12) and sliding an aligning surface of the wall plate 80 (e.g., tilted, slanted, angled, beveled, chamfered side walls 86) along an aligning surface of the housing (e.g., tilted, slanted, angled, beveled, chamfered side walls 66) to align the wall plate 80 with the housing 12 as the wall plate 80 is moved further towards the housing 12.

The tilted, slanted, angled, beveled, or chamfered side walls 66, 86 may be angled at any angle or have any other suitable configuration. For example, the side walls 66, 86 may be angled at between zero (0) degrees and ninety (90) degrees, ten (10) degrees and eighty (80) degrees, twenty (20) degrees and seventy (70) degrees, thirty (30) degrees and sixty (60) degrees, forty (40) degrees and fifty (50) degrees relative to the recess back wall 65 or the mounting surface 85, respectively. In one illustrative example, the side walls 66, 86 may be angled at a forty-five (45) degree angle with respect to the recess back wall 65 or the mounting surface 85, respectively. Alternatively, the side walls 66, 86 may have different angles with respect to one another relative to the respective recess back wall 65 or the mounting surface 85.

In some instances, the back cover 36 may be further configured to have a limited profile. For example, the side walls 68 of the back cover 36 may extend inward, such that the front of the back cover 36 that is adjacent the front cover 38 defines a larger circumference/perimeter than a circumference/perimeter defined by a back of the back cover 36 that is adjacent the wall plate 80.

Figure 34B:
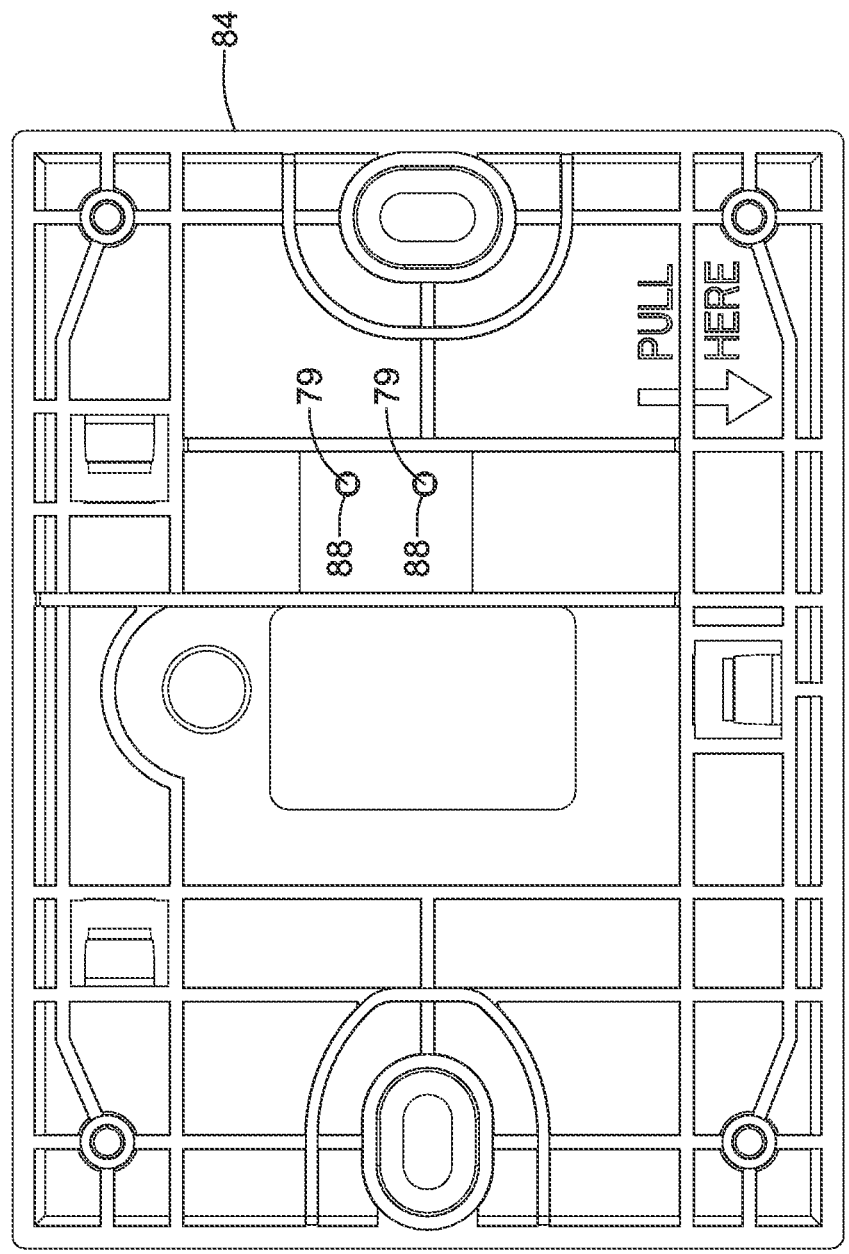
FIG. 34B is a schematic back view of the illustrative wall plate of FIG. 34A.
Figure 35:
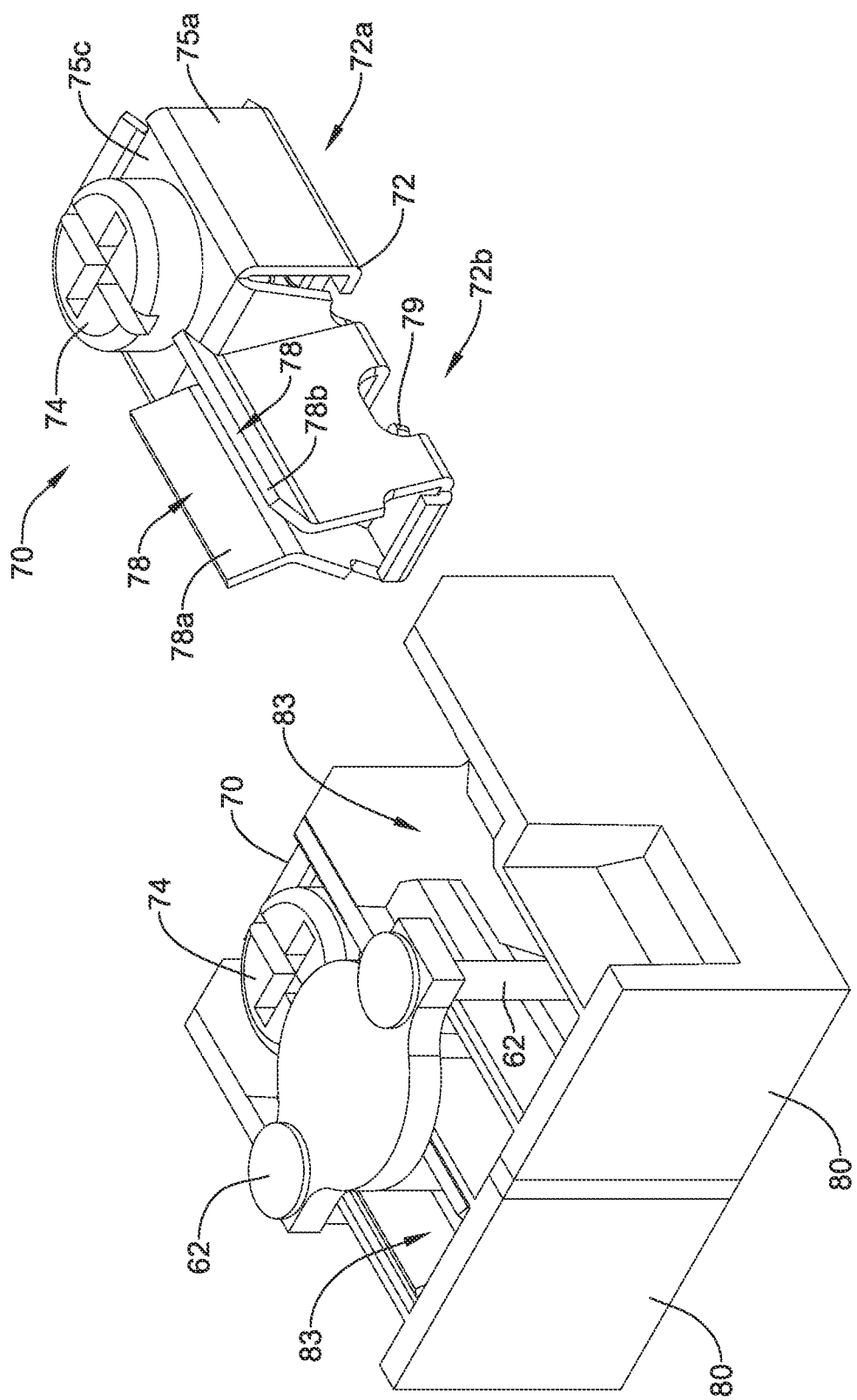
FIG. 35 is a schematic partially exploded view of an illustrative screw terminal of an illustrative electronic assembly.

Referring now to FIGS. 34A and 34B, electronic assemblies 10 having a display 32 and/or other circuitry may need robust electrical connection(s) for bringing power thereto. As shown in FIGS. 34A and 34B, terminals or terminal assembly 70 (e.g., electrical terminals or electrical terminal blocks) may be built into a wall plate 80 or other feature of the electronic assembly 10. Illustratively, the terminals 70 (e.g., one terminal 70, two terminals 70, as shown in FIG. 24, or more terminals 70) may be positioned within the wall plate 80 such that when the housing 12 of the electronic assembly 10 is attached to the wall plate 80, pins 62 affixed to the PCB 34 of the PWA 14 (where the pins 62 may be connected to the PCB 34 via a soldering technique or other mounting technique) may removably electrically connect to the terminals 70 (e.g., each pin 62 may engage a separate terminal 70 or multiple pins 62 may engage a single terminal). As seen in FIG. 35, in some instances, two terminals 70 (e.g., a first terminal and a second terminal) may be configured to engage plastic or other material of the wall plate 80, and pins 62 connected to the PCB 34 (not shown) may thereafter engage the terminals 70 (e.g., a first pin 62 may engage a first terminal 70 and a second pin 62 may engage a second terminal 70).

Figure 36:
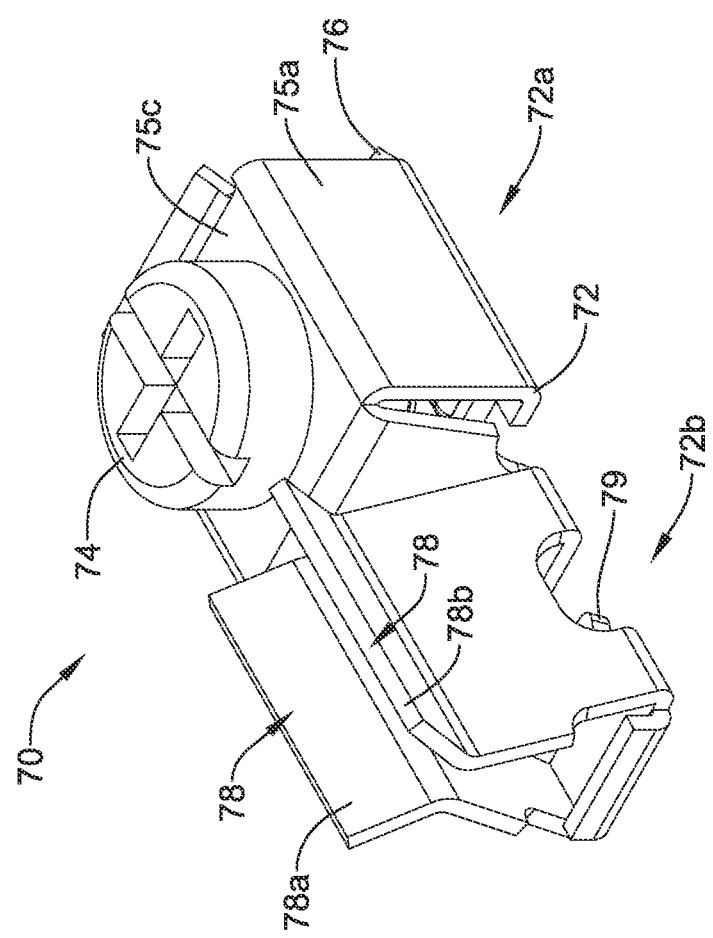
FIG. 36 is a schematic perspective view of an illustrative screw terminal of an electronic assembly.
Figure 37:
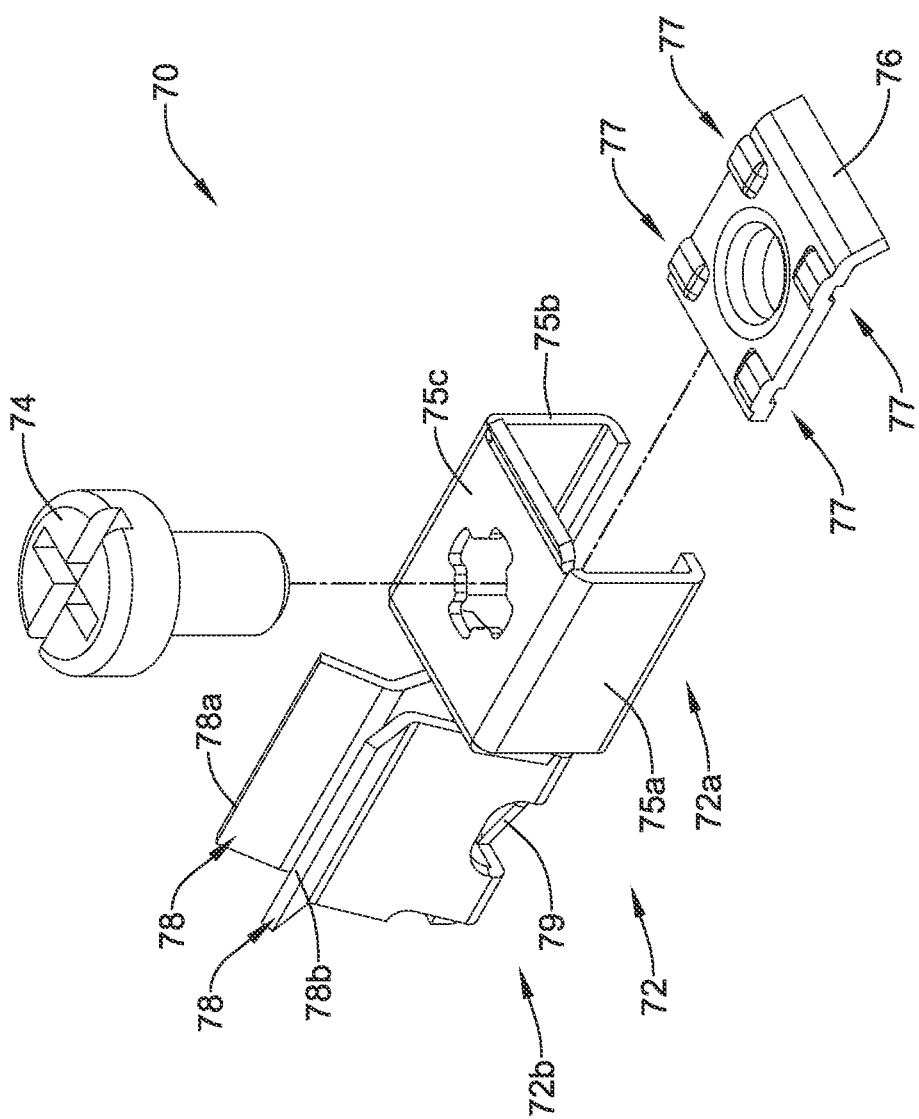
FIG. 37 is a schematic exploded view of the illustrative screw terminal of FIG. 36.
Figure 38:
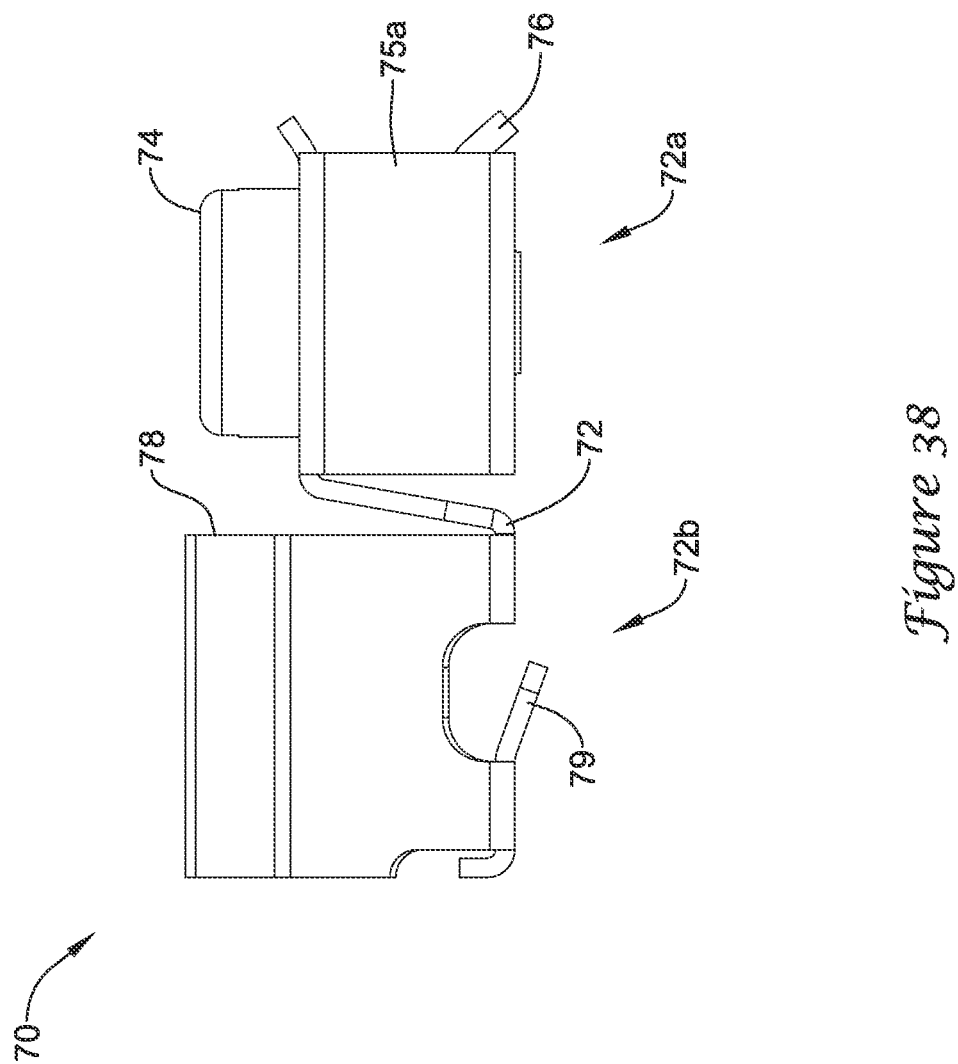
FIG. 38 is a schematic side view of the illustrative screw terminal of FIG. 36.

In some instances, the terminals 70 may define a cage 72 (made of metal or other electrically conductive material), a screw 74, and a nut 76, as best shown in FIGS. 36-38. As discussed above, the terminals 70 may be supported by the material (e.g., plastic or other material) of the wall plate 80 and one or more terminals 70 (e.g., a single terminal) may be placed in (e.g., slid in, snapped in, and/or otherwise positioned in) each of one or more pockets, recesses, or openings 83 in the wall plate 80.

The cage 72 of the terminal 70 may include a first portion 72a having an area for receiving a screw 74 and a nut 76. In some cases, the first portion 72a of the cage 72 may have a first side 75a, an opposing second side 75b and a third side 75c. In some cases, the first side 75a, the second side 75b and the third side 75c of the first portion 72a of the cage 72 may be formed from a single piece of bent metal.

The first portion 72a of the cage 72 may be used for connecting a wire. The wire may, for example, power the electronic assembly 10 or communicate a control signal. In some cases, a wire may be wrapped around the screw 74 by an installer, and then the screw 74 may be tightened to secure the wire between the head of the screw and an outside surface of the third side 75c of the first portion 72a of the cage 72. Alternatively, a wire may be inserted between the nut 76 and the first portion 72a of the cage 72 by the installer, and then the screw 74 may be tightened to secure the wire between the nut 76 and an inside surface of the third side 75c of the first portion 72a of the cage 72.

As noted above, the first portion 72a of the cage 72 may be configured to receive an end of a wire (e.g., a power or control wire). A second portion 72b of the cage 72 may be positioned adjacent the first portion 72a of the cage 72. The second portion 72b of the cage 72 may be formed from, or have, flange 78 that may be configured to receive and/or to be placed in electrical contact with the pins 62 soldered, or otherwise connected to, the PCB 34 or other feature of the PWA 14. Flange 78 of the second portion 72b of the cage 72 may be configured to fit within openings 83 in the wall plate 80 that are configured to receive the second portion 72b of the cage 72 (see, for example, FIG. 35). The configuration of the first portion 72a and the second portion 72b of the cage 72 may be configured to electrically connect a pin 62 to a wire.

In some cases, the cage 72 of the terminal 70 may include a latch 79 (e.g., a one-way latch, a two-way latch, etc.), as best shown in FIG. 38. Illustratively, the latch 79 may be configured to engage (e.g. slide into, snap into, etc.) a hole 88 (e.g., a latching hole or other hole) in the wall plate 80, as best shown in FIG. 34B, or connect to the wall plate 80 in any other manner after or as the terminal 70 is positioned in the opening 83 of the wall plate 80. In one example, the latch 79 may snap into the hole 88 in the wall plate 80 and lock the terminal 70 in the opening 83 of the wall plate 80 by preventing removal of the terminal.

Illustratively, the cage 72 may be formed form any combination of electrically conductive materials. For example, the cage 72 may be formed from one or more metal and in one example, the cage 72 may be formed from phosphor bronze, a phosphor bronze alloy, and/or other material.

The material of the cage 72 may be formed into the cage 72 in any manner. For example, the material of the cage 72 may be bent, molded, welded, and/or otherwise formed into the cage 72. Additionally, or alternative, the cage 72 may be formed from a single piece of metal (e.g., a metal plate) or formed from a plurality of pieces of metal or other material.

In some cases, the first portion 72a of the cage 72 and the second portion 72b of the cage 72 may be formed from a single piece of bent metal.

The screw 74 of terminal 70 may be a self-locking screw or other screw that extends at least partially through and/or within the first portion 72a of the cage 72, where a recess under the screw head and/or special flanges (not shown) extending from the cage 72 may help hold the screw at a desired position (e.g., a desired position for maintaining the nut 76 within the cage 72). The head of the screw 74 may allow for use with any desired tool. For example, the head of the screw 74 may allow for the use of a flat-head screwdriver, a Phillips head screwdriver (e.g., Phillips PH1, or other Phillips screwdriver), an Allen wrench/hex key tool, or other tool. The screw 74 may be formed from steel, hardened steel, or any other suitable material.

The nut 76 may be configured to engage the screw 74 in a threaded manner or a different manner at least partially within the first portion 72a of the cage 72. In some instances, the nut 76 may be completely unscrewed from the screw 74, but due to its positioning within the first portion 72a of the cage 72 the nut may not drop from the terminal 70 and the screw 74 may be engaged by the screw 74 again.

In some instances, and as shown in FIG. 37, the nut 76 may include features (e.g., grooves 77, dimples, bumps, or other features) to help engage an end of a wire. This may help protect the electronic assembly 10 from unintended wire pull-out when the screw 74 is tightened to nominal torque (e.g., 1 lb-in-6 lb-in, 2 lb-in-5 lb-in, 3 lb-in-4 lb-in, such as 3.5 lb-in or any other torque level less than 1 lb-in or greater than 6 lb-in).

The terminal 70 may be placed in a suitable pattern to match the pattern of the pins 62 attached to the PCB 34 of the PWA 14. A nominal pin 62 spacing may be configured to be a particular distance (e.g., 1 mm, 2 mm, 3 mm, 4 mm, 5 mm, 6 mm, 7 mm, 8 mm, 9 mm, 10 mm, or other distance). In some instances, two pins 62 may be connected to the PCB 34, which may be used to power the electronic assembly with a 24 volt alternate current (AC) or other current, where one wire connected to a terminal 70 may be a ground wire and the other wire connected to a terminal 70 may be live wire (e.g., carrying 24 V AC or other voltage). As the pins 62 of the electronic assembly 10 are configured to slidingly engage the flange 78 of the terminal 70 within the wall plate 80, the housing 12 and the contents therein may be removed from the wall plate 80 without disconnecting the wires from the terminals 70 of the wall plate.

The terminals 70 of the wall plate 80 may be used in a method of electrically connecting a wire to the PCB 34 that may be at least partially or substantially housed in the housing 12 of the electronic assembly 10. The terminal 70 may be inserted into an openings 83 in the wall plate 80, and a latch of the terminal 70 may be snapped into or may otherwise engage a hole 88 in the opening 83 to secure the terminal relative to the wall plate 80. In one illustrative instance, a wire may be slid adjacent the nut 76 of the first portion 72a of the cage 72 of the terminal 70 in the wall plate 80. The screw 74, extending at least partially through the first portion 72a of the cage 72, may then be rotated and tighten the nut 76 so as to capture the wire between the nut 76 and the third side 75c of the first portion 72a of the cage 72. The flange 78 of the second portion 72b of the cage 72 may engage the pin 62, where the pin 62 may extend from the PCB 34 through an aperture in the housing 12.

In some instances, the electronic assemblies 10 powered from line power transformers may need to be able to withstand surge energy which may come from the power line, through a transformer, to the electronic assembly 10. During surge events, a voltage at a loaded transformer may exceed an absolute maximum rating of power supply voltage for the electronic assembly 10. In other words, the overall energy may be high. To protect the electronic assembly 10 against such power surges (or event ESD events), suitable over voltage protection components in electrical communication with the pins 62 may be utilized on the PWA 14.

One approach for such surge protection may involve splitting a surge voltage. For example, the surge energy may be split and directed to two or three (or four or more) components. As in the circuit diagrams 120, 140, 160 in FIGS. 39-41, respectively, a first component may be one or more varistors 122 (e.g., a small varistor or a large varistor) having a clamping voltage (e.g., a low clamping voltage or a high clamping voltage), a second component may be one or more resistors 124 (e.g., a serial resistor or a parallel resistor), and a third component include one or more diodes 126 (e.g., a Transient Voltage Suppressor (TVS) diode or other diode) with a small clamping voltage or a large clamping voltage. In the above example, the resistor 124 may be the component that allows the surge energy to be split between the varistor 122 and the diode 126 in a suitable ratio. Optionally, some part of the surge voltage may be absorbed by a first capacitor or a capacitor 128 (e.g., a 47 uF-FK bulk capacitor, other bulk capacitor, or other capacitor) as best shown in FIG. 41.

The varistors 122 may be any type of varistor. In some instances, one or more of the varistors 122 may be a 56 volt varistor or other type of varistor. The resistors 124 may be any type of resistor. In some instances, one or more of the resistors 124 may be a thin film resistor or a thick film resistor. In some cases, the resistors 124 may be wire-wound resistors or resistors of other configurations. The diodes 126 may be any type of diodes. In some instances, the diodes 126 may be Transient Voltage Suppressor (TVS) diodes or any other type of diodes. The capacitor 128, when present, may be any type of capacitor. In some instances, the capacitors 128 may be bulk capacitors (e.g., 17 uF bulk capacitors) or any other type of capacitor.

In some instances, the surge protection circuit may be configured on a printed circuit/wiring board (e.g., PCB 34 or PWA 14). For example, a varistor 122, a resistor 124, a diode 126, and/or a capacitor 128 may each be separately secured to the printed circuit/wiring board or secured to the printed circuit/wiring board in combination or in any other manner. In some cases, one or more of the varistor 122, resistor 124, diodes 126, and/or capacitor 128 may be surface mounted to the printed circuit/wiring board (e.g., PCB 34 or PWA 14).

Figure 39:
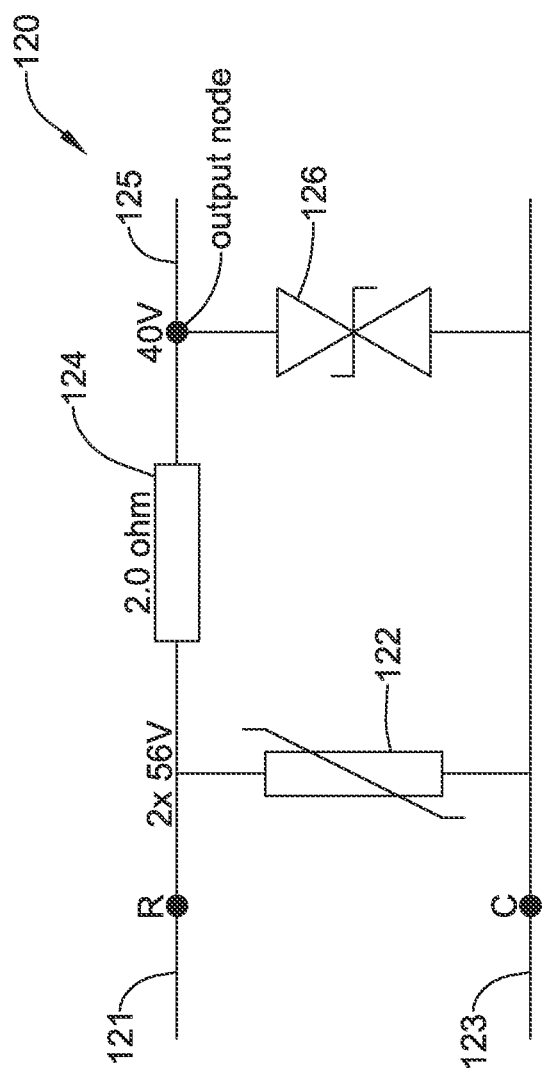
FIG. 39 is a schematic diagram of an illustrative electric circuit for an electronic assembly.
Figure 40:
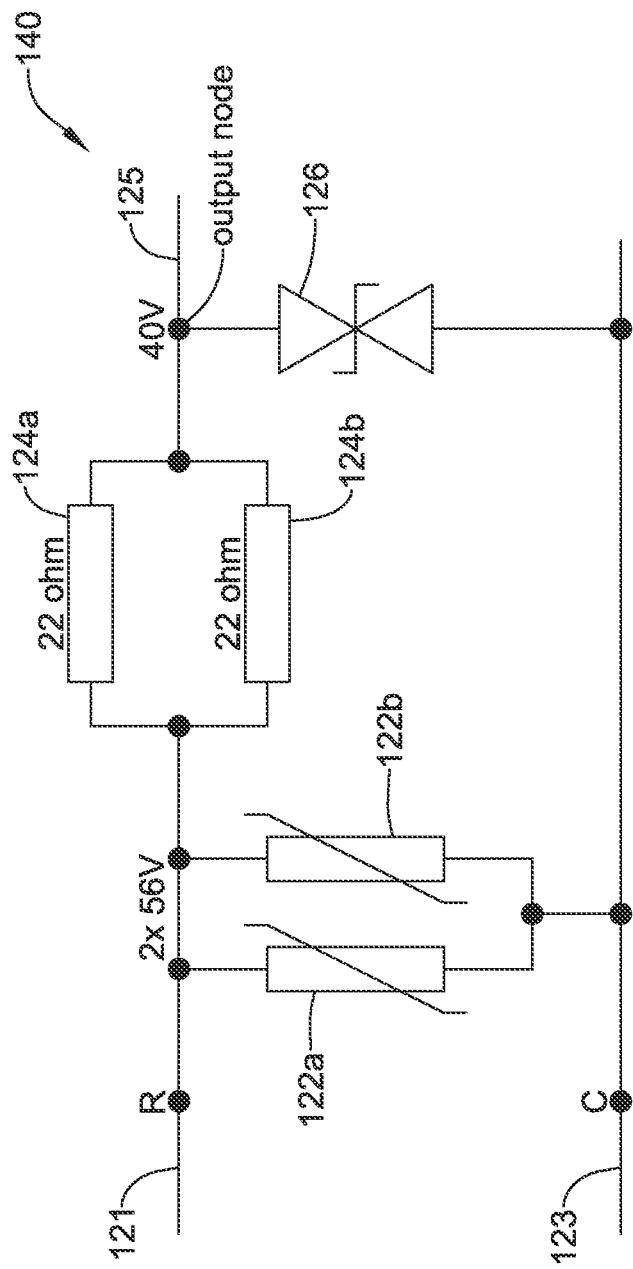
FIG. 40 is a schematic diagram of another illustrative electric circuit for an electronic assembly.
Figure 41:
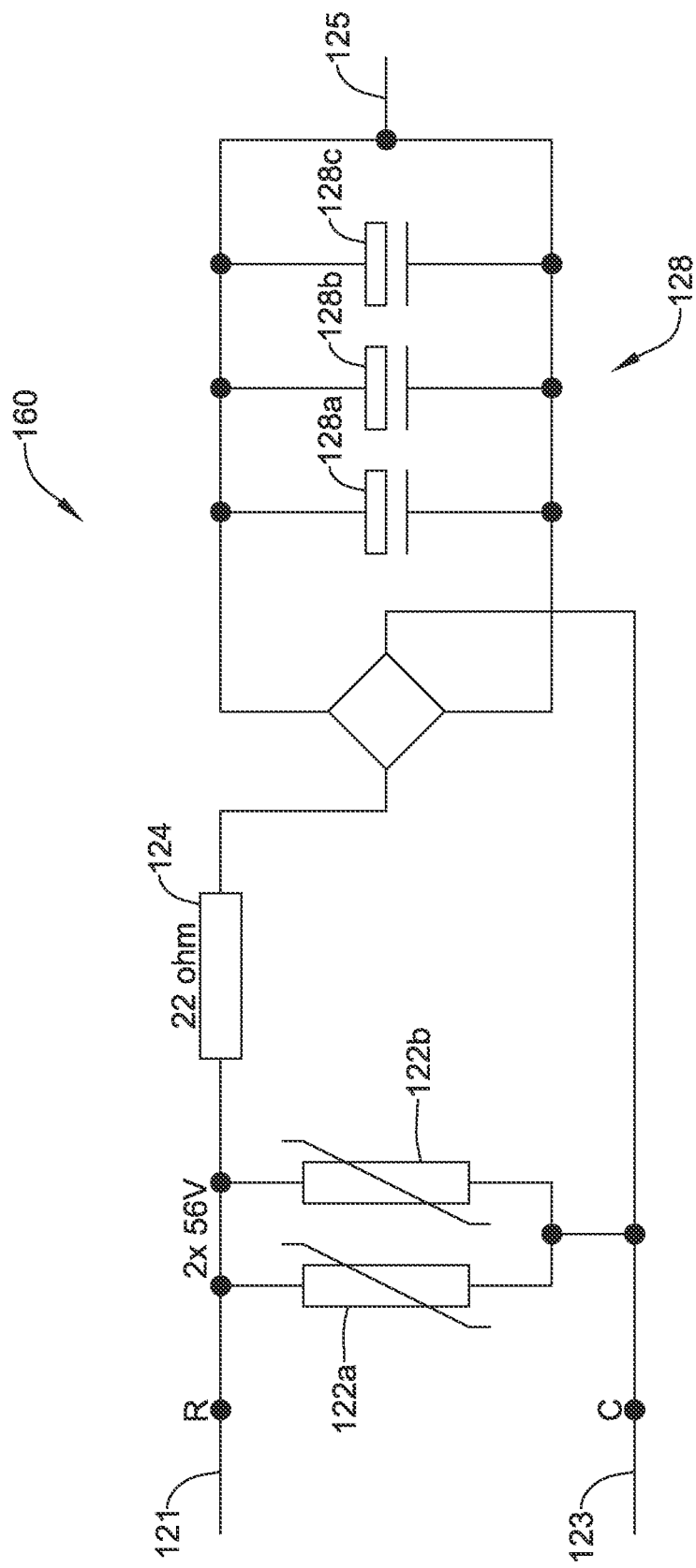
FIG. 41 is a schematic diagram of another illustrative electric circuit for an electronic assembly.

As shown in FIGS. 39-41, a varistor 122 (e.g., a first voltage clamp) of the circuit diagrams 120, 140, 160 of surge protection circuits may be positioned between a power input terminal 121 at the R node and a common terminal 123 at the C node of the electronic assembly 10 (e.g., an HVAC device). A resistor 124 and a diode 126 (e.g., a second voltage clamp, where the second voltage clamp may be less than the first voltage clamp) of the circuit diagram 120, 140, 160 may be positioned between the power input terminal 121 and the common terminal 123 of the electronic assembly 10, in parallel with the varistor 122. In some instances, the resistor 124 may be connected in series with the diode 126 at an output node 125. The output node 125 and common terminal 123 may provide a surge delimited power supply to the printed circuit/wiring board (e.g., PCB 34 or PWA 14).

In some instances, as shown for example in FIGS. 39 and 40, the resistor(s) 124 may be connected or located between the power input terminal 121 and the output node 125, the diode(s) 126 may be positioned between the output node 125 and the common terminal 123, and the varistor(s) 122 may be positioned between the input terminal 121 and the common terminal 123. In circuit diagram 140 of FIG. 40, a first varistor 122a, a second varistor 122b, a first resistor 124a, and a second resistor 124b are depicted. In some instances, the first varistor 122a and the second varistor 122b are connected in parallel as shown. Alternatively, or additionally, the first resistor 124a and the second resistor 124b are connected in parallel. Although not shown, the surge protection circuit may have a first varistor 122a, a second varistor 122b, and a single resistor 124. Alternatively, the surge protection circuit may have a single varistor 122, and a first resistor 124a and a second resistor 124b.

FIG. 41 depicts circuit diagram 160. In circuit diagram 160, a first varistor 122a, a second varistor 122b, a resistor 124, and a capacitor 128 (e.g., a bulk capacitor) are depicted. In some instance, the first varistor 122a and the second varistor 122b may be connected in parallel as shown. The first varistor 122a and the second varistor 122b may be a first voltage clamp positioned and/or connected between the power input terminal 121 and the common terminal 123. The resistor 124 is shown connected between the power input terminal 121 and a first terminal of capacitor 128, and a second terminal of capacitor 128 is shown connected to the common terminal 123. The first terminal of capacitor 128 corresponds to the output node 125 of the illustrative power surge protector circuit. The capacitor 128, when included in the power surge protector circuit, may be configured to absorb voltage spikes at the output port 125.

In some instances, the capacitor 128 may include one or a plurality of capacitors 128. In one illustrative example shown in FIG. 41, the power surge circuit protector 160 may include a first capacitor 128a, a second capacitor 128b, and a third capacitor 128c. The plurality of capacitors 128 may be positioned in series or in parallel with respect to one another.

A more detailed example of the operation of the power surge circuit protector of FIG. 39 will now be provided. Typical maximum peak surge current may be around 44 amps (A). The protective circuitry may be analyzable as a direct current (DC) circuit powered from a 44 A current source because energy dissipation is proportional to the actual current value, and the 44 A peak current may represent a worst case scenario. The 44 A input current may be split at R node 121 (e.g., a power node) into 15 A that travels through a 56V varistor 122, and 29 A that travels through the resistor 124 and diode 126. Voltage levels between the R node and a C node (e.g., a common node) may be limited to the clamping voltage of the varistor 122, which may be 110V, for example. On the serial combination of resistor 124 and diode 126, the clamping voltage may be defined by the properties of the diode (54V) 126, which may result in a voltage to the resistor of, for example, 110V−54V=56V. Because the 56V is defined by differences between the clamping voltages of the varistor 122 and the diode 126, the current through the diode 126 may be given by the voltage difference divided by the resistance of the resistor. Thus, if 29 A is desired to pass through resistor 124 and diode 126, the resistor should have a value of about 2 ohms. As can be seen, the value of resistor 124 may be chosen to achieve a desired split of the 44 A input current between the varistor(s) 122 and the diode(s) 126.

Although, particular surge protecting schematic block diagrams are discussed herein and shown in the Figures, other similar and dissimilar circuit layouts may be utilized to help protect the electronic assembly 10 from undesirable surges of energy or power.

In a method of operation, such as a method of protecting an electronic device or assembly 10 from damage to electronic components 16 thereon caused by power surges received from line power connected to the electronic device or assembly 10 or power surges from other sources, may include providing a printed circuit/wiring board 14, 34 and providing a power surge protector circuit thereon. Illustratively, the power surge circuit protector may include one or more of a varistor 122, a resistor 124 (e.g., a serially positioned resistor or other resistor), diode 126 (e.g., transient voltage suppressor diode or other diode), and/or a capacitor 128. Surge voltages may then be split between two or more electronic components 16 (e.g., a varistor 122, a diode 126, and/or a capacitor 128) on the printed circuit/wiring board 14, 34. In some instances, the value of a resistor 124 may determine the split of the surge current between the two or more electronic components in the power surge protector circuit.

Those skilled in the art will recognize that the present disclosure may be manifested in a variety of forms other than the specific embodiments described and contemplated herein. Accordingly, departure in form and detail may be made without departing from the scope and spirit of the present disclosure as described in the appended claims.

What is claimed is:

1. A surge protection circuit for an HVAC device, the HVAC device including a power input terminal and a common terminal for receiving power to power the HVAC device, the surge protection circuit comprising:
    a first varistor connected between the power input terminal and the common terminal of the HVAC device; and
    a first resistor component connected in series with a transient voltage suppressor diode, with the series connected first resistor component and the transient voltage suppressor diode connected between the power input terminal and the common terminal of the HVAC device in parallel with the first varistor; and
    wherein an output of the surge protection circuit is coupled to the series connection between the first resistor component and the transient voltage suppressor diode; and
    a printed circuit board, with the first varistor, the first resistor component, and the transient voltage suppressor diode each separately secured to the printed circuit board.

2. The surge protection circuit of claim 1, wherein the first resistor component is a thick film resistor.

3. The surge protection circuit of claim 1, wherein the first resistor component is a wire-wound resistor.

4. The surge protection circuit of claim 1 wherein the transient voltage suppressor diode is a surface mount component.

5. The surge protection circuit of claim 1 further comprising a second varistor connected in parallel with the first varistor.

6. A surge protection circuit for an HVAC device, the HVAC device including a power input terminal and a common terminal for receiving power to power the HVAC device, the surge protection circuit comprising:
    a first varistor connected between the power input terminal and the common terminal of the HVAC device; and
    a first resistor component connected in series with a transient voltage suppressor diode, with the series connected first resistor component and the transient voltage suppressor diode connected between the power input terminal and the common terminal of the HVAC device in parallel with the first varistor;
wherein an output of the surge protection circuit is coupled to the series connection between the first resistor component and the transient voltage suppressor diode; and
a second resistor component connected in parallel with the first resistor component.

* * * * *